United States Patent
Uehira

(10) Patent No.: US 12,514,016 B2
(45) Date of Patent: Dec. 30, 2025

(54) PHOTOELECTRIC CONVERSION DEVICE, PHOTOELECTRIC CONVERSION SYSTEM, MOVING BODY, AND MANUFACTURING METHOD OF PHOTOELECTRIC CONVERSION DEVICE

(71) Applicant: CANON KABUSHIKI KAISHA, Tokyo (JP)

(72) Inventor: Kosei Uehira, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 657 days.

(21) Appl. No.: 17/841,817

(22) Filed: Jun. 16, 2022

(65) Prior Publication Data
US 2022/0406835 A1 Dec. 22, 2022

(30) Foreign Application Priority Data
Jun. 22, 2021 (JP) ................. 2021-103193

(51) Int. Cl.
*H10F 39/00* (2025.01)
*H10F 30/225* (2025.01)

(52) U.S. Cl.
CPC ......... *H10F 39/811* (2025.01); *H10F 30/225* (2025.01); *H10F 39/024* (2025.01); *H10F 39/802* (2025.01); *H10F 39/8057* (2025.01); *H10F 39/8067* (2025.01)

(58) Field of Classification Search
CPC ......... H01L 27/14636; H01L 27/14603; H01L 27/14623; H01L 27/14629; H01L 27/14685; H01L 31/107
See application file for complete search history.

(56) References Cited

U.S. PATENT DOCUMENTS

| | | |
|---|---|---|
| 9,153,612 B2 | 10/2015 | Miyanami |
| 9,343,495 B2 | 5/2016 | Minami et al. |
| 9,362,323 B2 | 6/2016 | Uehira |
| 9,496,303 B2 | 11/2016 | Suzuki |
| 11,798,968 B2 | 10/2023 | Hiramatsu |
| 12,183,755 B2 | 12/2024 | Yokochi et al. |

(Continued)

FOREIGN PATENT DOCUMENTS

| | | |
|---|---|---|
| DE | 112019004720 T5 | 6/2021 |
| JP | 2012-175050 A | 9/2012 |

(Continued)

OTHER PUBLICATIONS

Extended European Search Report dated Nov. 9, 2022, in European Patent Application No. 22179819.2.

(Continued)

*Primary Examiner* — Tony Ko
(74) *Attorney, Agent, or Firm* — Venable LLP

(57) ABSTRACT

A photoelectric conversion device having pixels lined up in a plurality of rows and a plurality of columns, the photoelectric conversion device including: a semiconductor layer which has a front surface and a rear surface and which includes an avalanche photodiode; a wiring layer arranged on a side of the front surface of the semiconductor layer; and a trench arranged in a boundary portion between two pixels, wherein the trench has at least any of a metal or a metal compound arranged therein and extends from inside of the semiconductor layer to inside of the wiring layer.

12 Claims, 43 Drawing Sheets

(56) References Cited

U.S. PATENT DOCUMENTS

| | | | |
|---|---|---|---|
| 2019/0252442 A1* | 8/2019 | Tanaka | H01L 27/14636 |
| 2022/0052092 A1 | 2/2022 | Furumi et al. | |
| 2022/0157867 A1 | 5/2022 | Kawahara | |
| 2022/0165902 A1 | 5/2022 | Okazaki et al. | |
| 2022/0181363 A1 | 6/2022 | Matsumoto et al. | |
| 2022/0392944 A1* | 12/2022 | Tochigi | H10F 77/147 |

FOREIGN PATENT DOCUMENTS

| | | |
|---|---|---|
| JP | 2015-026708 A | 2/2015 |
| JP | 2018-088488 A | 6/2018 |
| JP | 2020-167249 A | 10/2020 |
| JP | 2020-170812 A | 10/2020 |
| WO | 2014/021115 A1 | 2/2014 |
| WO | 2019/093150 A1 | 5/2019 |
| WO | 2020/158443 A1 | 8/2020 |
| WO | 2020/203222 A1 | 10/2020 |

OTHER PUBLICATIONS

Office Action dated Feb. 4, 2025, in Japanese Patent Application No. 2021-103193.
Office Action dated May 13, 2025, in Japanese Patent Application No. 2021-103193.

* cited by examiner

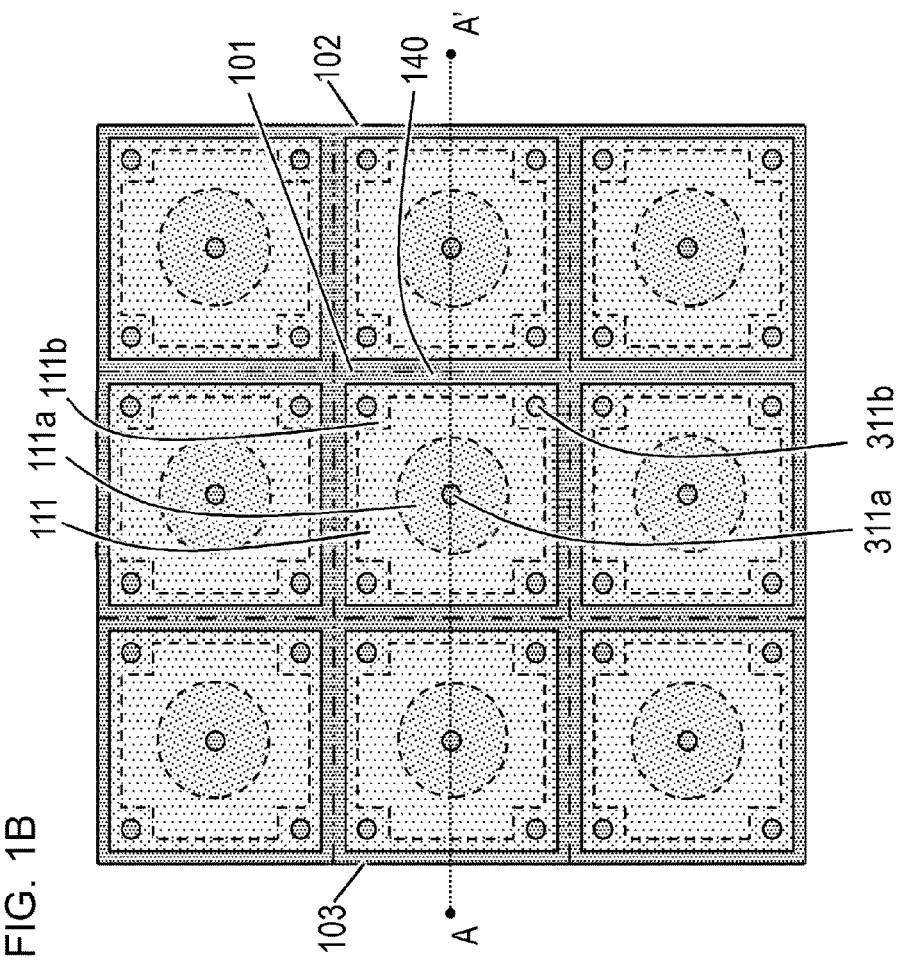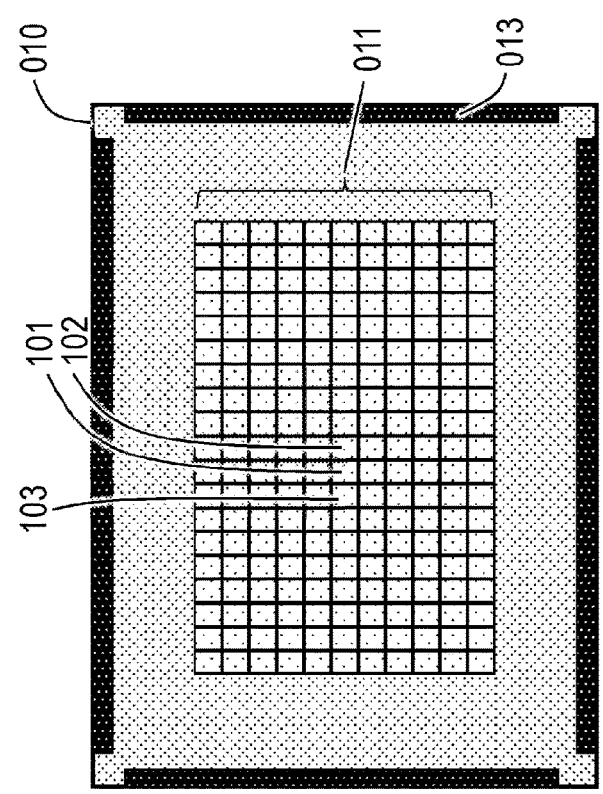
FIG. 1B
FIG. 1A

| ITEM | NUMERICAL VALUE |
|---|---|
| IRRADIATED LIGHT AMOUNT OF AREA OF TRENCHES 140' & 140" | 100 % (STANDARDIZED) |
| IRRADIATED LIGHT AMOUNT OF AREA OF TRENCH 140" | 88 TO 93% |
| IRRADIATED LIGHT AMOUNT OF AREA OF TRENCH 140' | 7 TO 12% |

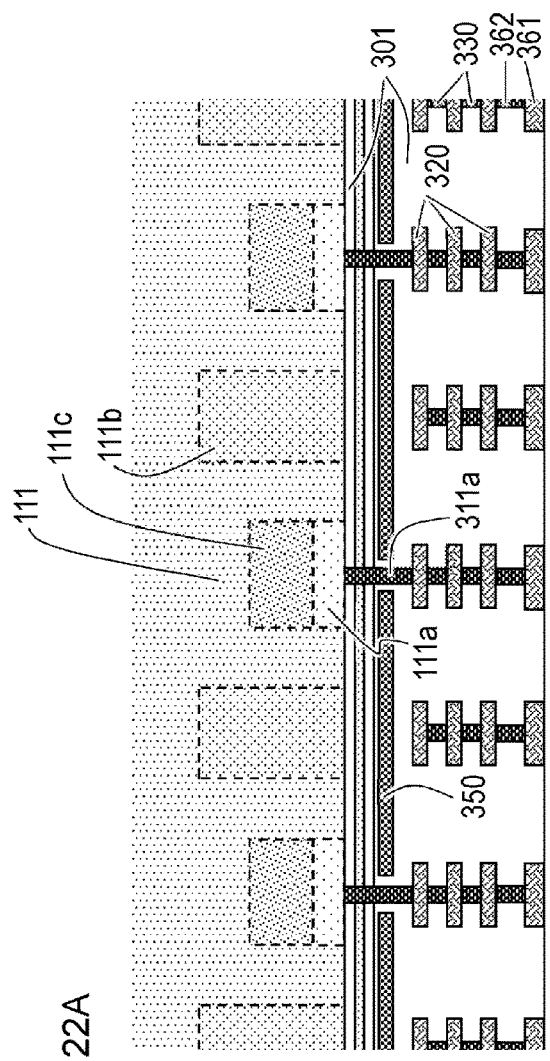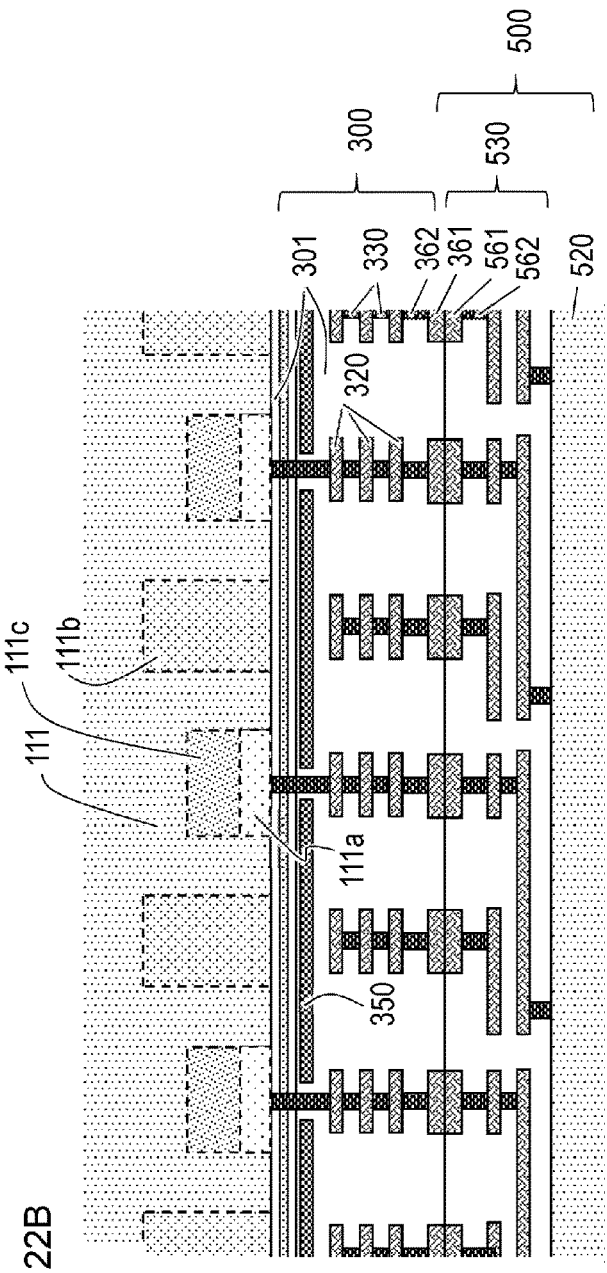

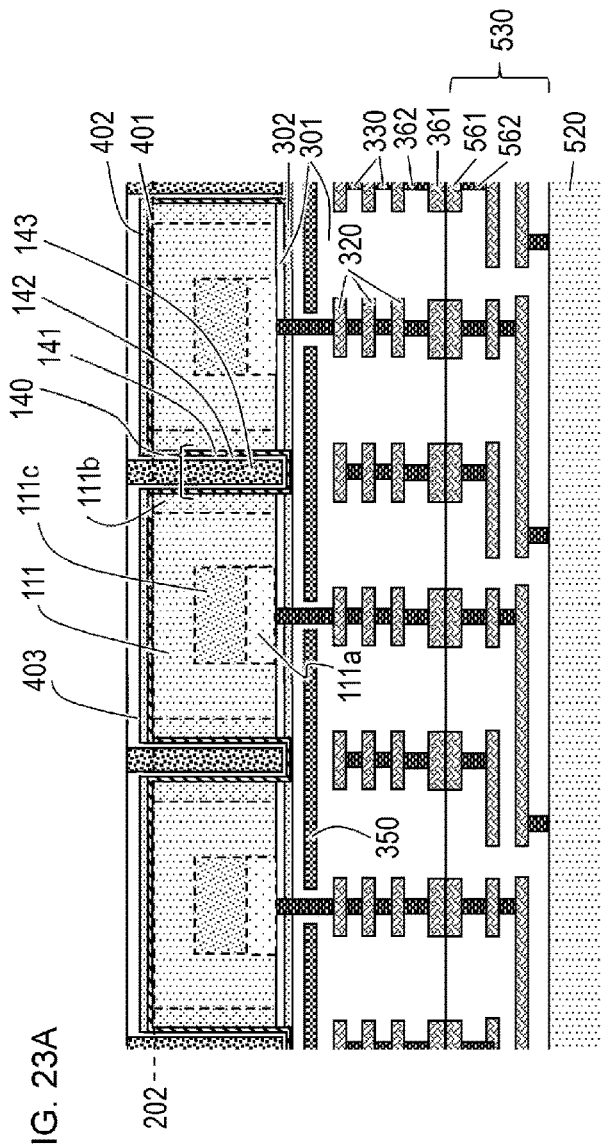
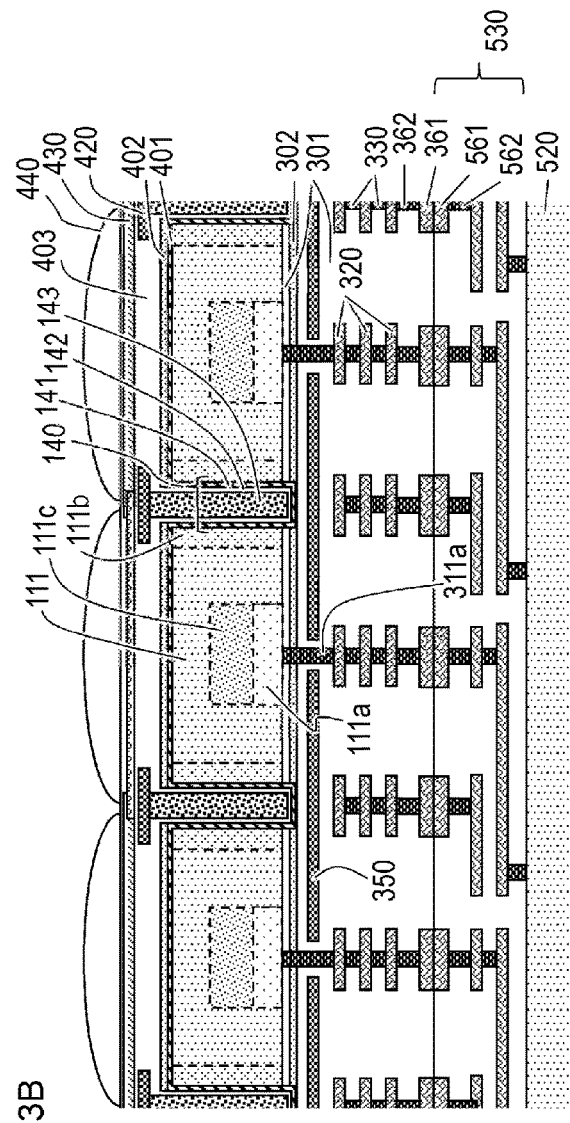
FIG. 23A
FIG. 23B

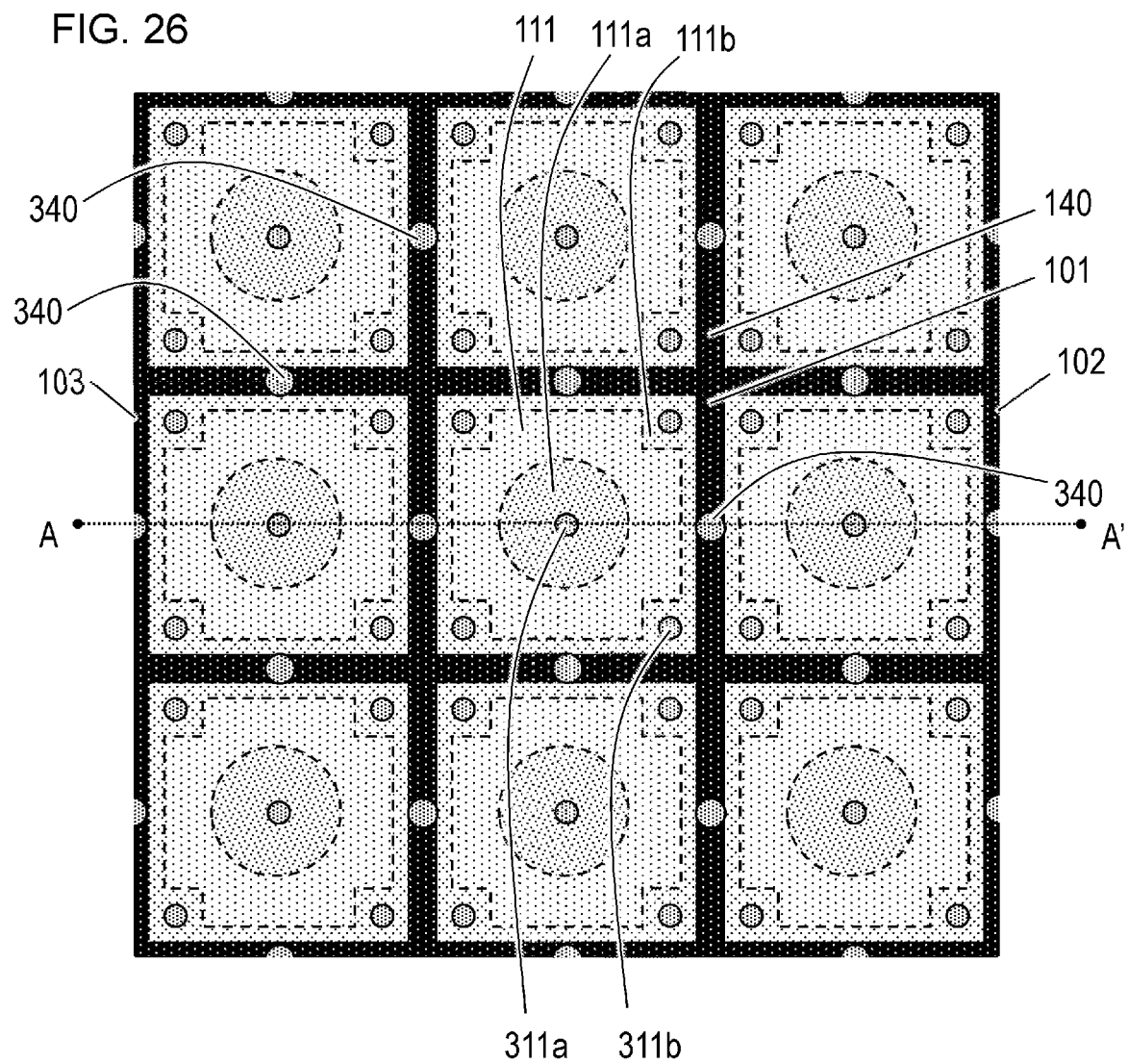

| ITEM | NUMERICAL VALUE |
|---|---|
| IRRADIATED LIGHT AMOUNT OF AREA OF TRENCH 140 & LIGHT-SHIELDING WALL 340 & INSULATING FILM 301 NUMERICAL VALUE | 100% (STANDARDIZED) |
| IRRADIATED LIGHT AMOUNT OF AREA OF TRENCH 140 | 88 TO 93% |
| IRRADIATED LIGHT AMOUNT OF AREA OF LIGHT-SHIELDING WALL 340 | 2 TO 4% |
| IRRADIATED LIGHT AMOUNT OF AREA OF INSULATING FILM 301 | 4 TO 9% |

PHOTOELECTRIC CONVERSION DEVICE, PHOTOELECTRIC CONVERSION SYSTEM, MOVING BODY, AND MANUFACTURING METHOD OF PHOTOELECTRIC CONVERSION DEVICE

BACKGROUND OF THE INVENTION

Field of the Invention

The present invention relates to a photoelectric conversion device, a photoelectric conversion system, a moving body, and a manufacturing method of the photoelectric conversion device.

Description of the Related Art

Pixels having a photodiode are arranged in a photoelectric conversion device. Among photoelectric conversion devices, an element in which wiring or the like for reading a signal from a pixel is arranged on a surface on an opposite side to a light-receiving surface of a semiconductor layer is referred to as a "back-side illuminated" photoelectric conversion device.

Japanese Patent Application Laid-open No. 2020-170812 discloses a technique for forming, in a back-side illuminated photoelectric conversion device, a trench between photodiodes which are referred to as APDs (avalanche photodiodes) and which detect light by applying reverse voltage to a PN junction and causing an avalanche breakdown. Accordingly, adjacent APDs are separated from each other.

A photoelectric conversion device including an APD (hereinafter, an "APD sensor") is capable of detecting faint light. However, when an avalanche emission occurs in a certain pixel, the avalanche emission may cause an APD in an adjacent pixel of the certain pixel to malfunction. An avalanche emission refers to a phenomenon of light emitted when a part of a large number of electrons recombines with holes in a semiconductor layer.

In addition, light (avalanche light) created by an avalanche emission may sometimes leak into an adjacent pixel and cause crosstalk. Crosstalk due to avalanche light is referred to as "avalanche crosstalk (avalanche color mixing)".

With respect to the avalanche crosstalk, conceivably, a trench may be provided and avalanche light may be shielded by the trench as described in Japanese Patent Application Laid-open No. 2020-170812. However, with the configuration described in Japanese Patent Application Laid-open No. 2020-170812, a light beam path of avalanche light generated in an APD cannot be sufficiently blocked and there is a possibility that avalanche crosstalk may occur.

SUMMARY OF THE INVENTION

Therefore, in the present technique, the photoelectric conversion device reduces avalanche crosstalk.

An aspect of the disclosure of the present technique is a photoelectric conversion device having pixels lined up in a plurality of rows and a plurality of columns, the photoelectric conversion device including: a semiconductor layer which has a front surface and a rear surface and which includes an avalanche photodiode; a wiring layer arranged on a side of the front surface of the semiconductor layer; and a trench arranged in a boundary portion between two pixels, wherein the trench has at least any of a metal or a metal compound arranged therein and extends from inside of the semiconductor layer to inside of the wiring layer.

An aspect of the disclosure of the present technique is a photoelectric conversion device having pixels lined up in a plurality of rows and a plurality of columns, the photoelectric conversion device including: a semiconductor layer which has a front surface and a rear surface and which includes an avalanche photodiode; a wiring layer arranged on a side of the front surface of the semiconductor layer; and a trench arranged in a boundary portion between two pixels, wherein the trench has at least any of a metal or a metal compound arranged therein and extends from inside of the semiconductor layer to at least the front surface, a light-shielding wall including at least any of a metal and a metal compound is arranged inside the wiring layer, and the light-shielding wall is in contact with the trench and arranged on a virtual line connecting two avalanche photodiodes.

An aspect of the disclosure of the present technique is a manufacturing method of a photoelectric conversion device having pixels lined up in a plurality of rows and a plurality of columns, the manufacturing method including steps of: preparing a member including 1) a semiconductor layer which has a front surface and a rear surface and which includes an avalanche photodiode and 2) at least a part of a wiring layer arranged on a side of the front surface of the semiconductor layer; and forming a trench which extends from inside of the semiconductor layer to inside of the wiring layer, which has at least any of a metal or a metal compound arranged therein, and which is arranged in a boundary portion between two pixels.

Further features of the present invention will become apparent from the following description of exemplary embodiments with reference to the attached drawings.

BRIEF DESCRIPTION OF THE DRAWINGS

FIGS. 1A and 1B are plan views of a photoelectric conversion device according to a first embodiment;

FIGS. 22A and 22B are diagrams illustrating a manufacturing method of a photoelectric conversion device according to a tenth embodiment;

FIGS. 23A and 23B are diagrams illustrating the manufacturing method of the photoelectric conversion device according to the tenth embodiment;

FIG. 26 is a plan view of the photoelectric conversion device according to the eleventh embodiment;

DESCRIPTION OF THE EMBODIMENTS

Figure 2:
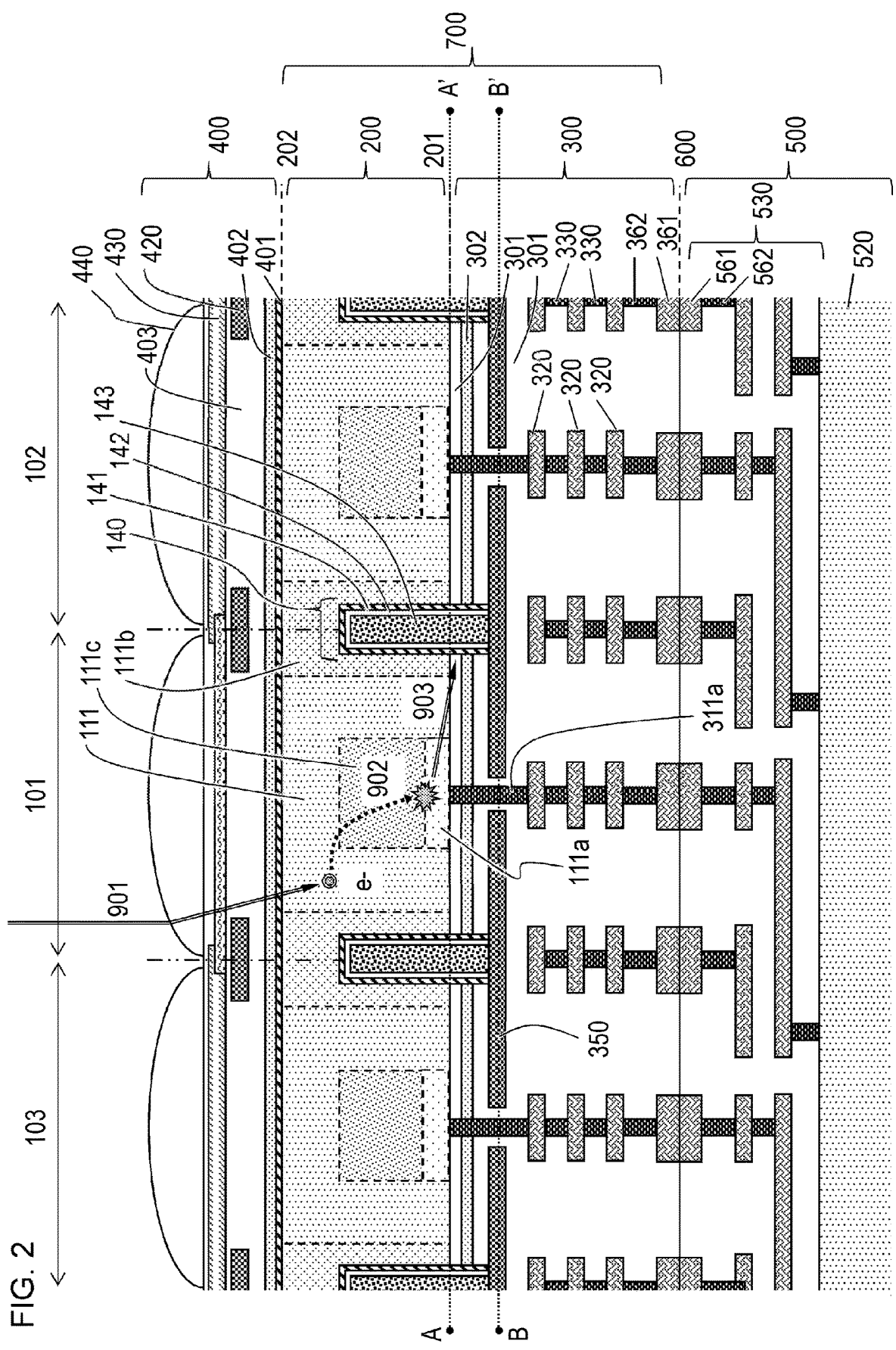
FIG. 2 is a sectional view of the photoelectric conversion device according to the first embodiment.

Hereinafter, embodiments and modifications will be described with reference to the drawings. It is to be understood that once common portions in the respective embodiments and in the respective modification are initially explained in an embodiment or a modification, explanations of such common portions will be omitted in subsequent embodiments and modifications unless otherwise noted.

In the respective embodiments presented below, an imaging apparatus will be mainly described as an example of a photoelectric conversion device. However, the respective embodiments are not limited to an imaging apparatus and are also applicable to other examples of photoelectric conversion devices. Such examples include a ranging apparatus (an apparatus for distance measurement or the like using focus detection or TOF (Time Of Flight)) and a photometric apparatus (an apparatus for measuring an amount of incident light or the like).

In the following description, an anode of an APD (avalanche photodiode) is to have a fixed potential and a signal is extracted from a cathode side. Therefore, a first conductivity type semiconductor region having, as a majority carrier, charges with a same polarity as a signal charge is an N-type semiconductor region. A second conductivity type semiconductor region having, as a majority carrier, charges with a different polarity from the signal charge is a P-type semiconductor region. It should be noted that the respective embodiments hold true even in cases where the cathode of an APD is to have a fixed potential and a signal is extracted from the anode side. In such a case, the first conductivity type semiconductor region having, as a majority carrier, charges with a same polarity as a signal charge is a P-type semiconductor region. The second conductivity type semiconductor region having, as a majority carrier, charges with a different polarity from the signal charge is an N-type semiconductor region. While a case where one of the nodes of an APD is to have a fixed potential will be described below, alternatively, potentials of both nodes may fluctuate.

In the present specification, simply using the term "impurity concentration" means a net impurity concentration after subtracting an amount compensated by inverse conductivity-type impurities. In other words, an "impurity concentration" refers to a net doping concentration. A region in which a P-type additive impurity concentration is higher than an N-type additive impurity concentration is a P-type semiconductor region. Conversely, a region in which an N-type additive impurity concentration is higher than a P-type additive impurity concentration is an N-type semiconductor region.

In the present specification, a "plan view" refers to a view from a perpendicular direction with respect to a surface on an opposite side to a light incidence surface of a semiconductor layer 200 to be described later. In addition, a cross section refers to a surface in a perpendicular direction with respect to a surface on an opposite side to the light incidence surface of the semiconductor layer 200. When the light incidence surface of the semiconductor layer 200 is a rough surface from a microscopic perspective, a plan view is to be defined with respect to the light incidence surface of the semiconductor layer 200 when viewed from a macroscopic perspective.

First Embodiment

FIG. 1A is a plan view of a photoelectric conversion device 010 having an APD according to a first embodiment. In a pixel portion 011, pixels having a light-receiving portion are arranged so as to be lined up in a plurality of rows and a plurality of columns. An electric signal obtained in the pixel portion 011 is transmitted to a signal processing circuit (not illustrated) in a subsequent stage and read via a peripheral circuit portion (not illustrated) and an external connecting pad portion 013. While an example in which a pixel circuit that processes a signal from a pixel is arranged on a semiconductor layer 520 that differs from a semiconductor layer 200 on which the APD is arranged will be described in the present embodiment, the present embodiment is not limited thereto. For example, the pixel circuit and the peripheral circuit portion may be arranged on a same semiconductor layer as the APD. In this case, the semiconductor layer 520 to be described later is no longer required.

When voltage of a reverse bias is supplied, the APD has a Geiger mode (a mode in which the APD operates in a state where a potential difference between an anode and a cathode is larger than a breakdown voltage) and a linear mode (a mode in which the APD operates in a state where the potential difference between the anode and the cathode is in the vicinity of or smaller than the breakdown voltage).

An APD operated in the Geiger mode is referred to as a SPAD (single photon avalanche diode). For example, an anode voltage is −30 V and a cathode voltage is 1 V. The APD may be operated either in the linear mode or in the Geiger mode.

FIG. 2 is a cross-sectional notation of a part (a pixel 101, a pixel 102, and a pixel 103) of pixels that are consecutive in a row direction in the photoelectric conversion device 010 shown in FIG. 1A. The photoelectric conversion device 010 includes, stacked in order from the semiconductor layer 520, the semiconductor layer 520, a wiring layer 530, a wiring layer 300, the semiconductor layer 200, and an optical layer 400. Hereinafter, a "stacking direction" (a direction perpendicular to a main surface of the semiconductor layer 200) of each layer in FIG. 2 will be referred to as an "up-down direction". A direction in which the semiconductor layer 200 is arranged relative to the wiring layer 300 will be referred to as "up". In addition, a length in a direction of a line segment AA' and in a direction of a line segment BB' will be referred to as a "width". A first chip 700 including the semiconductor layer 200 and the wiring layer 300 and a second chip 500 including the wiring layer 530 and the semiconductor layer 520 are joined by a joining surface 600.

(Semiconductor Layer): The semiconductor layer 200 has an APD which acquires a charge by photoelectrically converting light incident from a rear surface 202 and which amplifies the charge. In the present embodiment, the APD includes an N-type semiconductor region 111a which constitutes a cathode of the APD, and a P-type semiconductor region 111c. The semiconductor layer 200 further includes a P-type semiconductor region 111b. Voltage applied to the P-type semiconductor region 111b is applied to the P-type semiconductor region 111c via a P-type semiconductor region 111. The N-type semiconductor region 111a, the P-type semiconductor region 111c, and the P-type semiconductor region 111 are arranged in each pixel. A front surface 201 of the semiconductor layer 200 is in contact with (connected with) the wiring layer 300. In other words, the wiring layer 300 is arranged on a side of the front surface (front surface side) of the semiconductor layer 200. Specifically, the front surface 201 of the semiconductor layer 200 and an insulating film included in the wiring layer 300 come into contact with each other.

A trench 140 is arranged inside the semiconductor layer 200 between APDs that are lined up in the row direction or the column direction. The trench 140 extends from inside the semiconductor layer 200 to inside the wiring layer 300. The trench 140 includes a stationary electrode film 141, an insulating film 142, and an embedded material 143.

The semiconductor layer 200 is mainly formed of silicon. The N-type semiconductor region 111a and the P-type semiconductor region 111c are, respectively, dopant-implanted regions in which arsenic (As) and boron (B) are implanted into silicon. In addition, the trench 140 is arranged at a position that divides two pixels adjacent to each other in the row direction or the column direction. Furthermore, the trench 140 is surrounded by the P-type semiconductor region 111b.

The stationary electrode film 141 is a metal compound (alumina, hafnia, or the like) with a negative fixed charge. The insulating film 142 is silicon oxide or silicon nitride. The embedded material 143 is, for example, an insulating material (silicon oxide or silicon nitride). Alternatively, the embedded material 143 is a member that contains a metal (tungsten, titanium, tantalum, aluminum, gold, silver, copper, or platinum) or/and a metal compound. Still alternatively, polysilicon, silicon, an organic compound, or a cavity can also be selected as the embedded material 143. The embedded material 143 is not limited to the above and other members may also be used therefor.

A surface (trench surface) of the trench 140 has a high interface state and an unnecessary electron attributable to other than photoelectric conversion is generated on the trench surface. The unnecessary electron may act as an occurrence factor of aliasing of the photoelectric conversion device 010. When the trench 140 includes metal or a metal compound, the trench 140 can play a role as an electronic trap (a role in trapping electrons). In addition, surrounding the trench 140 with the P-type semiconductor region 111b also produces an effect of an electronic trap.

The embedded material 143 blocks traverse of light between pixels. When metal or a metal compound is selected as the embedded material 143, the embedded material 143 may have conductivity. Therefore, in this case, the embedded material 143 may also substitute as the stationary electrode film 141.

The members described above are merely examples and other members and dopants may also be applied. In addition, positions and shapes of P-type semiconductors, N-type semiconductors, trenches, and the like can be freely designed (refer to FIG. 37). Furthermore, a trench width may vary depending on depth (a position in the up-down direction). For example, a tapered shape may be assumed due to etching. Moreover, in the trench 140, the stationary electrode film 141 or the embedded material 143 need only include metal or a metal compound and other members can be freely changed.

(Wiring Layer): The wiring layer 300 has an insulating film 301 and a plurality of wirings 320. The wiring layer 300 is arranged between the semiconductor layer 200 and the wiring layer 530. An optical thin film 302 is arranged in a vicinity of the semiconductor layer 200 among the wiring layer 300. As the optical thin film 302, for example, a material capable of reflecting or preventing reflection or absorbing light which has not been photoelectrically converted and which has been transmitted through the semiconductor layer 200 is used. In addition, the trench 140 which extends from the semiconductor layer 200 is connected to (in contact with) a light-shielding plate (wiring) 350. The light-shielding plate 350 either reflects, shields, or absorbs light having passed through the APD. The light-shielding plate 350 is arranged so as to overlap with the N-type semiconductor region 111a in a plan view. In addition, a cathode contact plug 311a is connected to the N-type semiconductor region 111a and an anode contact plug (not illustrated) is connected to the P-type semiconductor region 111b. Furthermore, the cathode contact plug 311a outputs a signal to the wiring layer 530 respectively via the wiring 320, via plugs 330 and 362, and a joining metal 361. Accordingly, the signal is output to a pixel circuit arranged on the semiconductor layer 520.

In the following description, a cathode contact plug will be denoted by reference sign "311a" and an anode contact plug will be denoted by reference sign "311b". In addition, when there is no need to distinguish between the two contact plugs, the contact plugs will be simply described as a contact plug 311. The contact plug 311 connects the semiconductor layer 200 and the wiring 320 to each other.

The insulating film 301 is, for example, silicon oxide. The optical thin film 302 is silicon nitride or tantalum oxide. The contact plug 311, the via plugs 330 and 362, the light-shielding plate 350, the wiring 320, and the joining metal 361 are members that contain a metal (tungsten, titanium, tantalum, aluminum, gold, silver, copper, platinum, or the like) or/and a metal compound. Other members may also be used for these constituent elements. A same material may be adopted as the metal included in the trench and the metal used in wiring.

In addition, in the photoelectric conversion device 010, when a peripheral circuit portion is arranged on the semiconductor layer 200, the wiring layer 530, the semiconductor layer 520, the via plug 362, and the joining metal 361 need not necessarily be arranged. Furthermore, positions and shapes of the respective constituent elements can be freely designed.

(Semiconductor Layer): The second chip 500 is constituted of the semiconductor layer 520 and the wiring layer 530. The semiconductor layer 520 includes a circuit element such as a transistor. The wiring layer 530 includes wiring such as a via plug 562 or a joining metal 561 and an insulating film. Each wiring is arranged in the insulating film. The joining metal 561 is connected to the joining metal 361 in order to receive the signal from the APD. The joining metal 361 and the joining metal 561 are in direct contact with each other.

The semiconductor layer 520 is silicon containing a dopant. It is assumed that the wiring (the via plug 562, the joining metal 561, or the like) in the wiring layer 530 is a member that contains a metal (tungsten, titanium, tantalum, aluminum, gold, silver, copper, platinum, or the like) or/and a metal compound. However, other members may also be used as the wiring in the wiring layer 530. In addition, when circuit design is performed so that an electric signal is transmitted to the outside without involving the semiconductor layer 520, the wiring (the via plug 562, the joining metal 561, or the like) or circuit elements of the semiconductor layer 520 need not necessarily be arranged. However, the semiconductor layer 520 can be used when manufacturing a back-side illuminated type even when a circuit element is not arranged. In this case, for example, a glass substrate can be connected to the wiring layer 300 in place of the semiconductor layer 520. Furthermore, positions and shapes of the constituent elements can be freely designed.

(Optical Layer): The optical layer 400 is arranged so as to come into contact with a side of the rear surface 202 (rear surface 202 side) of the semiconductor layer 200. A stationary electrode film 401 for producing an electronic trap effect of a silicon interface is arranged in a vicinity of the semiconductor layer 200 among the optical layer 400. An optical thin film 402 for preventing reflection is arranged on top of the stationary electrode film 401. In addition, an insulating film 403 with high transmittivity, a reflective plate 420 for optically separating pixels, a color filter 430 for separating colors for each pixel, and a lens 440 (a microlens) for collecting light are arranged on the optical layer 400.

The stationary electrode film 401 is a metal compound (alumina, hafnia, or the like) with a negative fixed charge. The optical thin film 402 is silicon nitride or tantalum oxide. The insulating film 403 is silicon oxide or silicon nitride. The reflective plate 420 is a member that contains a metal (tungsten, titanium, tantalum, aluminum, gold, silver, copper, platinum, or the like) or/and a metal compound. The color filter 430 is a resin material including a pigment or a dye. The lens 440 is a transparent resin, silicon oxide, or silicon nitride. Other members may also be used for these constituent elements. Furthermore, the constituent elements may be omitted or positions and shapes of the constituent elements can be freely designed.

FIG. 1B is a plan view when cutting the photoelectric conversion device 010 along a line segment A-A' in FIG. 2. FIG. 1B is a plan view of nine pixels centered on the pixel 101. In the plan view, the pixel 102 is arranged on an "A' side (to immediate right)" of the pixel 101 and the pixel 103 is arranged on an "A side (to immediate left)" of the pixel 101. An APD is arranged in each pixel and, in FIG. 1B, the N-type semiconductor region 111a of the APD is illustrated. In addition, the P-type semiconductor region 111b is arranged outside the N-type semiconductor region 111a. Furthermore, the cathode contact plug 311a is connected to the N-type semiconductor region 111a. A potential is supplied to the P-type semiconductor region 111b via the anode contact plug 311b.

In addition, in a plan view, the trench 140 is arranged in a grid pattern in a boundary portion between two adjacent pixels. In other words, the trench 140 is arranged so as to surround each pixel and to follow each side of each pixel. The contents of the plan view explained above are also applicable to embodiments using other plan views along the line segment A-A' unless otherwise noted.

Figure 3B:
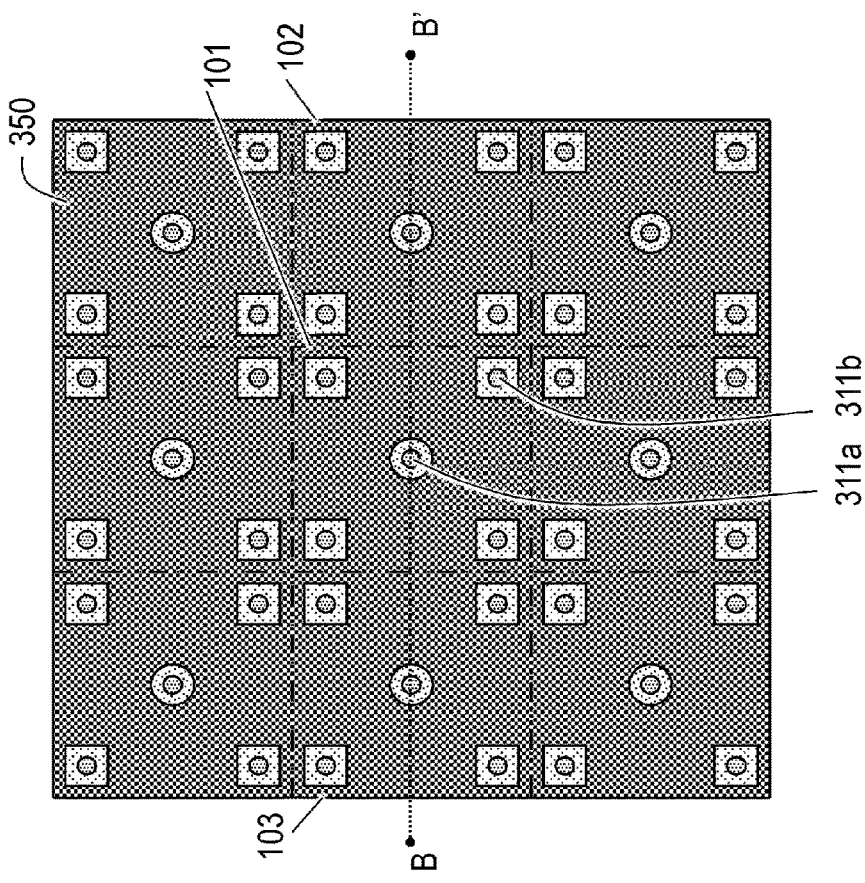
FIG. 3B is a plan view of the photoelectric conversion device according to the first embodiment.

FIG. 3B is a plan view when cutting the photoelectric conversion device 010 along a line segment B-B' in FIG. 2. A majority of the pixels are covered by the light-shielding plate 350. Since the light-shielding plate 350 is conductive, the light-shielding plate 350 is hollowed out around the contact plugs 311 (the cathode contact plug 311a and the anode contact plug 311b) so as to prevent the contact plugs 311 and the light-shielding plate 350 from being electrically connected to each other (from leaking). As shown in FIGS. 2 and 3B, the trench 140 is connected to the light-shielding plate 350 but not connected to the contact plugs 311. Therefore, when applying a potential to the trench 140, wiring or the like (not illustrated) for connecting the trench 140 to the light-shielding plate 350 must be used.

Figure 3A:
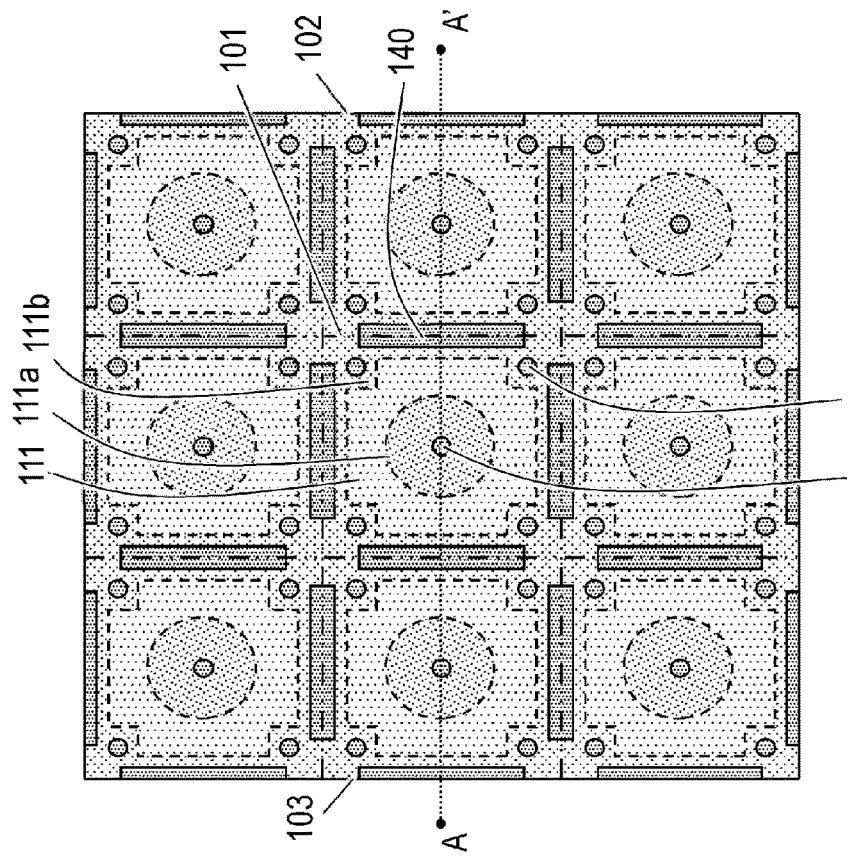
FIG. 3A is a plan view of a photoelectric conversion device according to a first modification.
Figure 4:
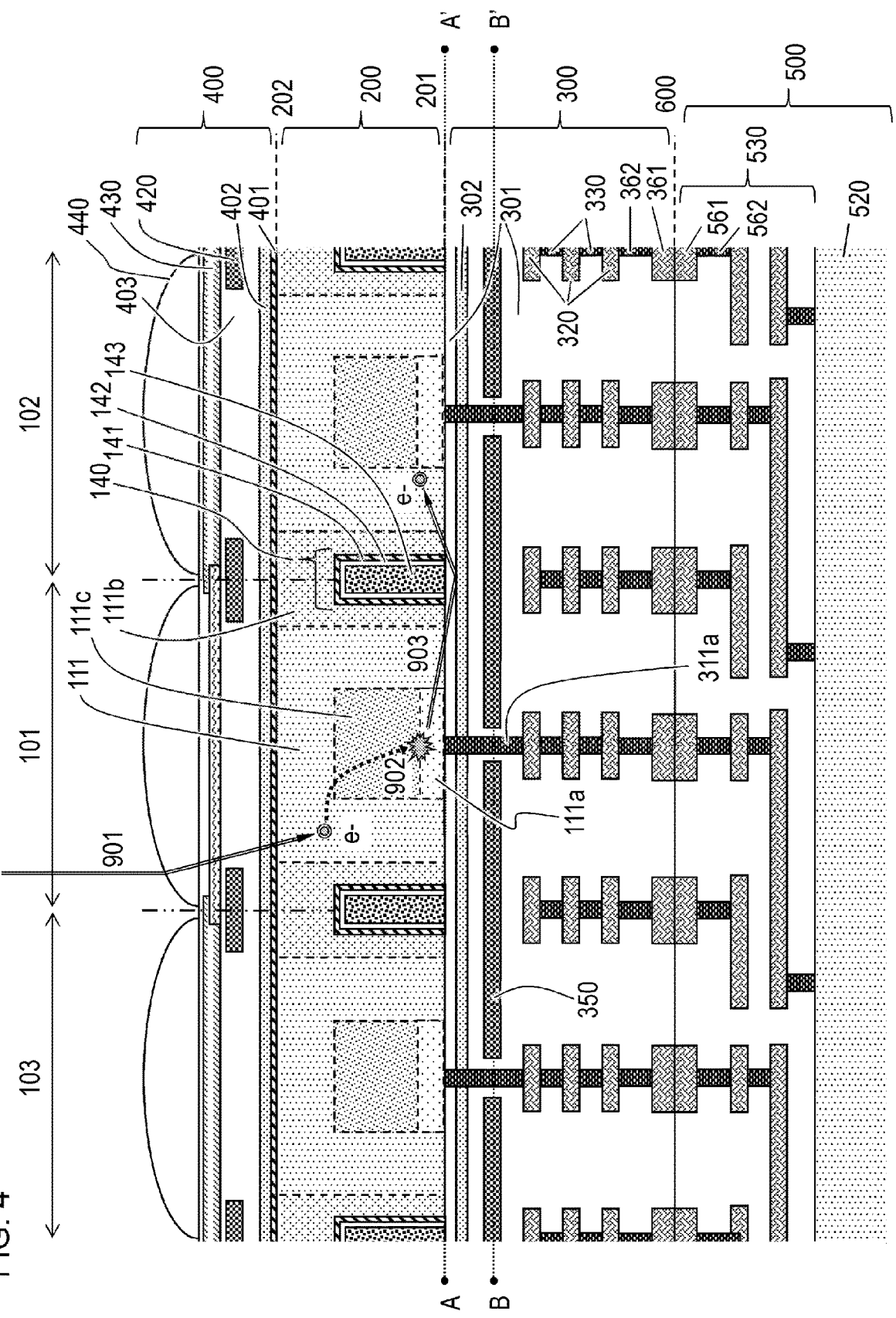
FIG. 4 is a sectional view of a photoelectric conversion device according to a comparative example.

(Advantageous Effect of Present Embodiment): An advantageous effect of the present embodiment will be explained with reference to FIGS. 2 to 5B. FIG. 4 shows a photoelectric conversion device that represents a comparative example of FIG. 2. In the comparative example shown in FIG. 4, unlike in FIG. 2, the trench 140 only exists inside the semiconductor layer 200 and does not extend to the inside of the wiring layer 300.

In the photoelectric conversion device shown in FIG. 4, light incident from a subject is incident to the pixel 101 via a light beam path 901 and photoelectrically converted with a fixed probability. While an electron (e⁻) generated by the photoelectric conversion is multiplied by an avalanche breakdown in the APD and read out as a signal to a cathode terminal by a path 902, an avalanche emission occurs with a fixed probability. A part of the light created by the avalanche emission is incident to the adjacent pixel 102 via a light beam path 903. Accordingly, the light is photoelectrically converted inside the pixel 102 due to the avalanche emission and an electron (e⁻) is generated and subjected to avalanche multiplication in the APD and read from the cathode terminal. As a result, an unintentional electric signal is generated in the adjacent pixel 102.

On the other hand, the photoelectric conversion device 010 according to the present embodiment shown in FIG. 2 is capable of reducing generation of an unintentional electric signal in a pixel. This is due to the fact that the trench 140 which extends from the semiconductor layer 200 to the wiring layer 300 blocks the light beam path 903.

Avalanche crosstalk, which is a problem of an APD, will now be explained anew. While the light beam path 901 is expected to be slightly inclined due to a camera lens (not illustrated) and the lens 440, a subject is present at an approximately infinite distance from a photoelectric conversion device. Therefore, the light beam path 901 having the subject as a light source is a path of an anisotropic light beam with a large vertical component relative to the rear surface 202. However, an avalanche emission source in an APD exists inside the semiconductor layer 200 and emits an isotropic light beam. Therefore, a light beam path of crosstalk between pixels is unique compared to PDs other than an APD and light-shielding between pixels must be strengthened.

Figures 5A, 5B:
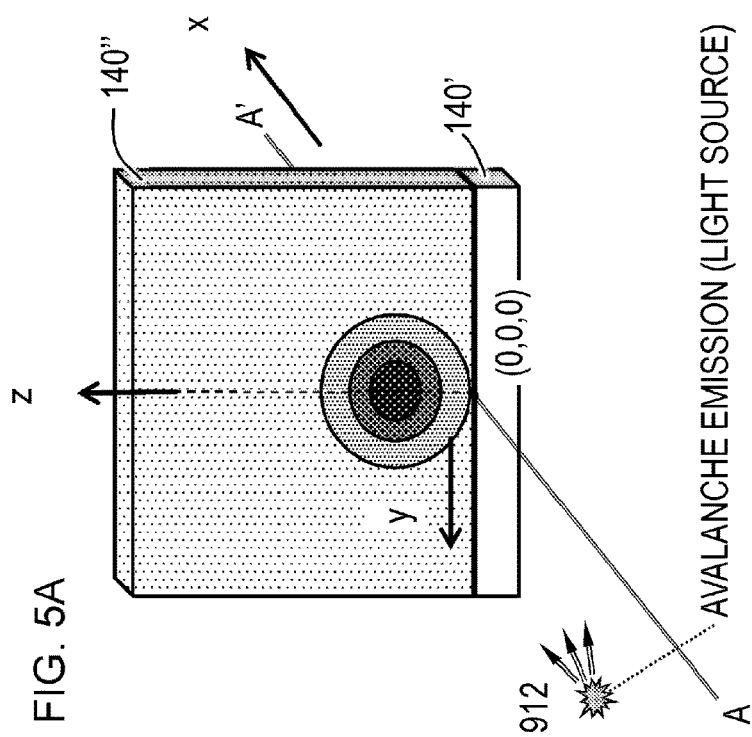
FIGS. 5A and 5B are diagrams illustrating an effect of the first embodiment.

Hereinafter, a light-shielding effect of the trench 140 will be explained in a simplified manner with reference to FIGS. 5A and 5B. In FIG. 5A, a transverse direction (an AA' direction) in FIGS. 2 and 4 is assumed to be an X axis, a depth direction is assumed to be a Y axis, and a longitudinal direction (an up-down direction) is assumed to be a Z axis. An origin is at a position where the trench 140 is arranged in a boundary portion between the semiconductor layer 200 and the wiring layer 300. Among the trench 140, a portion arranged on the semiconductor layer 200 will be referred to as a trench 140" and a portion arranged on the wiring layer 300 will be referred to as a trench 140'. Therefore, while the trench 140' is present in the photoelectric conversion device 010 according to the present embodiment (FIG. 2), the trench 140' is absent from the photoelectric conversion device according to the comparative example (FIG. 4).

In FIG. 5A, light is generated from a light source 912 of avalanche emission and the trench 140 is irradiated with the light. Since intensity of light is inversely proportional to distance squared, a light amount is strongest at locations nearest to the light source 912 (a position of a circle with a darkest shade in FIG. 5A) and, the farther away therefrom (the lighter the shade of the circle in FIG. 5A), the lower the light amount.

FIG. 5B represents a quantification of an irradiated light amount (an amount of shielded light) of the trench 140" and the trench 140' and a total irradiated light amount of the trench 140" and the trench 140' has been standardized as 100%. There is a range in numerical values of the irradiated light amount because the numerical value changes when assumptions such as a pixel size, a light source position, a trench height, and the like change. While the irradiated light amount changes due to various parameters including optical physical properties (refractive index, reflectance, light-shielding rate, and absorption rate) of each member, the present model ignores parameters other than positions and sizes of the trench 140" and the trench 140' for the sake of brevity.

When the trench 140 is solely constituted of the trench 140" as shown in FIG. 4, while the trench 140 is irradiated with 88 to 93% of light, the remaining 7 to 12% of light is not shielded. On the other hand, when the trench 140 is constituted of the trench 140" and the trench 140' as shown in FIG. 2, 100% of light can be shielded. Therefore, according to the present embodiment, avalanche crosstalk can be reduced by around 10 percent more than what is reduced in the comparative example.

First Modification

An arrangement of each component on the line segment A-A' of the photoelectric conversion device 010 may differ from the arrangement shown in FIG. 1B. FIG. 3A is a plan view along the line segment A-A' of the photoelectric conversion device 010 shown in FIG. 2.

In FIG. 3A, the trench 140 is arranged in a boundary portion between two pixels that are consecutive in the row direction and the column direction in the same manner as in FIG. 1B. On the other hand, in FIG. 3A, the trench 140 is not arranged and the P-type semiconductor region 111b remains in portions (diagonal portions), in a diagonal direction of each pixel. In other words, among the boundary portion between pixels, the trench 140 is not arranged in a portion of which a distance from a center position of a pixel is larger than a predetermined threshold.

While both FIG. 1B and FIG. 3A have similar effects of reducing avalanche crosstalk, the effect of FIG. 1B is more superior to the effect of FIG. 3A. However, regarding workability and, in particular, an embedding property of a trench, working of locations where the grid intersects is more difficult in the configuration shown in FIG. 1B than in the configuration shown in FIG. 3A. Therefore, cases may arise where the configuration according to the modification shown in FIG. 3A is adopted.

As described above, a configuration in which the trench 140 surrounds pixels in a grid pattern as shown in FIG. 1B most effectively reduces avalanche crosstalk. However, it is assumed that the light source 912 of avalanche emission is near the center of a pixel. Therefore, even when the trench 140 is arranged so as to avoid diagonal portions of pixels as shown in FIG. 3A, an effect of reducing avalanche crosstalk is sufficiently produced.

In addition, since intensity of light is inversely proportional to distance squared, light intensity is highest at a location that is nearest to the light source 912 as shown in FIG. 5B. For example, in a vicinity of the trench 140' where z=0, light intensity is strongest at opposite side positions (opposite side portions) of a pixel where y=0 is satisfied. Therefore, a location that should be most preferentially arranged (shielded) in the trench 140' is the position satisfying y=0. The farther away in the y-axis direction from the position satisfying y=0, the lower the light intensity and, consequently, the lower the need to shield light. Accordingly, since diagonal portions of a pixel have a low priority in shielding light, an example such as that shown in FIG. 3A is allowable.

Second Modification

Figure 6:
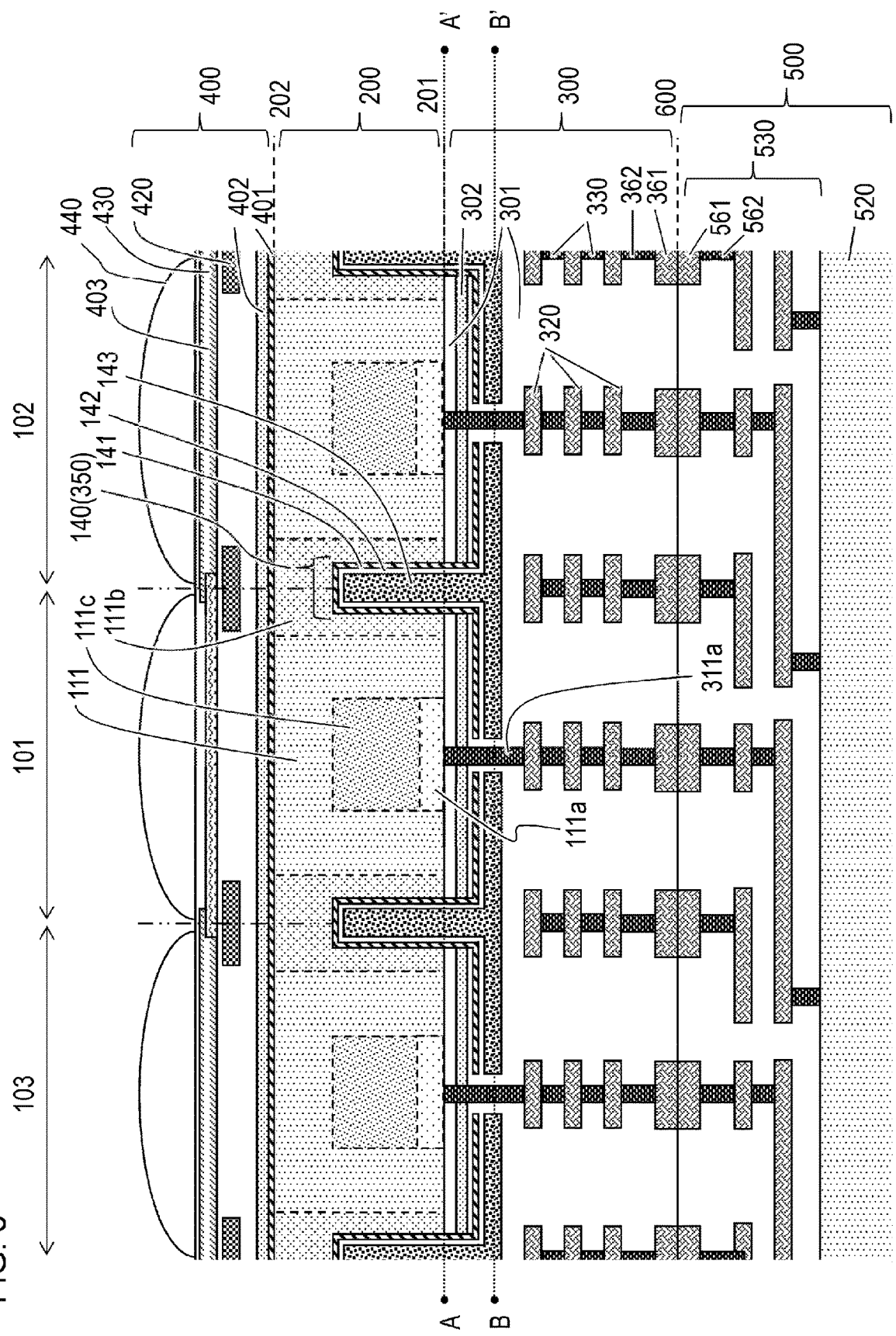
FIG. 6 is a sectional view of a photoelectric conversion device according to a second modification.

FIG. 6 is a sectional view of the photoelectric conversion device 010 according to a second modification. A plan view along the line segment A-A' which corresponds to the photoelectric conversion device 010 according to the second modification is FIG. 1B or FIG. 3A.

In FIG. 6, the trench 140 (the stationary electrode film 141, the insulating film 142, and the embedded material 143) is integrated with the light-shielding plate 350 shown in FIG. 2. In other words, the trench 140 and the light-shielding plate 350 are formed of a same member and, at the same time, formed by a same process. Due to the integration, an interface (boundary) is not generated and avalanche crosstalk can be reliably reduced (suppressed). It should be noted that all of the stationary electrode film 141, the insulating film 142, and the embedded material 143 need not be integrated with the light-shielding plate 350 and only a portion thereof may be integrated with the light-shielding plate 350.

In addition, the present modification has another advantage that differs from reducing (suppressing) avalanche crosstalk. That is, when the stationary electrode film 141 is at least alumina, there is a possibility that a dark current of the photoelectric conversion device 010 can be reduced.

An alumina film may act as a hydrogen supply source in a semiconductor. In the present modification, since an alumina film remains in a solid state with the exception of a vicinity of an opening of a contact plug, hydrogen supply sources can be regarded as being universally present. Accordingly, a dangling bond of a silicon surface is terminated and an effect of lowering an interface state and suppressing an occurrence of dark electrons can be expected. As a result, dark current characteristics of the photoelectric conversion device 010 are improved and an electric signal with a high S—N ratio can be produced.

Third Modification

Figure 7:
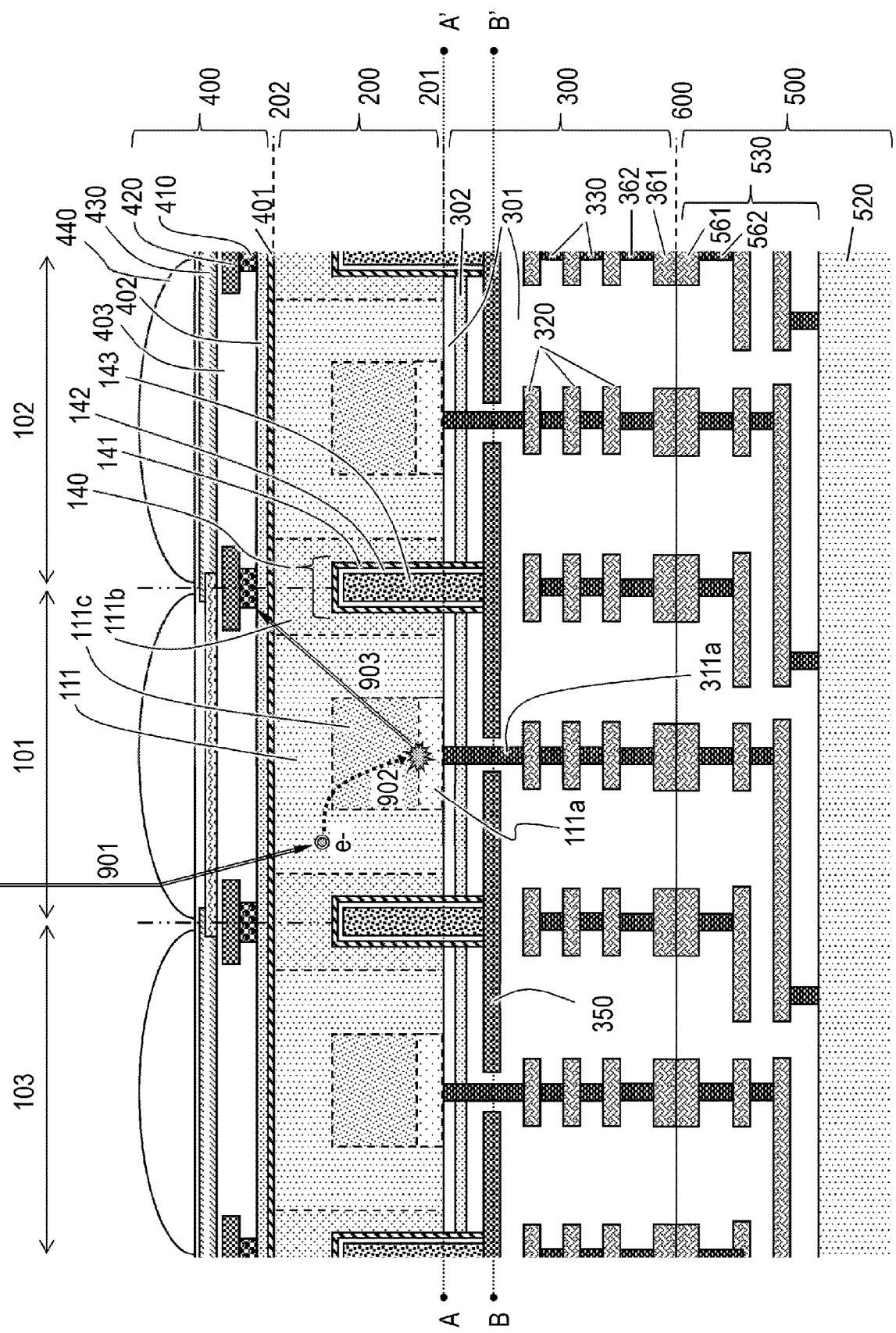
FIG. 7 is a sectional view of a photoelectric conversion device according to a third modification.

FIG. 7 is a sectional view of the photoelectric conversion device 010 according to a third modification. A plan view along the line segment A-A' which corresponds to the photoelectric conversion device 010 according to the third modification is FIG. 1B or FIG. 3A. In the third modification, in the optical layer 400, a light-shielding wall 410 is arranged between the reflective plate 420 and the semiconductor layer 200 (the optical thin film 402). The light-shielding wall 410 can prevent avalanche light of the light beam path 903 from leaking into the adjacent pixel 102.

It is assumed that the light-shielding wall 410 is a member that contains a metal (tungsten, titanium, tantalum, aluminum, gold, silver, copper, platinum, or the like) or/and a metal compound. However, other members may also be used as the light-shielding wall 410. The light-shielding wall 410 is desirably shaped as a wall that surrounds a pixel. However, as explained with reference to FIG. 5A, a sufficient effect is produced by preferentially arranging the light-shielding wall 410 in an opposite side direction.

The light-shielding wall 410 does not reach the semiconductor layer 200 in FIG. 7 because the optical thin film 402 provides a certain light-shielding performance. Therefore, alternatively, the light-shielding wall 410 may reach the semiconductor layer 200.

Fourth Modification

Figure 8:
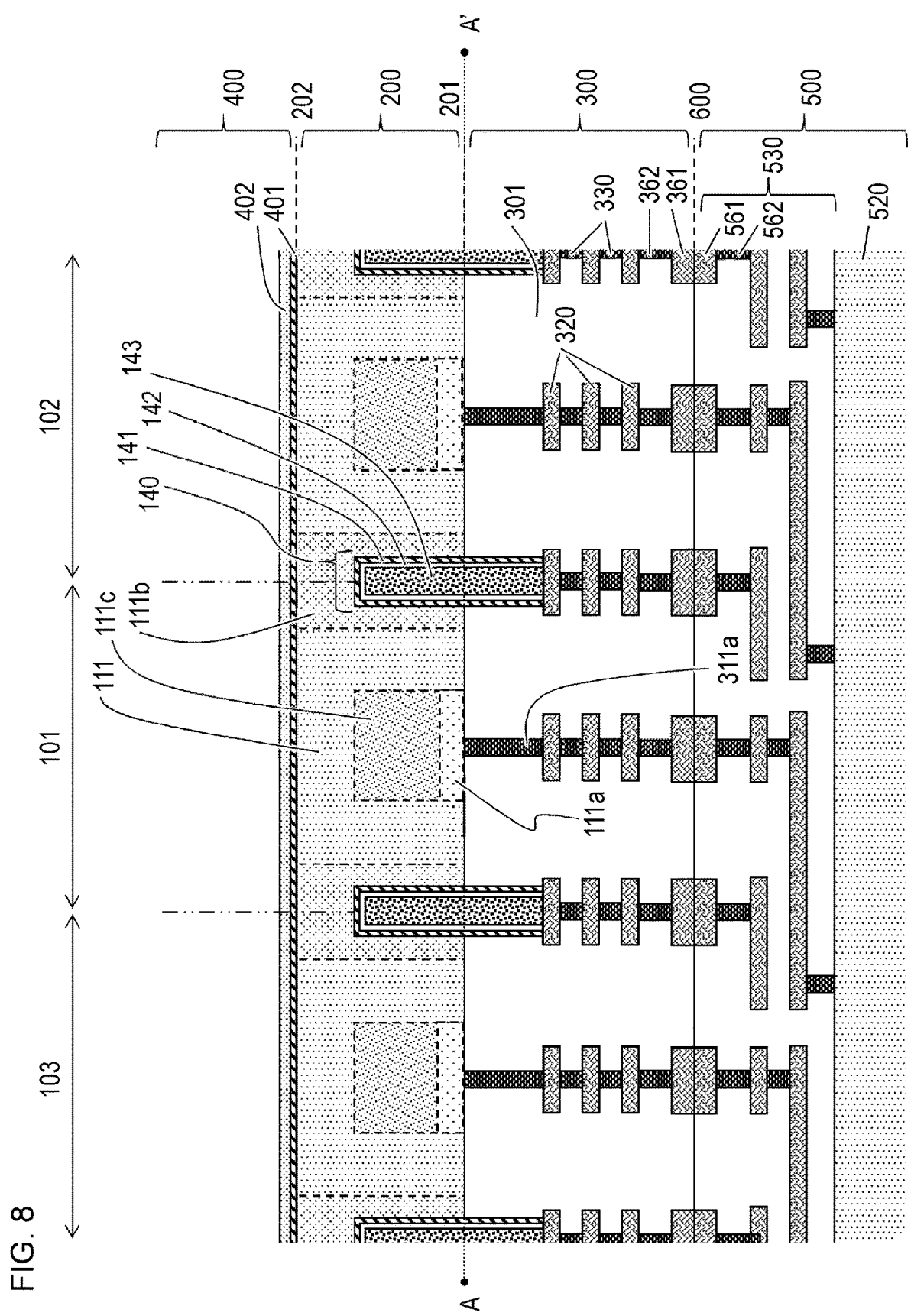
FIG. 8 is a sectional view of a photoelectric conversion device according to a fourth modification.

FIG. 8 is a sectional view of the photoelectric conversion device 010 according to a fourth modification. As explained in the third modification, the light source 912 of avalanche emission readily acts as an avalanche multiplication region of an APD. Therefore, with respect to the problem of reducing avalanche crosstalk of which a transverse direction is characteristic, planar structures such as the optical thin film and the reflective plate of the wiring layer 300 and the reflective plate of the optical layer are not effective and need not necessarily be arranged. According to the fourth modification, the photoelectric conversion device 010 can be readily manufactured. Even in FIG. 8, the trench 140 extends to the inside of the wiring layer 300.

Second Embodiment

Figure 9:
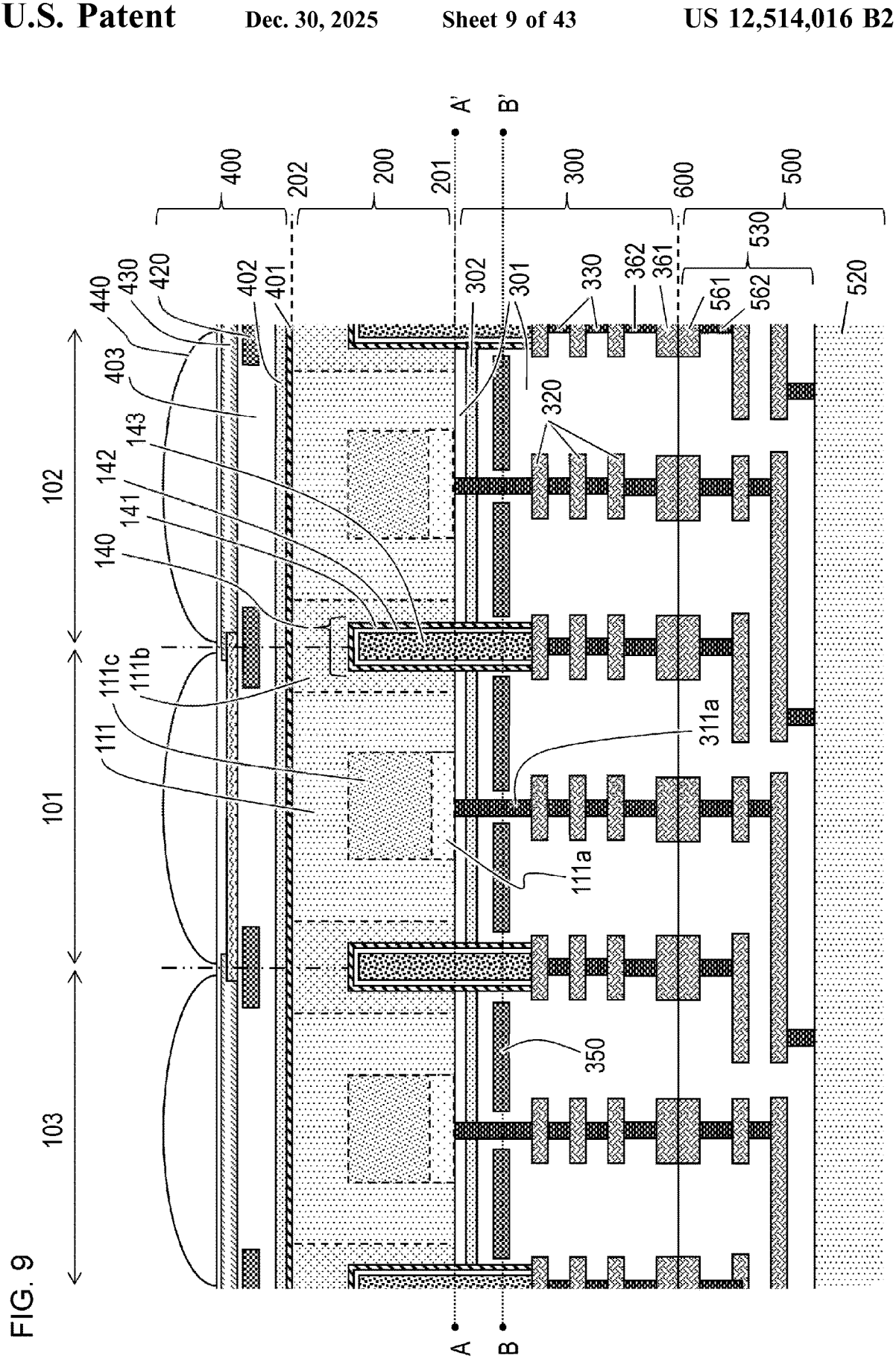
FIG. 9 is a sectional view of a photoelectric conversion device according to a second embodiment.
Figure 10:
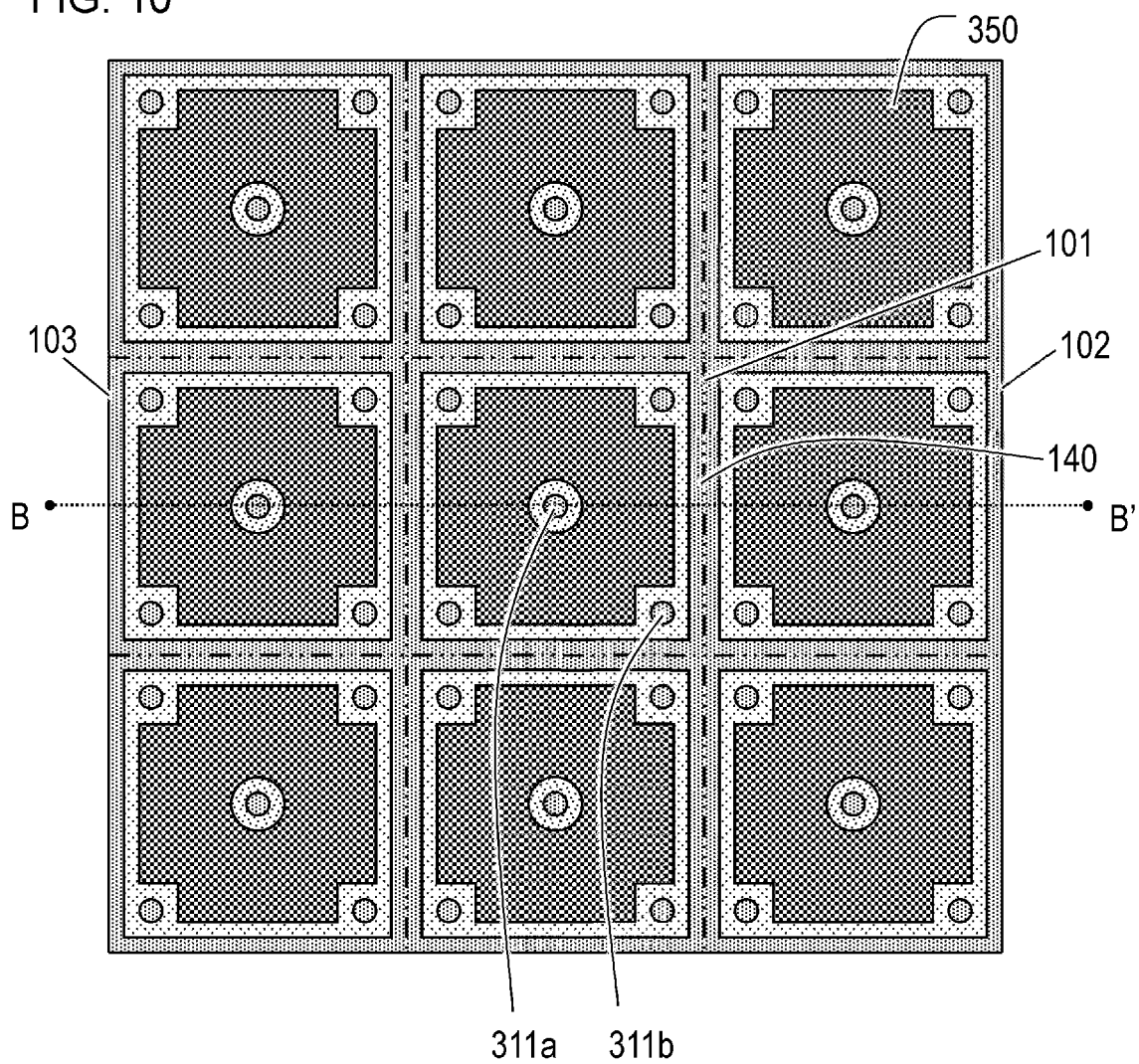
FIG. 10 is a plan view of the photoelectric conversion device according to the second embodiment.

The photoelectric conversion device 010 according to a second embodiment will be explained. The following description will be given with reference to FIGS. 9 and 10. FIG. 9 is a sectional view of the photoelectric conversion device 010 according to the second embodiment and FIG. 10 is a plan view along a line segment B-B' in FIG. 9. Unlike in the first embodiment (FIG. 2), in the second embodiment, the trench 140 is connected to (in contact with) the wiring 320 that is closest to the semiconductor layer 200 among the plurality of wirings 320.

FIG. 10 is a plan view of nine pixels centered on the pixel 101 according to the second embodiment. Since the arrangement and trench positions of each pixel are similar to those shown in FIG. 1B, a description thereof will be omitted. As shown in FIGS. 9 and 10, since the trench 140 is connected to the wiring 320, in order to apply a potential to the trench 140, the potential needs to be applied via the wiring 320. It is needless to say that the wiring connected to the trench 140 and the wiring 320 connected to the cathode contact plug 311a are separated from each other and different potentials are to be supplied.

In the second embodiment, due to the trench 140 being connected to (in contact with) the wiring 320, a light beam path along which light leaks into an adjacent pixel can be reduced. Accordingly, as shown in FIG. 3A, the light beam path can be reduced even when a part of the trench 140 does not surround a pixel.

Third Embodiment

Figure 11:
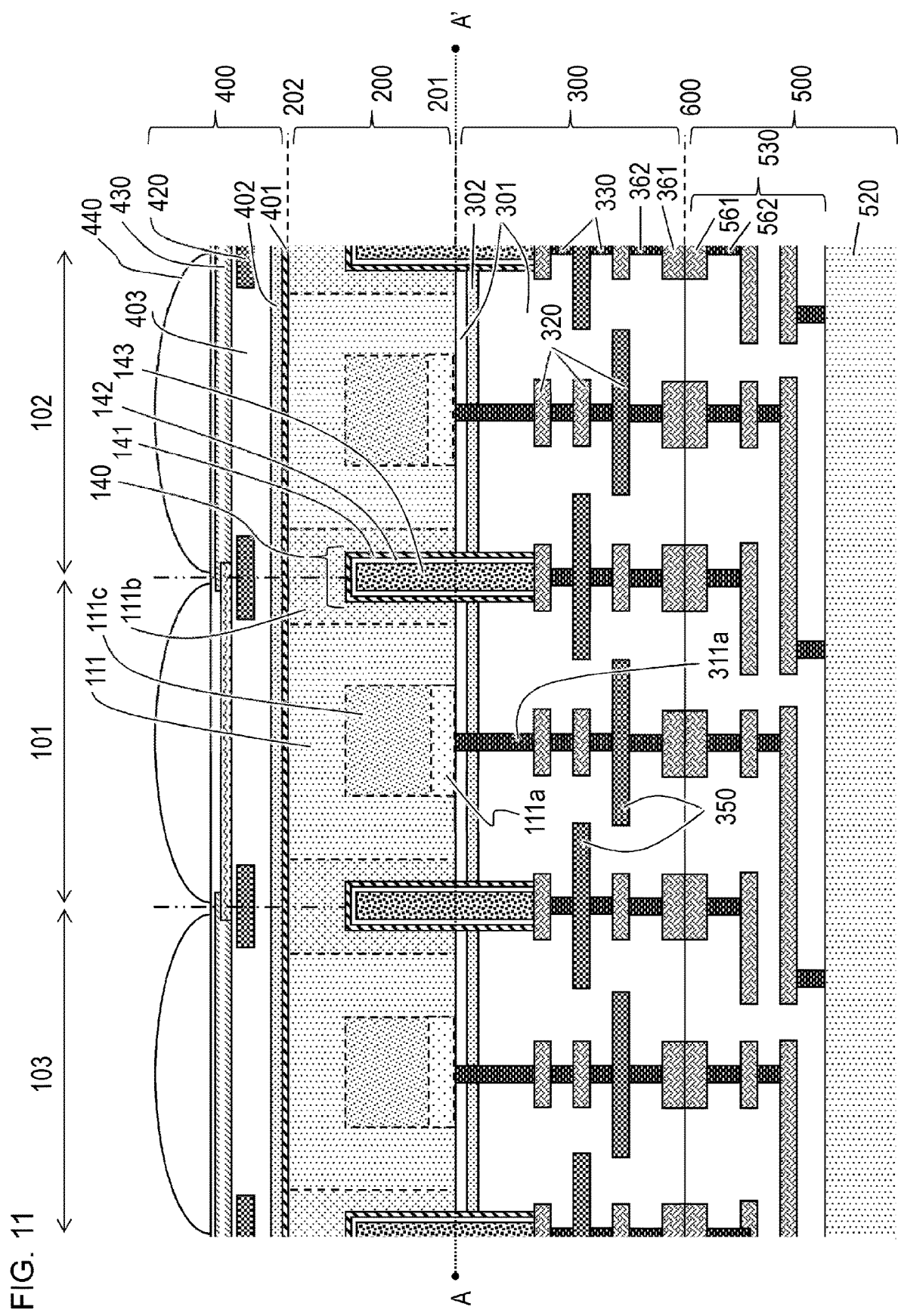
FIG. 11 is a sectional view of a photoelectric conversion device according to a third embodiment.

The photoelectric conversion device 010 according to a third embodiment will be explained. FIG. 11 is a sectional view of the photoelectric conversion device 010 according to the third embodiment.

Unlike in the first embodiment (FIG. 2), in the third embodiment, the light-shielding plate 350 is arranged farther from the semiconductor layer 200 than the wiring 320 that is nearest to the semiconductor layer 200. In addition, the light-shielding plate 350 is arranged by being divided into two layers instead of one layer. It should be noted that the light-shielding plate 350 may also function as the wiring 320.

When only one (one layer) of the light-shielding plate 350 (wiring) is arranged, an opening (a space) must be provided between the light-shielding plate 350 and the trench 140 in a plan view so as to reduce leakage between the contact plug 311 or the trench 140 and the light-shielding plate 350. While the opening causes leakage of light into an adjacent pixel, using a plurality of light-shielding plates (wirings)

enables leakage of light from the opening of one light-shielding plate to be suppressed by another light-shielding plate. In addition, by combining the present embodiment with other embodiments, even a light beam path of a slight avalanche crosstalk can be more readily blocked.

Fourth Embodiment

Figure 12:
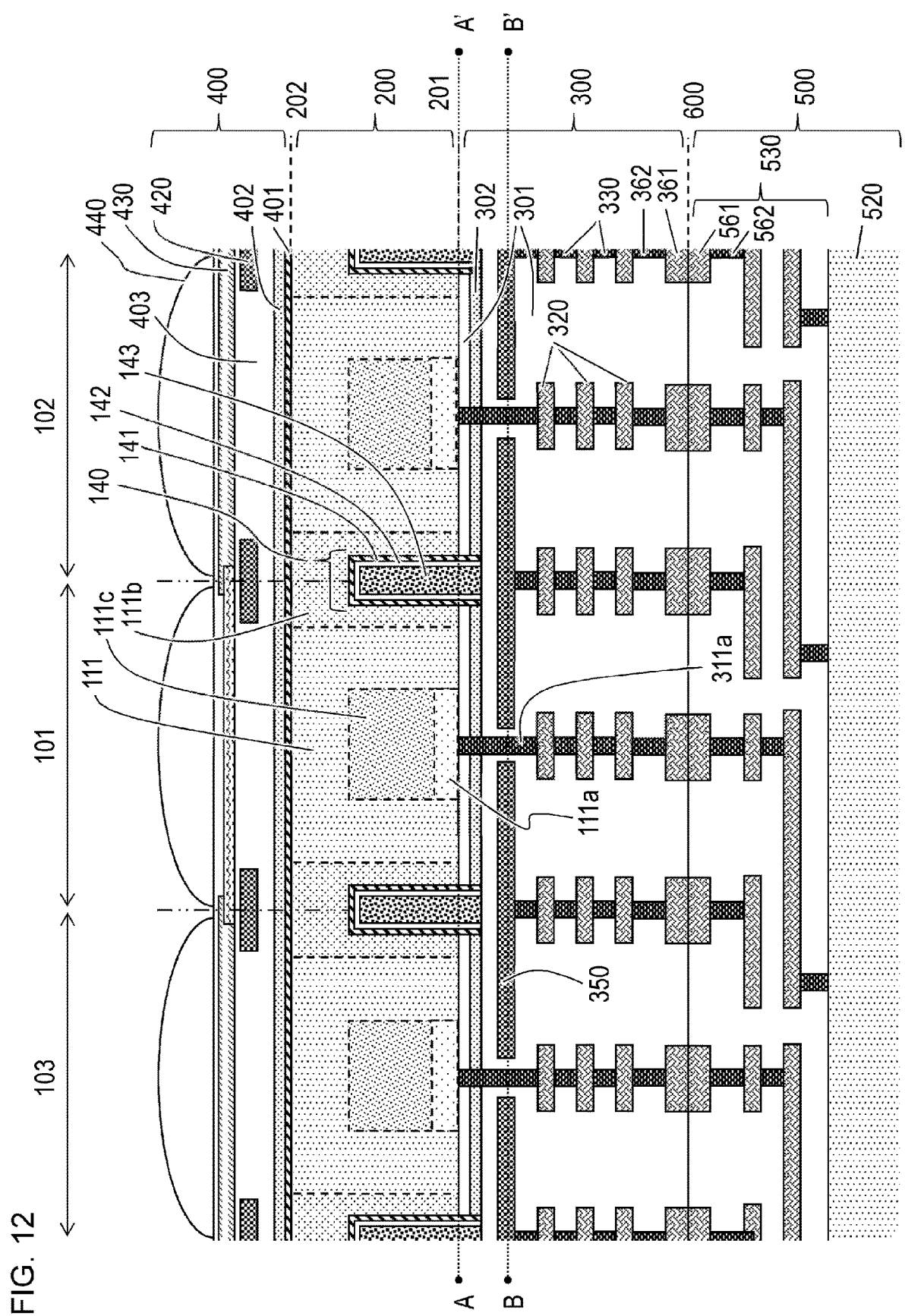
FIG. 12 is a sectional view of a photoelectric conversion device according to a fourth embodiment.

The photoelectric conversion device 010 according to a fourth embodiment will be explained. FIG. 12 is a sectional view of the photoelectric conversion device 010 according to the fourth embodiment. Unlike in the first embodiment (FIG. 2), in the fourth embodiment, the trench 140 only extends to the optical thin film 302 of the wiring layer 300. The optical thin film 302 is formed of a material of which a refractive index or transmittivity differs from that of the insulating film 301 with high transmittivity and has a reflection, reflection prevention, or absorption property. Therefore, depending on the designed performance of the optical thin film 302, the trench 140 need only extend to at least the optical thin film 302 and need not necessarily be connected to a wiring or a light-shielding plate.

Fifth Embodiment

Figure 13:
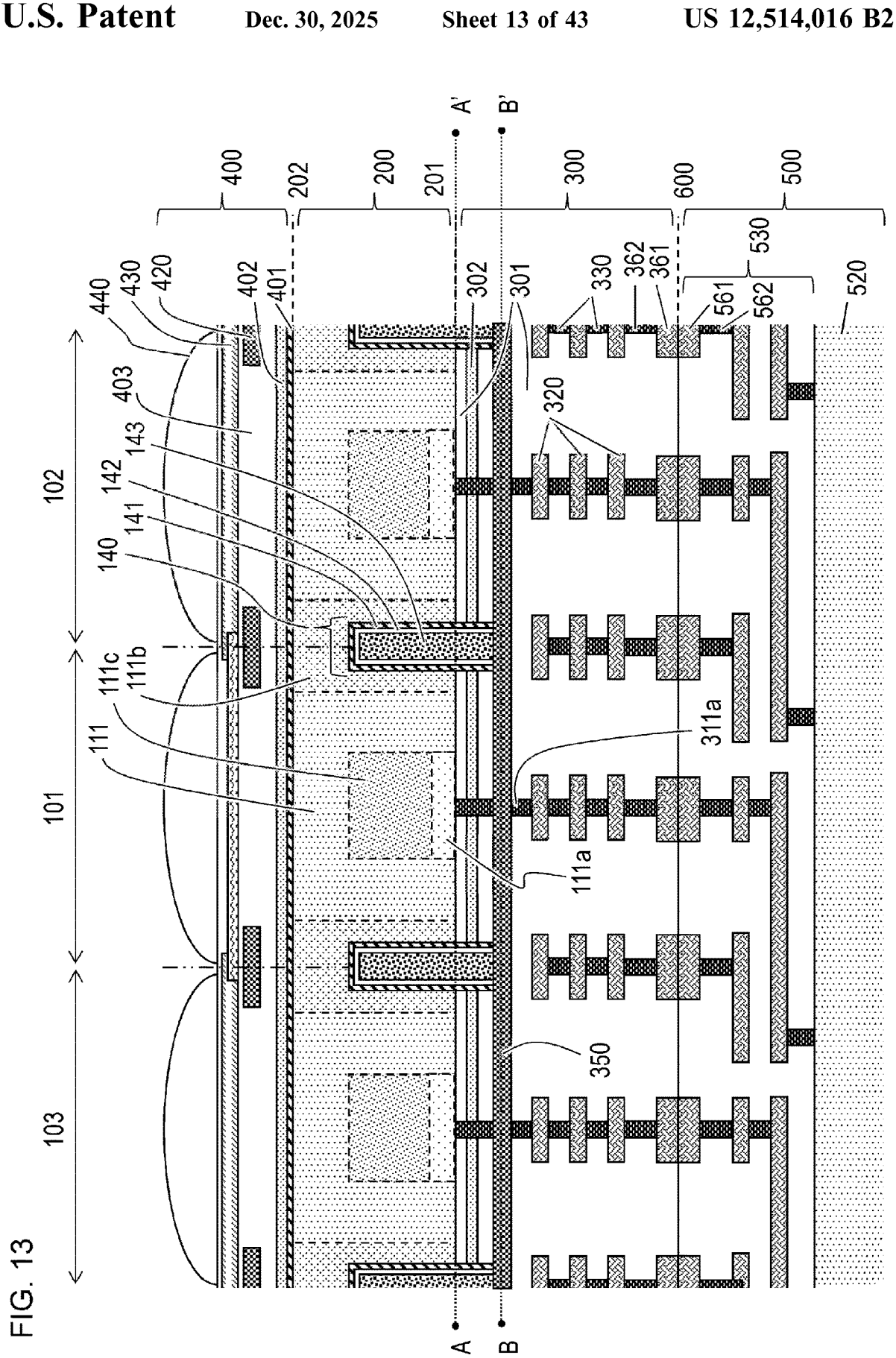
FIG. 13 is a sectional view of a photoelectric conversion device according to a fifth embodiment.

The photoelectric conversion device 010 according to a fifth embodiment will be explained. FIG. 13 is a sectional view of the photoelectric conversion device 010 according to the fifth embodiment. Unlike in the first embodiment (FIG. 2), in the fifth embodiment, the light-shielding plate 350 is connected to both the contact plug 311 and the trench 140 in the sectional view shown in FIG. 13.

Figure 14A:
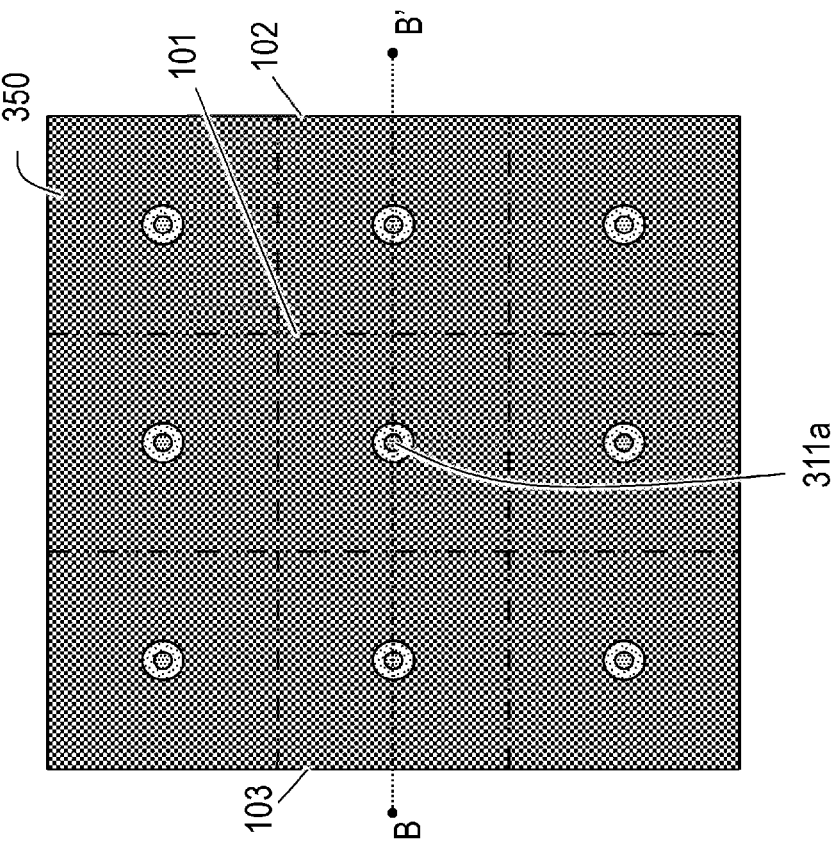
FIG. 14A is a plan view of the photoelectric conversion device according to the fifth embodiment.

FIG. 14A is a plan view when cutting the photoelectric conversion device 010 along the line segment B-B' in FIG. 13. FIG. 14A is a plan view of nine pixels centered on the pixel 101. Since the arrangement and trench positions of each pixel are similar to those shown in FIG. 1B, a description thereof will be omitted. Many of the pixel regions are covered by the light-shielding plate 350. Since the light-shielding plate 350 is conductive, the light-shielding plate 350 cannot be formed over an entire surface and only a periphery of the anode contact plug 311b is hollowed out in order to prevent leakage. As shown in FIGS. 13 and 14A, the trench 140 is connected to the light-shielding plate 350. Therefore, when applying a potential to the trench 140, the potential is applied to the trench 140 via the light-shielding plate 350. In this case, the cathode contact plug 311a and the trench 140 become equipotential.

Fifth Modification

The photoelectric conversion device 010 according to a fifth modification will be explained. There is no difference between the photoelectric conversion device 010 according to the present modification and the first embodiment (FIG. 2) in a sectional view.

Figure 14B:
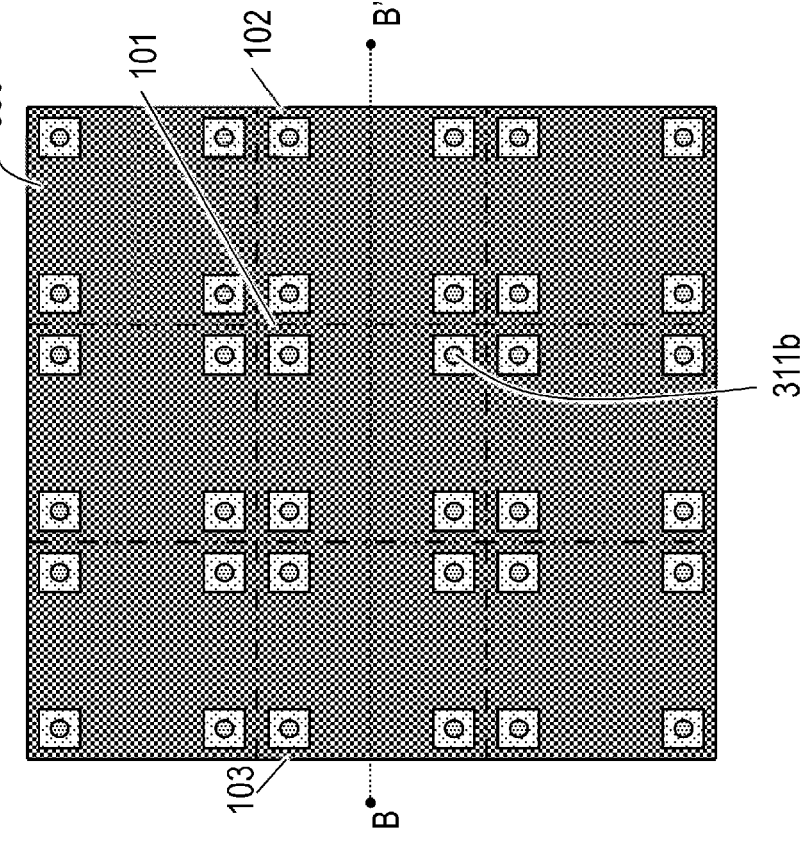
FIG. 14B is a plan view of a photoelectric conversion device according to a fifth modification.

FIG. 14B is a plan view when cutting the photoelectric conversion device 010 according to the present modification along the line segment B-B' in FIG. 2. Since the arrangement and trench positions of each pixel are similar to those shown in FIG. 1B, a description thereof will be omitted. The anode contact plug 311b and the trench 140 which are supposed to be present on an outer side of the cathode contact plug 311a are connected to the light-shielding plate 350 and are therefore not illustrated. The cathode contact plug 311a is arranged at the center of a pixel. Many of the pixel regions are covered by the light-shielding plate 350. Since the light-shielding plate 350 is conductive, the light-shielding plate 350 cannot be formed over an entire surface and only a periphery of the cathode contact plug 311a is hollowed out in order to prevent leakage. As shown in FIGS. 2 and 14B, the trench 140 is connected to the light-shielding plate 350. Therefore, when applying a potential to the trench 140, the potential is applied to the trench 140 via the light-shielding plate 350. In this case, the anode contact plug 311b and the trench 140 become equipotential.

As described above, in the fifth embodiment and the fifth modification, the contact plug 311 (the anode terminal or the cathode terminal) and the trench 140 can be shared. According to the fifth embodiment and the fifth modification, an area where the light-shielding plate 350 is hollowed out can be minimized. Therefore, an effect of increasing sensitivity which is an intended purpose of the light-shielding plate 350 can be maximized and, at the same time, the hollowed-out portion can be prevented from causing leakage of light into the adjacent pixel (causing crosstalk).

Sixth Embodiment

Figure 15:
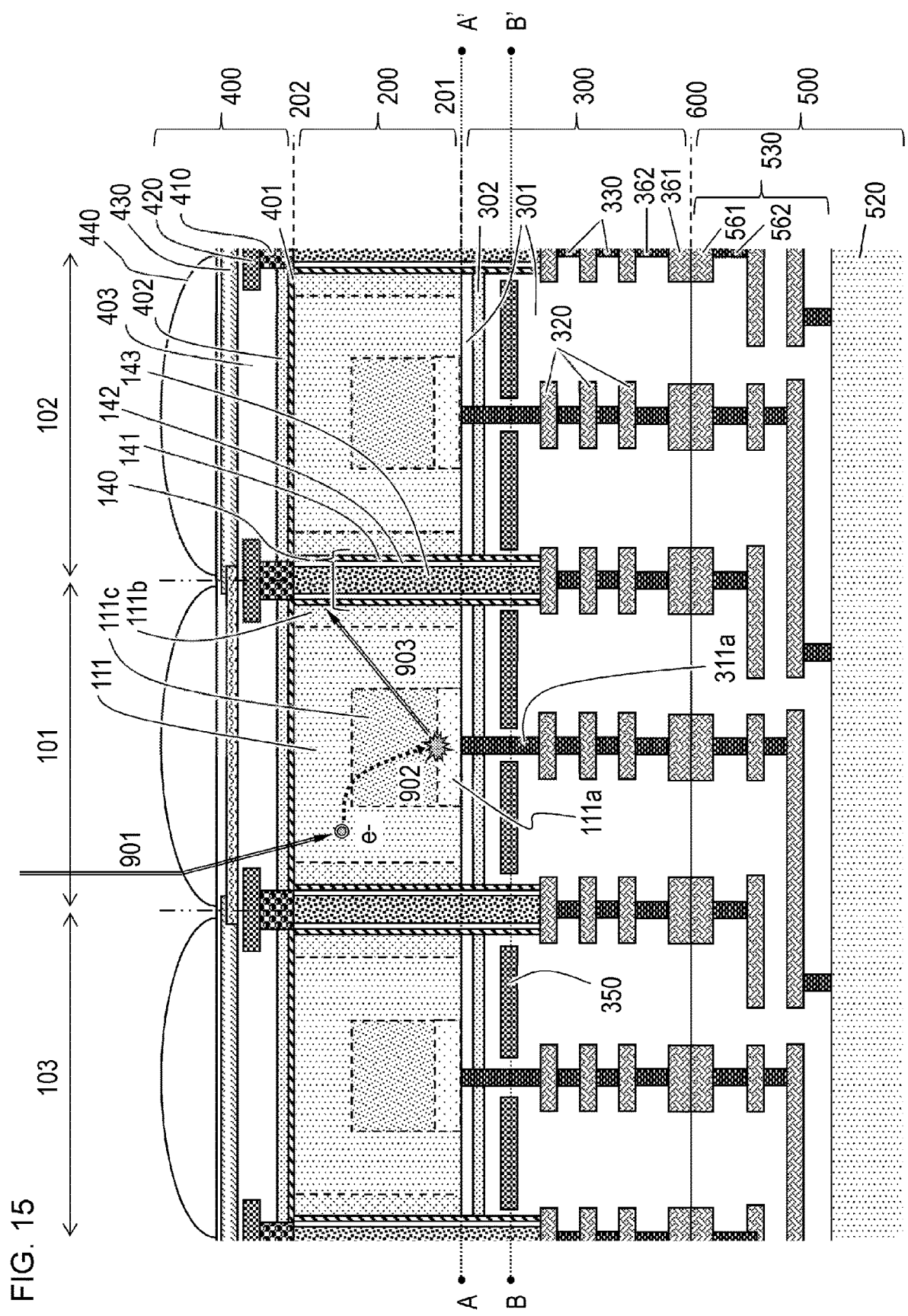
FIG. 15 is a sectional view of a photoelectric conversion device according to a sixth embodiment.

The photoelectric conversion device 010 according to a sixth embodiment will be explained. FIG. 15 is a sectional view of the photoelectric conversion device 010 according to the sixth embodiment.

Unlike in the first embodiment (FIG. 2), in the sixth embodiment, the trench 140 reaches the rear surface 202 of the semiconductor layer 200 in a sectional view (FIG. 15). While a form of the light-shielding plate 350 of the wiring layer 300 is similar to the form shown in FIG. 9 and a form of the light-shielding wall 410 of the optical layer 400 is similar to the form shown in FIG. 7, this merely indicates that the present embodiment can be combined with previous embodiments.

In FIG. 15, due to the trench 140 reaching the rear surface 202, avalanche light of the light beam path 903 can be prevented from leaking into the adjacent pixel 102. As already described in the third modification (FIG. 7), the light source 912 of avalanche emission is likely to occur in a vicinity of the cathode contact plug 311a where an avalanche multiplication region of an APD is arranged. In addition, in the present embodiment, since a light-shielding effect is also produced with respect to a light beam path which passes through the boundary portion between pixels inside the semiconductor layer 200 which is a location near the light source 912, an effect of reducing avalanche crosstalk is large. In the sixth embodiment, the wiring 320, the embedded material 143 (the trench 140), the light-shielding wall 410, and the reflective plate 420 are sequentially stacked in a gapless manner.

Seventh Embodiment

Figure 16:
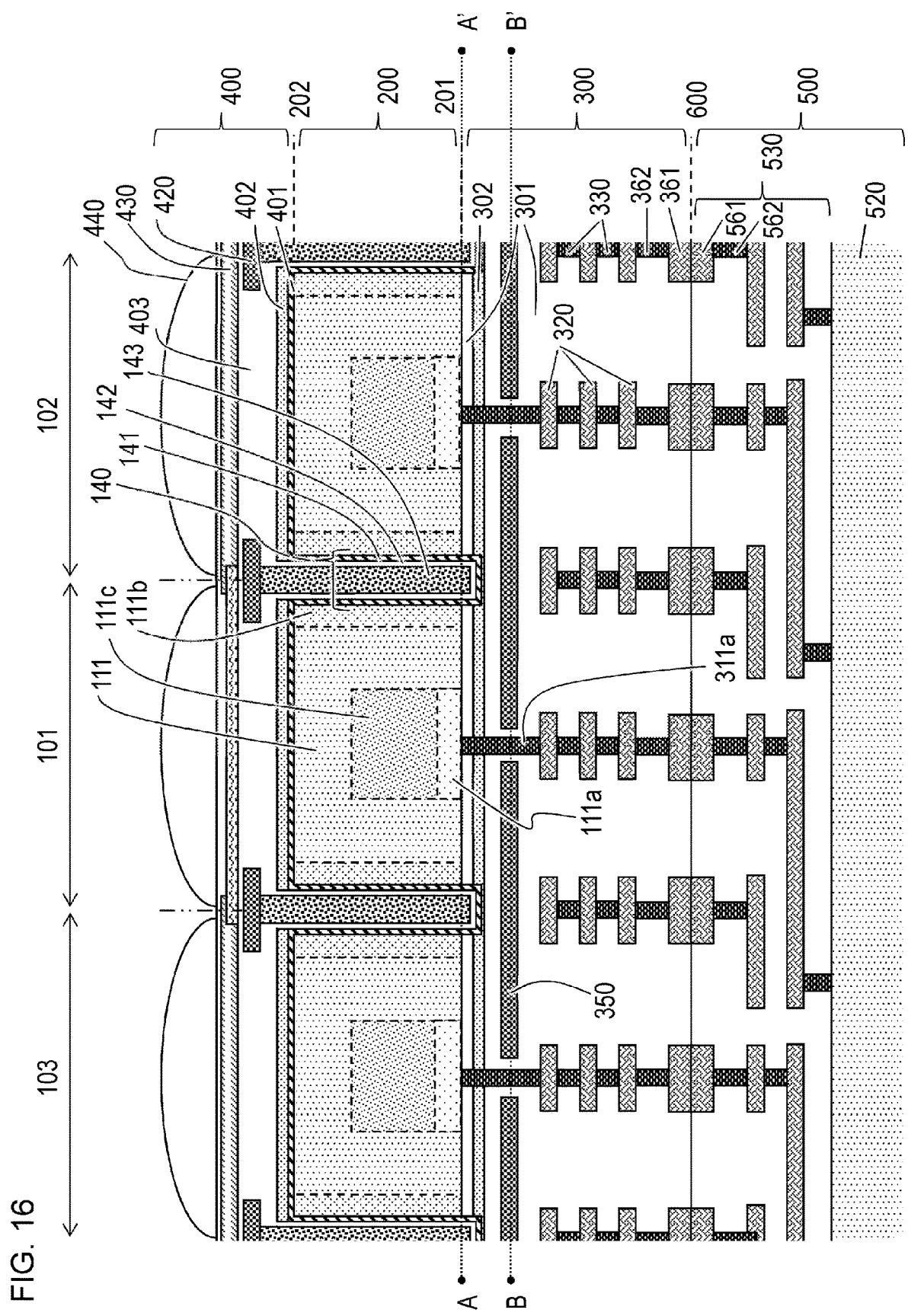
FIG. 16 is a sectional view of a photoelectric conversion device according to a seventh embodiment.

The photoelectric conversion device 010 according to a seventh embodiment will be explained. FIG. 16 is a sectional view of the photoelectric conversion device 010 according to the seventh embodiment.

Unlike in the first embodiment (FIG. 2), in the seventh embodiment, the trench 140 reaches the rear surface 202 of the semiconductor layer 200 in a sectional view (FIG. 16) and the embedded material 143 of the trench 140 extends inside the optical layer 400.

In the seventh embodiment, even crosstalk attributable to light passing through the boundary portion between pixels inside the semiconductor layer 200 can be reduced. In addition, since the embedded material 143 of the trench 140 extends inside the optical layer 400, avalanche crosstalk can be reliably reduced.

In the seventh embodiment, the embedded material 143 and the reflective plate 420 are connected to each other. The embedded material 143 and the reflective plate 420 may be formed of a same member. In a similar manner, the stationary electrode film 141 and the stationary electrode film 401 are connected to each other. The stationary electrode film 141 and the stationary electrode film 401 may be formed of a same member. In a similar manner, the insulating film 142 and the insulating film 403 are connected to each other. The insulating film 142 and the insulating film 403 may be formed of a same member.

Sixth Modification

Figure 17:
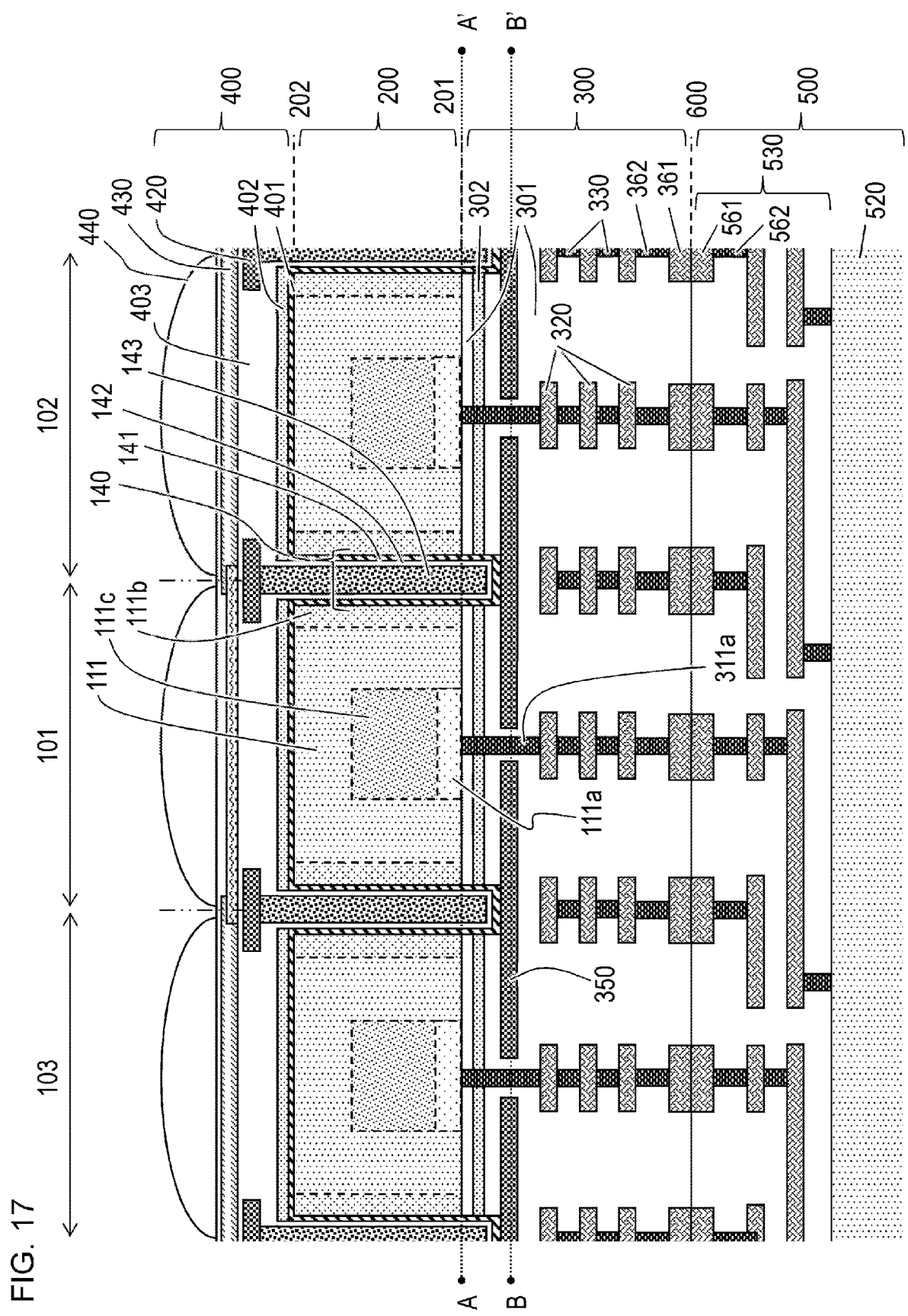
FIG. 17 is a sectional view of a photoelectric conversion device according to a sixth modification.

The photoelectric conversion device 010 according to a sixth modification will be explained. FIG. 17 is a sectional view of the photoelectric conversion device 010 according to the sixth modification.

Unlike in the seventh embodiment (FIG. 16), in the sixth modification, the trench 140 reaches the light-shielding plate 350 of the wiring layer 300 in a sectional view (FIG. 17). As in the seventh embodiment and the sixth modification, whether or not a gap from the optical thin film 302 to the light-shielding plate 350 is to be filled with the trench 140 can be selectively determined depending on characteristics of the optical thin film 302. An advantageous effect of the sixth modification is similar to the advantageous effect explained in the seventh embodiment.

In the sixth modification, the light-shielding plate 350 and the reflective plate 420 are connected to the trench 140. A part of or all of these constituent elements can also be formed of a same member. In addition, the embedded material 143 and the reflective plate 420 can also be formed simultaneously. In a similar manner, the stationary electrode film 141 and the stationary electrode film 401 are connected to each other. In a similar manner, the insulating film 142 and the insulating film 403 are connected to each other.

Eighth Embodiment

In an eighth embodiment, a manufacturing method (a process flow) of the photoelectric conversion device 010 according to the first embodiment (FIG. 2) will be explained. The eighth embodiment will be explained with reference to FIGS. 18A to 19B.

Figure 18A:
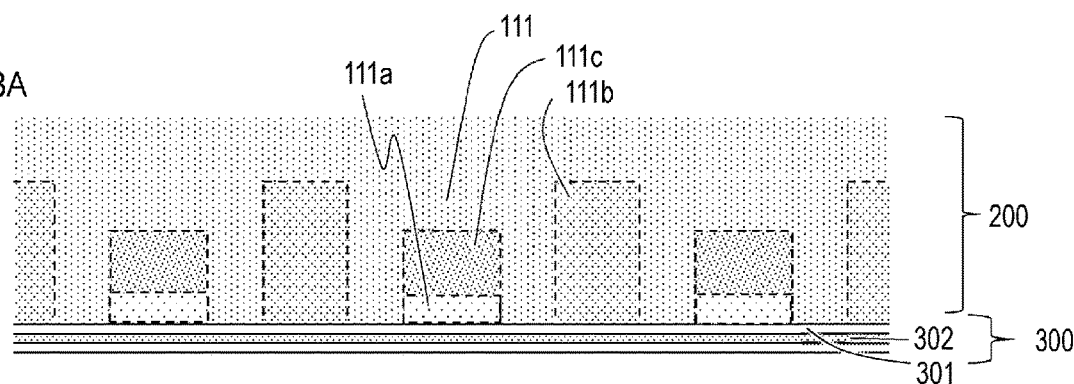
FIGS. 18A to 18C are diagrams illustrating a manufacturing method of a photoelectric conversion device according to an eighth embodiment.
Figure 18B:
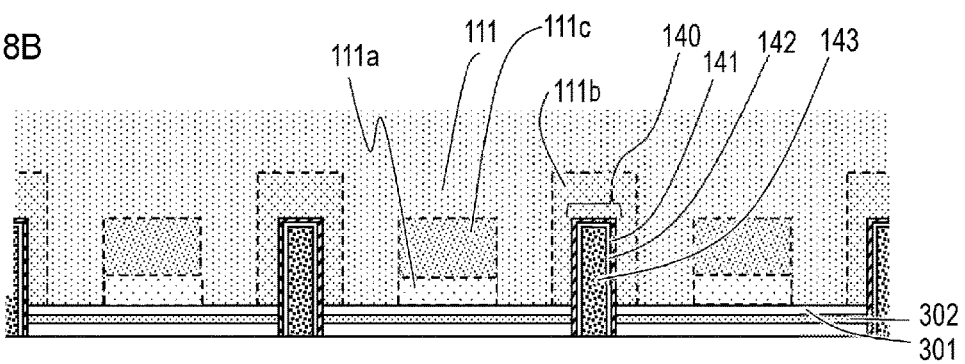
Figure 18C:
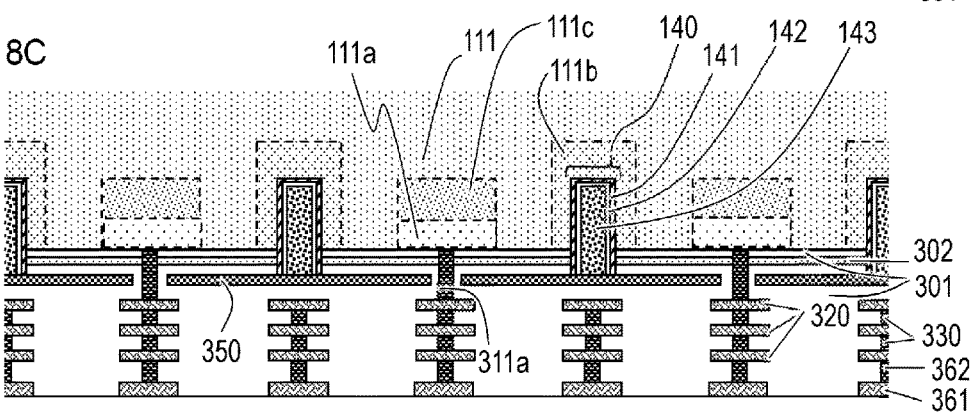
Figure 19A:
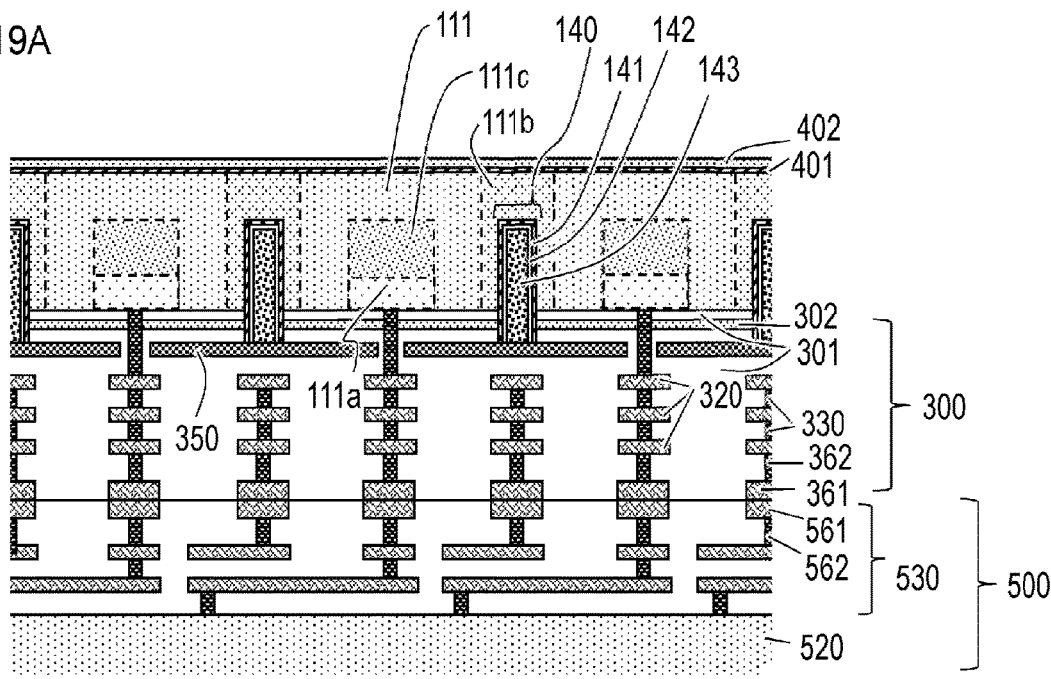
FIGS. 19A and 19B are diagrams illustrating the manufacturing method of the photoelectric conversion device according to the eighth embodiment.
Figure 19B:
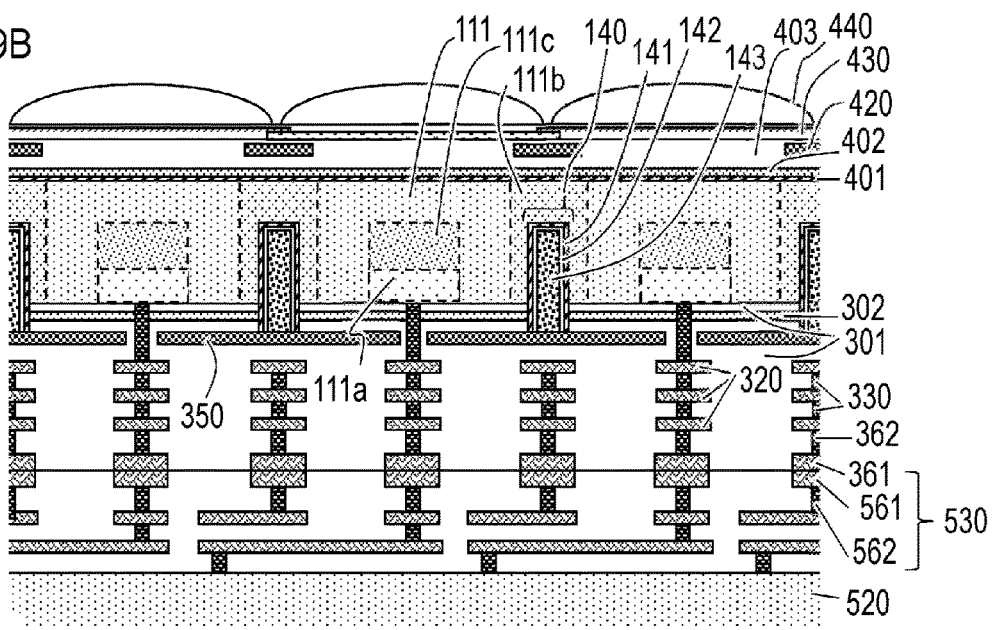

FIGS. 18A, 18B, and 18C represent steps through which the wiring layer 300 is formed on the semiconductor layer 200. FIGS. 19A and 19B represent steps in which the semiconductor layer 520 and the semiconductor layer 200 are stacked and the semiconductor layer 200 is used as a supporting substrate. It should be noted that a supporting substrate such as a glass substrate may be used in place of the semiconductor layer 520.

(1) First, as shown in FIG. 18A, the N-type semiconductor region 111*a*, the P-type semiconductor region 111*c*, and the P-type semiconductor region 111*b* are formed by ion implantation with respect to the semiconductor layer 200. Subsequently, a part of the wiring layer 300 (including the insulating film 301 and the optical thin film 302) are formed on the front surface 201 of the semiconductor layer 200. In other words, a member including the semiconductor layer 200 and the part of the wiring layer 300 arranged on the front surface 201 of the semiconductor layer 200 is formed. In other words, the member is prepared in the step shown in FIG. 18A. Ion implantation is performed so that the P-type semiconductor region 111*b* also includes a region corresponding to a region of the trench 140 to be formed in a subsequent step. This is done to enable electronic trapping. Performing ion implantation before forming a trench prevents a dopant from scattering at side walls of the trench and avoids a situation where a P-type semiconductor region cannot be formed in an intended concentration profile. This characteristic also applies to ninth and tenth embodiments to be described later.

(2) Next, as shown in FIG. 18B, the trench 140 is formed by etching. In addition, the stationary electrode film 141, the insulating film 142, and the embedded material 143 are embedded inside the trench 140. In other words, the trench 140 is formed in which at least any of metal and a metal compound is arranged inside. At this point, the trench 140 is formed so that the trench 140 extends from inside the semiconductor layer 200 to inside the wiring layer 300 (the insulating film 301) and, at the same time, the trench 140 is arranged in a boundary portion between two pixels that are consecutive in the row direction or the column direction. Furthermore, removal (surface removal) is performed up to the stationary electrode film 141 by etch-back. It should be noted that surface removal can also be performed by CMP polishing.

(3) As shown in FIG. 18C, the wiring layer 300 from the contact plug 311 to the joining metal 361 is formed by repeating processes such as film formation, photolithography, and etching.

(4) As shown in FIG. 19A, the second chip 500 prepared in advance and the wiring layer 300 are connected to each other so that the wiring layer 300 and the wiring layer 530 are joined to each other. A rear surface of the semiconductor layer 200 is then polished and thinned. Subsequently, the stationary electrode film 401 and the optical thin film 402 are formed on the rear surface of the semiconductor layer 200. A portion joined by the insulating film 301 and a portion metallically joined by the joining metal 361 and the joining metal 561 are present in the joint between the wiring layer 530 and the wiring layer 300.

(5) As shown in FIG. 19B, due to the same kind of machining as was performed when forming the wiring layer 300, the reflective plate 420 is formed inside the insulating film 403. Subsequently, the color filter 430 and the lens 440 are patterned.

The process flow described above enables the photoelectric conversion device 010 according to the first embodiment (FIG. 2) to be manufactured.

Ninth Embodiment

In a ninth embodiment, a manufacturing method (a process flow) of the photoelectric conversion device 010 according to the second modification (FIG. 6) will be explained. The ninth embodiment will be explained with reference to FIGS. 20A to 21B.

Figure 20A:
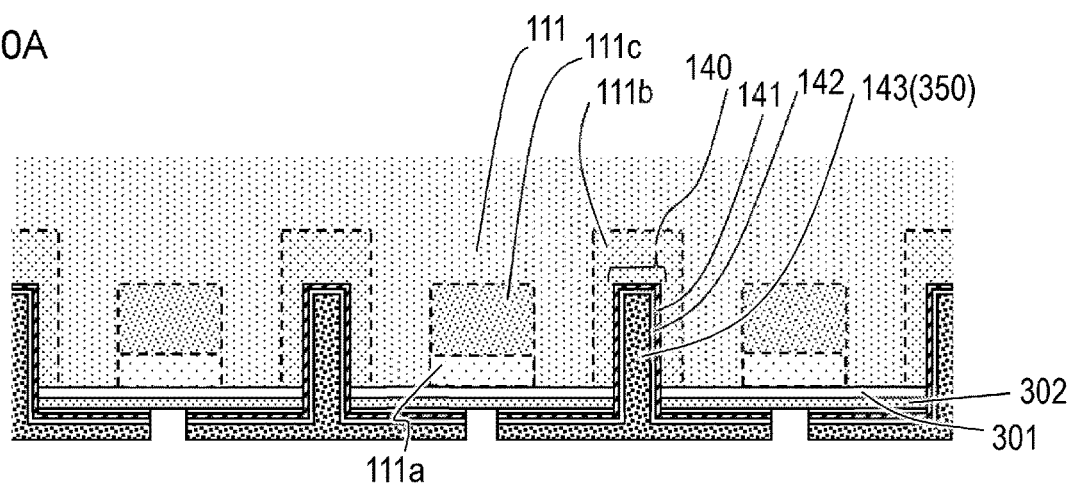
FIGS. 20A and 20B are diagrams illustrating a manufacturing method of a photoelectric conversion device according to a ninth embodiment.
Figure 20B:
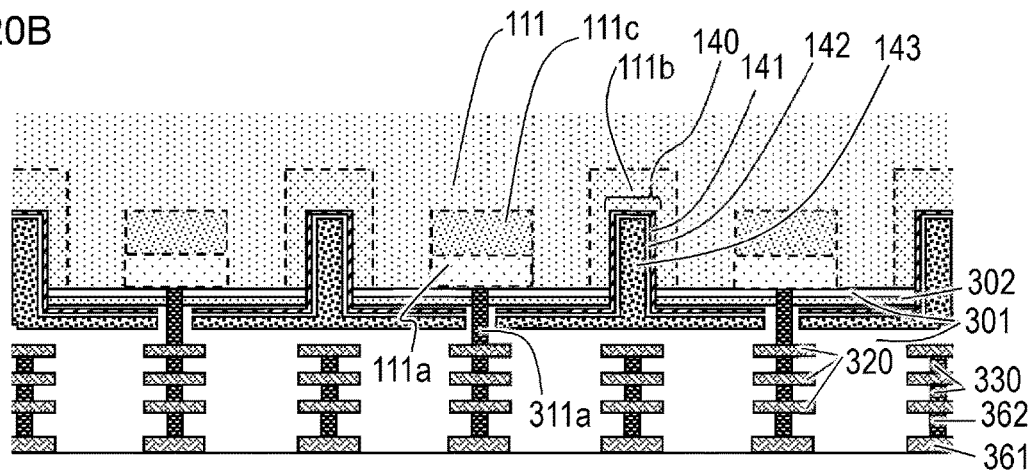
Figure 21A:
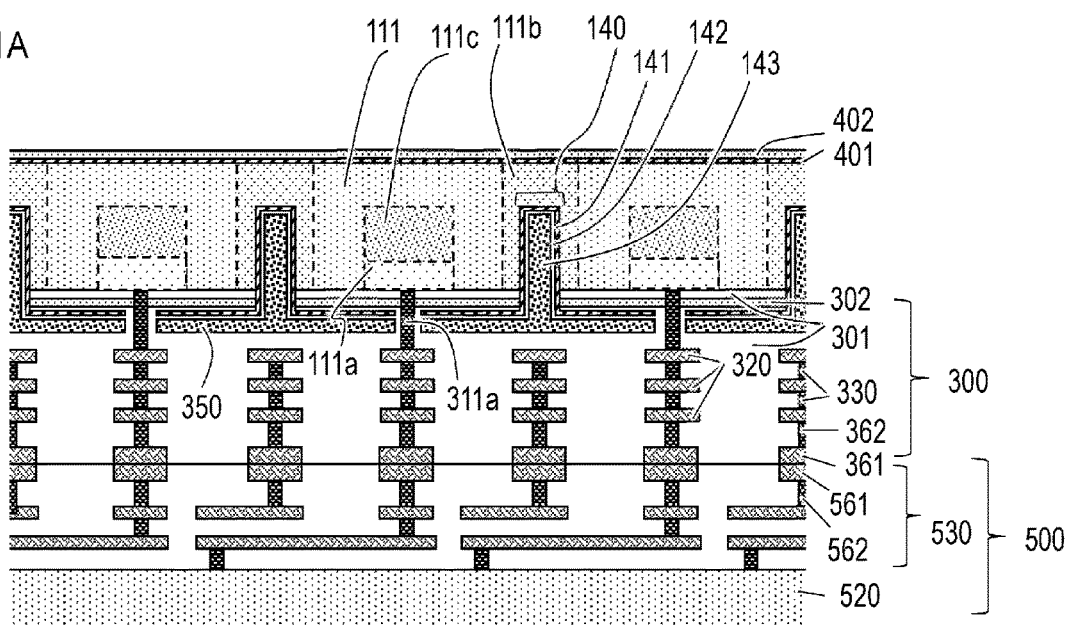
FIGS. 21A and 21B are diagrams illustrating the manufacturing method of the photoelectric conversion device according to the ninth embodiment.
Figure 21B:
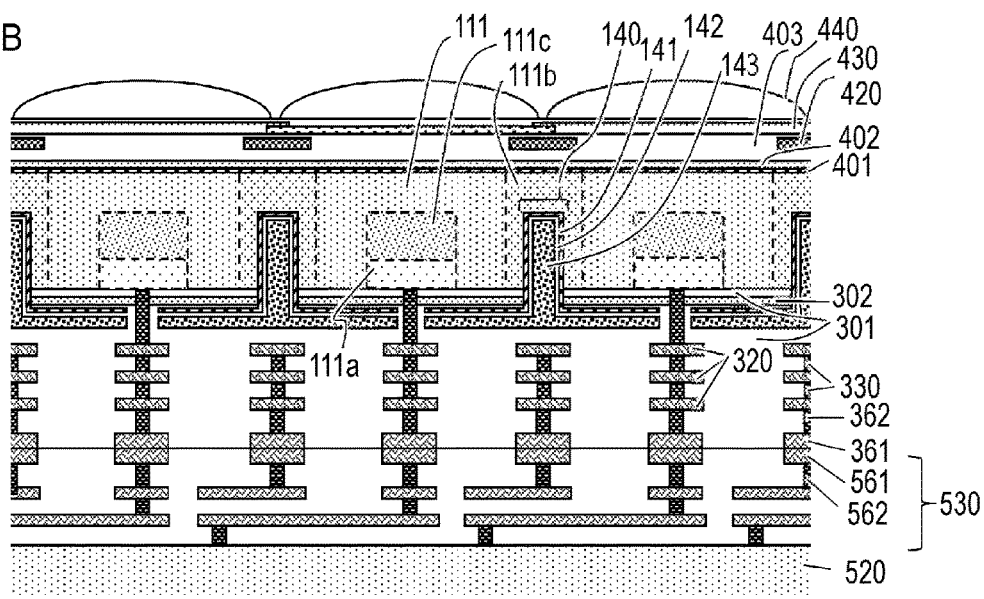

FIGS. 20A and 20B represent steps through which the wiring layer 300 is formed on the semiconductor layer 200. FIGS. 21A and 21B represent steps in which the semiconductor layer 520 and the semiconductor layer 200 are stacked and the semiconductor layer 200 is used as a supporting substrate. It should be noted that a supporting substrate such as a glass substrate may be used in place of the semiconductor layer 520.

(1) As shown in FIG. 20A, the trench 140 is formed by etching with respect to the member shown in FIG. 18A. In addition, the stationary electrode film 141, the insulating film 142, and the embedded material 143 are embedded inside the trench 140. Subsequently, after performing photolithography, the surface is removed up to the stationary electrode film 141 by etching. In this process, unlike in the eighth embodiment, surface removal cannot be performed by CMP polishing.

In this process, unlike in the eighth embodiment, since an area of the metal compound or metal to be etched is reduced (for example, to only a periphery of the contact plug 311), a sublimate in which an etching gas and metal are compounded can be reduced. Therefore, a decline in yield due to an increased operating rate of the photoelectric conversion device 010 or adhesion of a sublimate to a wafer can be more readily suppressed. In addition, another advantage is that machining of the embedded material 143 of the trench 140 and the light-shielding plate 350 can be performed simultaneously and machining cost can be reduced.

(2) As shown in FIG. 20B, the wiring layer 300 from the contact plug 311 to the joining metal 361 is formed by repeating processes such as film formation, photolithography, and etching.

(3) As shown in FIG. 21A, the second chip 500 prepared in advance and the wiring layer 300 are connected to each other so that the wiring layer 300 and the wiring layer 530 are joined to each other. A rear surface of the semiconductor layer 200 is then polished and thinned. Subsequently, the stationary electrode film 401 and the optical thin film 402 are formed on the rear surface of the semiconductor layer 200. A portion joined by the insulating film 301 and a portion metallically joined by the joining metal 361 and the joining metal 561 are present in the joint between the wiring layer 530 and the wiring layer 300.

(4) As shown in FIG. 21B, due to the same kind of machining as was performed when forming the wiring layer 300, the reflective plate 420 is formed inside the insulating film 403. Subsequently, the color filter 430 and the lens 440 are patterned.

The process flow described above enables the photoelectric conversion device 010 according to the second modification (FIG. 6) to be manufactured.

Tenth Embodiment

In a tenth embodiment, a manufacturing method (a process flow) of the photoelectric conversion device 010 according to the seventh embodiment (FIG. 16) will be explained. The tenth embodiment will be explained with reference to FIGS. 22A to 23B.

FIGS. 22A and 22B represent steps through which the wiring layer 300 is formed on the semiconductor layer 200. FIGS. 23A and 23B represent steps in which the semiconductor layer 520 and the semiconductor layer 200 are stacked and the semiconductor layer 200 is used as a supporting substrate. It should be noted that a supporting substrate such as a glass substrate may be used in place of the semiconductor layer 520.

(1) As shown in FIG. 22A, with respect to the member shown in FIG. 18A, the wiring layer 300 from the contact plug 311 to the joining metal 361 is formed by repeating processes such as film formation, photolithography, and etching.

(2) As shown in FIG. 22B, the second chip 500 prepared in advance and the wiring layer 300 are connected to each other so that the wiring layer 300 and the wiring layer 530 are joined to each other. A rear surface of the semiconductor layer 200 is then polished and thinned. A portion joined by the insulating film 301 and a portion metallically joined by the joining metal 361 and the joining metal 561 are present in the joint between the wiring layer 530 and the wiring layer 300.

(3) As shown in FIG. 23A, the trench 140 is formed by etching. In addition, inside the trench 140, embedding of the stationary electrode film 141, formation of the optical thin film 402, embedding of the insulating film 142, and embedding of the embedded material 143 are performed. Subsequently, due to any of photolithography and etching, etchback, and CMP polishing, an opening corresponding to just a light beam path of incident light is formed in the embedded material 143 on the rear surface 202 of the semiconductor layer 200.

In the step of forming the trench 140, after etching the semiconductor layer 200, the optical thin film 302 is used as an etching-stop material. Accordingly, variability in etching depth can be suppressed and the trench 140 with uniform depth can be formed.

The stationary electrode film 401 on the rear surface 202 is formed at the same time as embedding the stationary electrode film 141 with respect to the trench 140. In addition, since formation of the optical thin film 402 is anisotropic film formation, the optical thin film 402 is hardly embedded into the trench 140. Furthermore, the insulating film 403 on the rear surface 202 is formed at the same time as embedding the insulating film 142. Since the formation is anisotropic film formation, the insulating film 403 on the side of the rear surface 202 is formed thicker than the insulating film 142. In addition, while the embedded material 143 is also formed on the rear surface 202 at the same time as embedding the embedded material 143, the embedded material 143 on the rear surface 202 is removed by photolithography and etching, etch-back, or CMP polishing. In this manner, in the embedding step, efficiency of formation of a structure can be improved by drawing upon the strengths of anisotropic and isotropic film formation.

(4) As shown in FIG. 23B, due to the same kind of machining as was performed when forming the wiring layer 300, the reflective plate 420 is formed inside the insulating film 403. Subsequently, the color filter 430 and the lens 440 are patterned.

When adopting photolithography and etching when machining as shown in FIG. 23A, the structure of the reflective plate 420 can also be formed by photolithography and etching. In this case, a separate step for forming the reflective plate 420 can be eliminated.

The process flow described above enables the photoelectric conversion device 010 according to the seventh embodiment (FIG. 16) to be manufactured.

Eleventh Embodiment

Figure 24:
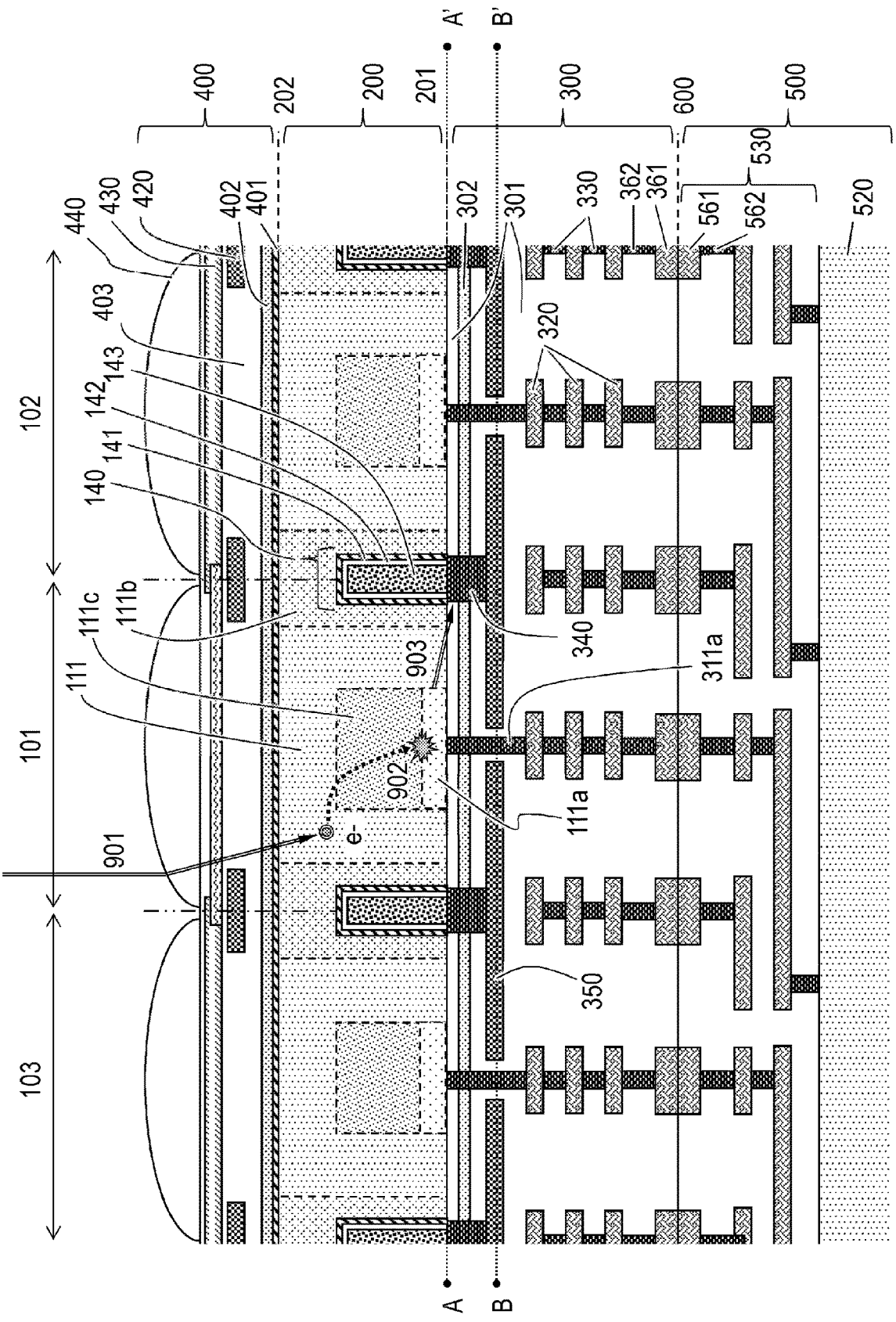
FIG. 24 is a sectional view of a photoelectric conversion device according to an eleventh embodiment.

The photoelectric conversion device 010 according to an eleventh embodiment will be explained. FIG. 24 is a sectional view of the photoelectric conversion device 010 according to the eleventh embodiment.

In the eleventh embodiment, a light-shielding wall 340 is arranged on the wiring layer 300 so as to fill in the space between the trench 140 and the light-shielding plate 350 in a sectional view. A width of the light-shielding wall 340 is the same as or smaller than a width of the trench 140. In addition, the light-shielding wall 340 is arranged on the inside of the trench 140 in a plan view.

The light-shielding wall 340 is a member that contains a metal (tungsten, titanium, tantalum, aluminum, gold, silver, copper, platinum, or the like) or/and a metal compound. Alternatively, while polysilicon, silicon, or a cavity can also be selected as the light-shielding wall 340, another member can also be used. The light-shielding wall 340 can also be made of the same member as the trench 140.

FIG. 26 is a plan view along the line segment A-A' of the photoelectric conversion device 010 shown in FIG. 24. In FIG. 26, the trench 140 is arranged in a grid pattern in a boundary portion between two adjacent pixels. In addition, in the boundary portion between pixels, the light-shielding wall 340 with a circular shape is arranged at a position of each opposite side of a pixel. In other words, the light-shielding wall 340 is arranged on a virtual line connecting two APDs that are consecutive in the row direction or the column direction. Furthermore, the light-shielding wall 340 may be arranged in center portions between two pixels that are consecutive in the row direction or the column direction.

A shape of the light-shielding wall 340 in a plan view is not limited to a circular shape. The shape of the light-shielding wall 340 may be an elliptical shape, a rectangular shape, or a curved shape. Alternatively, the shape of the light-shielding wall 340 may be a composite shape containing a mixture of characteristics of these shapes. The shape of the light-shielding wall 340 can also be selected in a same manner in the subsequent embodiments. For example, when forming the trench 140 as shown in FIG. 18B, after an opening for forming the light-shielding wall 340 is formed, the light-shielding wall 340 is formed by filling the opening with at least any of metal and a metal compound. Subsequently, the trench 140 is formed in an upper part of the light-shielding wall 340.

Seventh Modification

Figure 25:
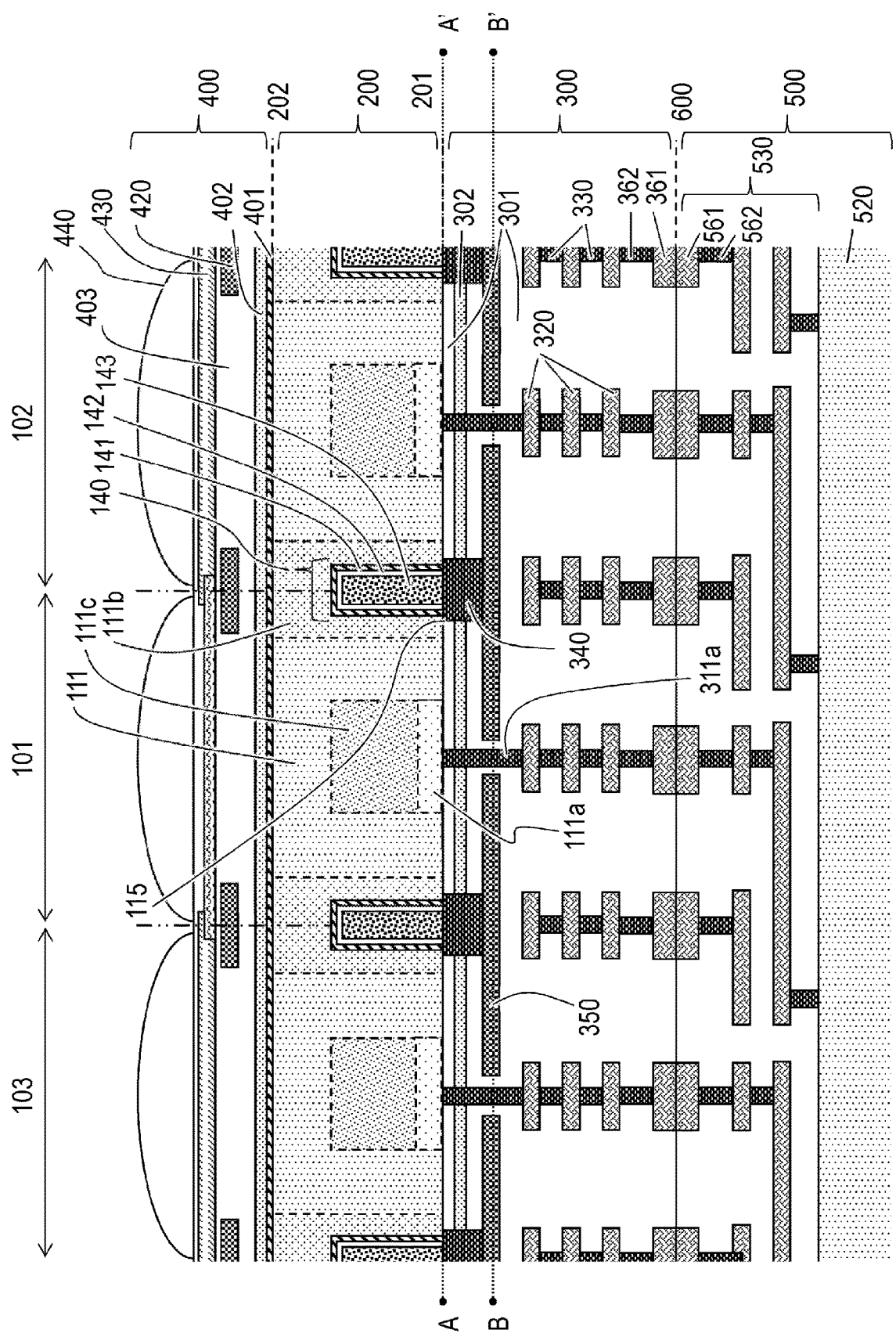
FIG. 25 is a sectional view of a photoelectric conversion device according to a seventh modification.

The photoelectric conversion device 010 according to a seventh modification which is a modification of the eleventh embodiment will be explained. FIG. 25 is a sectional view of the photoelectric conversion device 010 according to the seventh modification.

In the seventh modification, unlike in the eleventh embodiment (FIG. 24), the width of the light-shielding wall 340 is wider (longer) than the width of the trench 140 on a virtual line connecting two APDs. In other words, in a plan view, an interval (distance) between the light-shielding wall 340 and a center position of a pixel is shorter than an interval (distance) between the trench 140 and a center position of a pixel. Therefore, in a plan view, the trench 140 is arranged on the inside of the light-shielding wall 340. In addition, a portion 115 where the light-shielding wall 340 is in contact with the P-type semiconductor region 111b is present at an interface of the front surface 201 of the semiconductor layer 200.

When using the photoelectric conversion device 010 according to the seventh modification, if the light-shielding wall 340 is metal or a metal compound, a charge is exchanged between the P-type semiconductor of the pixel 101 and the P-type semiconductor of the pixel 102 and an effect of making a potential of the P-type semiconductor layer between the pixels uniform is produced. Hereinafter, when the eleventh embodiment and the seventh modification need not be distinguished from each other, the eleventh embodiment and the seventh modification will be simply described as the eleventh embodiment.

Advantageous Effects of Eleventh Embodiment and Seventh Modification

Hereinafter, advantageous effects of the eleventh embodiment and the seventh modification will be explained. In the eleventh embodiment, generation of an unintentional electric signal in a pixel can be suppressed. This is due to the fact that, as shown in FIG. 24, the light-shielding wall 340 which extends from the front surface 201 of the semiconductor layer 200 to the wiring layer 300 shields light passing through the light beam path 903.

Figures 27A, 27B:
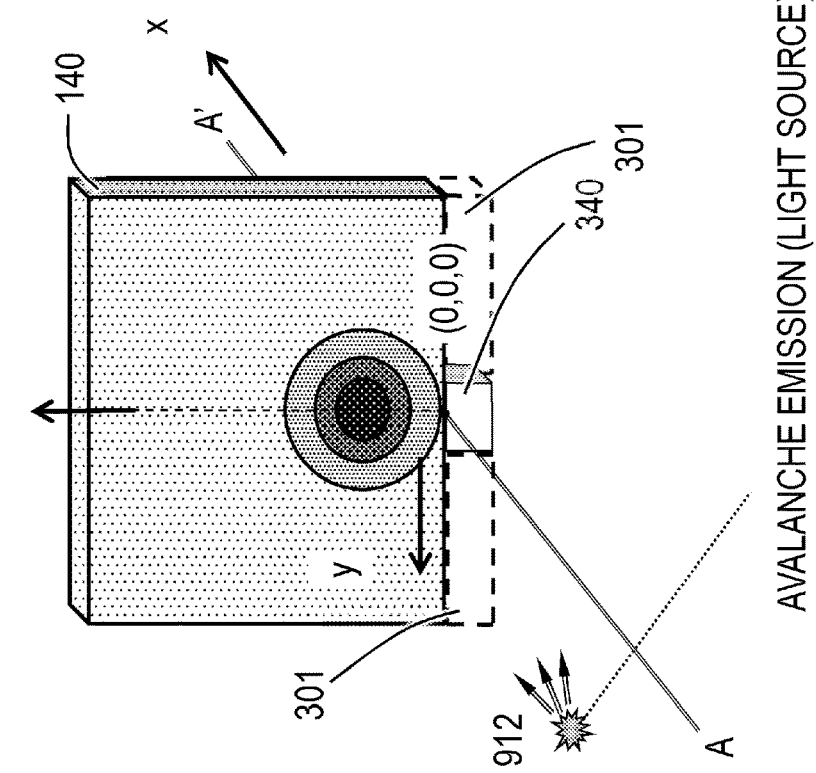
FIGS. 27A and 27B are diagrams illustrating an effect of the photoelectric conversion device according to the eleventh embodiment.

FIG. 27A shows a model for explaining this shielding effect. In order to simplify the model, the light-shielding wall 340 is given a rectangular shape (wall shape) instead of a circular shape.

In FIG. 27A, a transverse direction (an A-A' direction) in the photoelectric conversion device according to FIGS. 24 and 4 (comparative example) is assumed to be an X axis, a depth direction is assumed to be a Y axis, and a longitudinal direction (an up-down direction) is assumed to be a Z axis. An origin of the model shown in FIG. 27A is at a position where the trench 140 is arranged in a boundary portion between the semiconductor layer 200 and the wiring layer 300. While the light-shielding wall 340 is present in the photoelectric conversion device 010 shown in FIG. 24, the light-shielding wall 340 is absent from the photoelectric conversion device shown in FIG. 4. Light is generated from the light source 912 of avalanche emission and the trench 140, the light-shielding wall 340, and the insulating film 301 are irradiated with the light.

FIG. 27A plots an irradiated light amount in which light from the light source 912 of avalanche emission strikes each portion. Since intensity of light is inversely proportional to distance squared, a light amount is strongest at locations nearest to the light source 912 (a region with a darkest shade in FIG. 27A) and, the farther away therefrom, the lower the light amount.

FIG. 27B is a table that quantifies an irradiated light amount of the trench 140 and the light-shielding wall 340 and a total irradiated light amount (amount of shielded light) by which the trench 140, the light-shielding wall 340, and the insulating film 301 are irradiated has been standardized as 100%. There is a range in numerical values because the numerical value changes when assumptions such as a pixel size, a light source position, a trench height, and the like change. The present model also ignores various parameters including optical physical properties (refractive index, reflectance, light-shielding rate, and absorption rate) of each member for the sake of brevity.

As in the comparative example (FIG. 4), when only the trench 140 is arranged and the light-shielding wall 340 is not arranged, 88 to 93% of light is shielded and the remaining 7 to 12% is not shielded. When the light-shielding wall 340 is arranged as shown in FIG. 24, a further 2 to 4% can be shielded. Therefore, in the eleventh embodiment, an advantageous effect of reducing avalanche crosstalk by a few percent more than the comparative example (FIG. 4) is created.

In addition, since light intensity is highest at an opposite side position that is closest to the light source 912 (a position close to the center of a pixel), arranging the light-shielding wall 340 at a position of an opposite side of a pixel as shown in FIG. 26 increases light-shielding efficiency. On the other hand, arranging the light-shielding wall 340 at a diagonal position of a pixel reduces light-shielding efficiency since the light source 912 is separated from the light-shielding wall 340.

Furthermore, in the seventh modification, since a thickness of the light-shielding wall 340 in the X axis direction increases, intensity of transmitted light of the light-shielding wall 340 declines and an effect of reducing avalanche crosstalk increases.

Eighth Modification

Figure 28A:
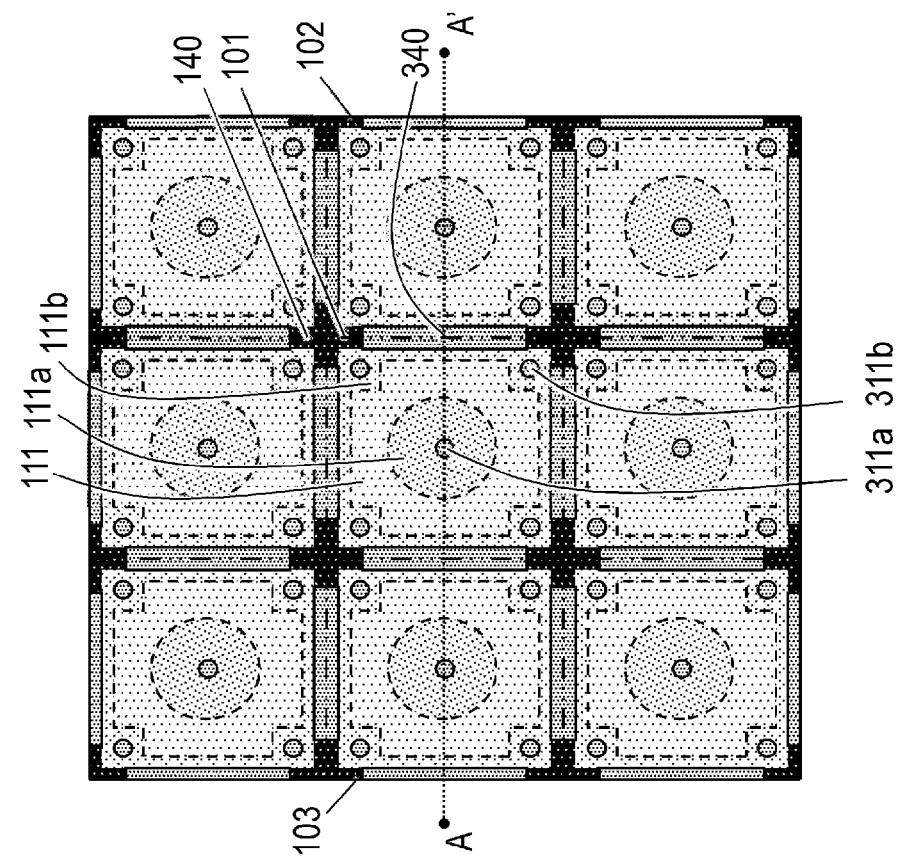
FIG. 28A is a plan view of a photoelectric conversion device according to an eighth modification.

A plan view along the line segment A-A' of the photoelectric conversion device 010 according to the eleventh embodiment may be configured as shown in FIG. 28A. In other words, compared to the eleventh embodiment, the photoelectric conversion device 010 according to an eighth modification has an increased number of light-shielding walls 340 arranged at positions of opposite sides of pixels. Specifically, while one light-shielding wall 340 is arranged on each side in the eleventh embodiment, a plurality of light-shielding walls 340 are arranged on each side in the eighth modification. Accordingly, since a light-shielding area in the photoelectric conversion device 010 as a whole increases, an effect of reducing avalanche crosstalk also increases.

Ninth Modification

Figure 28B:
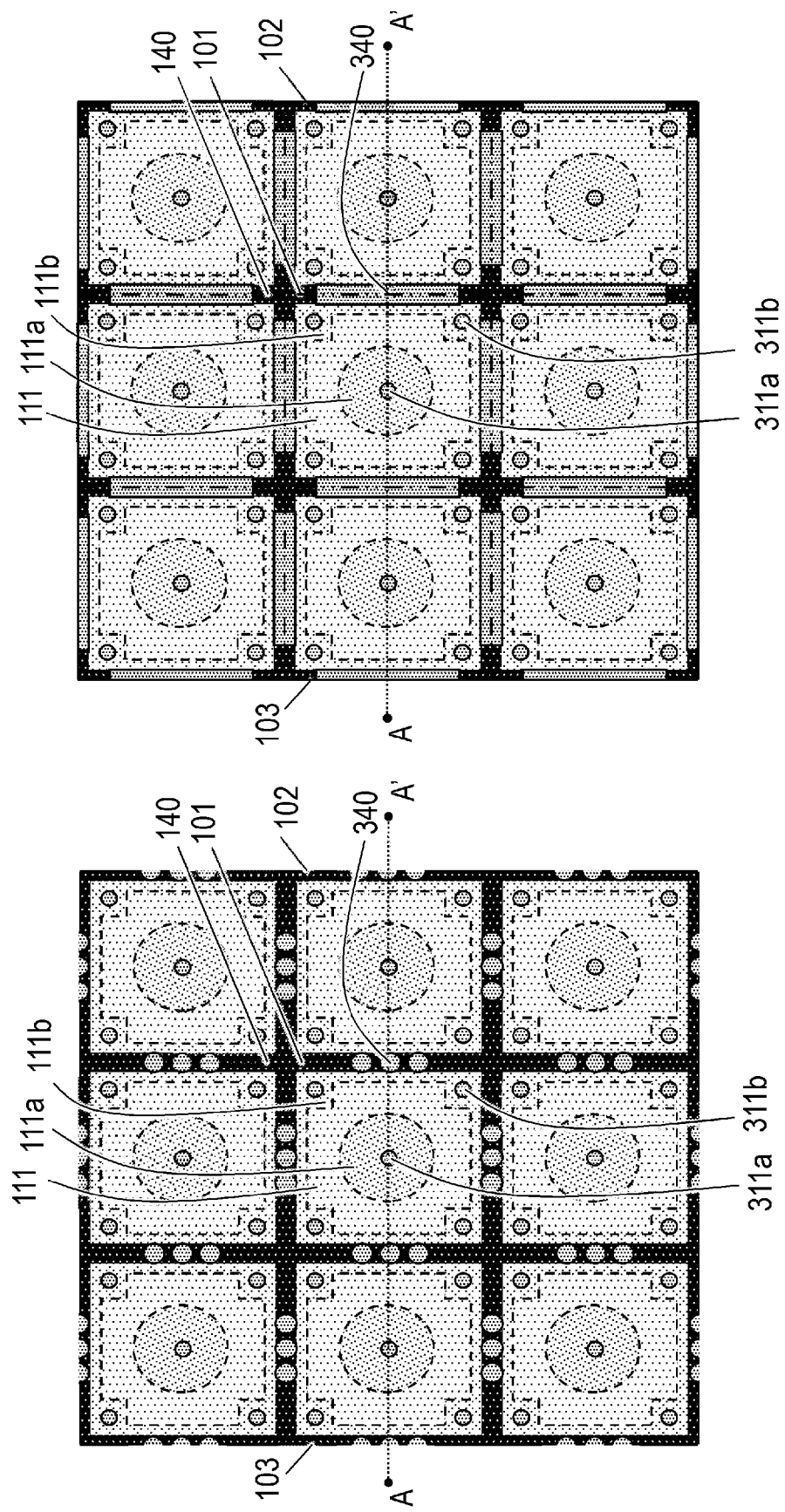
FIG. 28B is a plan view of a photoelectric conversion device according to a ninth modification.

The plan view along the line segment A-A' of the photoelectric conversion device 010 according to the eleventh embodiment may be configured as shown in FIG. 28B. In other words, compared to the eleventh embodiment, the photoelectric conversion device 010 according to a ninth modification has a longer length of the light-shielding wall 340 in a direction along each side of a pixel. Accordingly, since a light-shielding area in the photoelectric conversion device 010 as a whole increases, an effect of reducing avalanche crosstalk also increases.

Tenth Modification

Figure 29B:
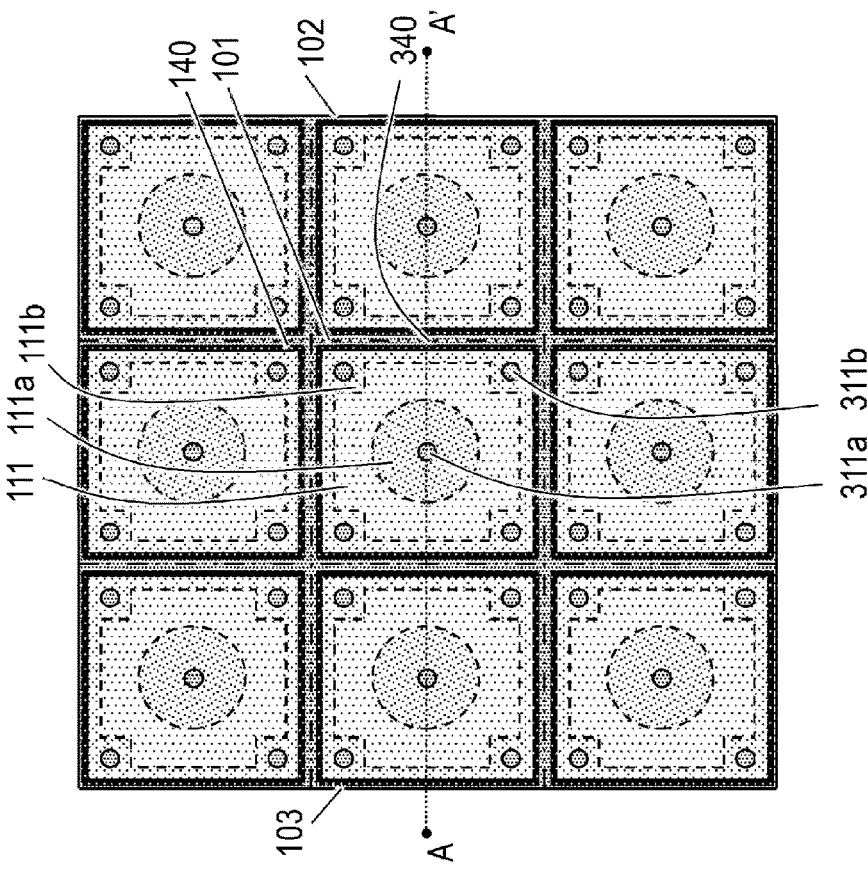
FIG. 29B is a plan view of a photoelectric conversion device according to an eleventh modification.
Figure 29A:
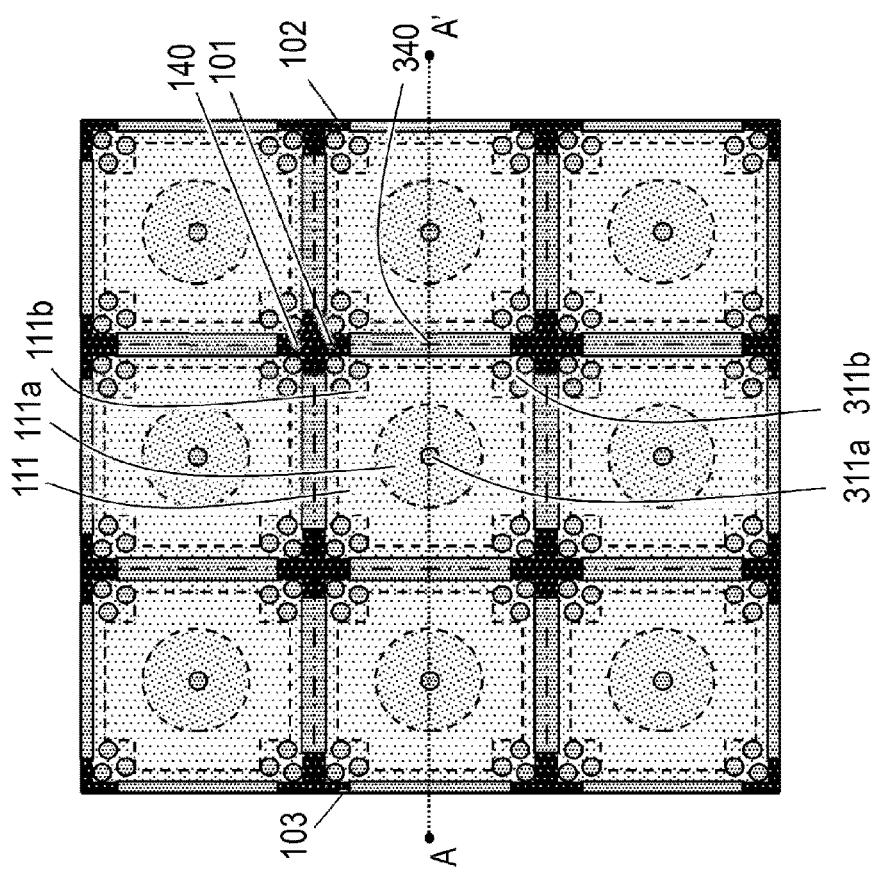
FIG. 29A is a plan view of a photoelectric conversion device according to a tenth modification.

A plan view along the line segment A-A' of the photoelectric conversion device 010 according to the eleventh embodiment may be configured as shown in FIG. 29A. In other words, compared to the eleventh embodiment, in addition to the length of the light-shielding wall 340 in a direction along each side of a pixel being longer, the photoelectric conversion device 010 according to a tenth modification has an increased number of anode contact plugs 311b arranged at diagonal positions. Accordingly, avalanche crosstalk in the diagonal direction is reduced by anode contact plugs 311b while avalanche crosstalk in the opposite side direction is reduced by the light-shielding wall 340. Accordingly, an effect of reducing avalanche crosstalk increases in the photoelectric conversion device 010 as a whole. In addition, by increasing the number of anode contact plugs 311b, an effect of stabilizing anode potentials also increases.

Eleventh Modification

The plan view along the line segment A-A' of the photoelectric conversion device 010 according to the eleventh embodiment may be configured as shown in FIG. 29B. Unlike in the eleventh embodiment, in the photoelectric conversion device 010 according to an eleventh modification, the light-shielding wall 340 is arranged in a grid pattern along each side of a pixel so as to surround the pixel. Therefore, in the eleventh modification, an effect of reducing avalanche crosstalk in the opposite side direction and the diagonal direction is increased as compared to the eleventh embodiment. Although the light-shielding wall 340 is narrower than the trench 140 in FIG. 29B, as explained in the seventh modification, the light-shielding wall 340 may be thicker instead.

Twelfth Modification

Figure 30:
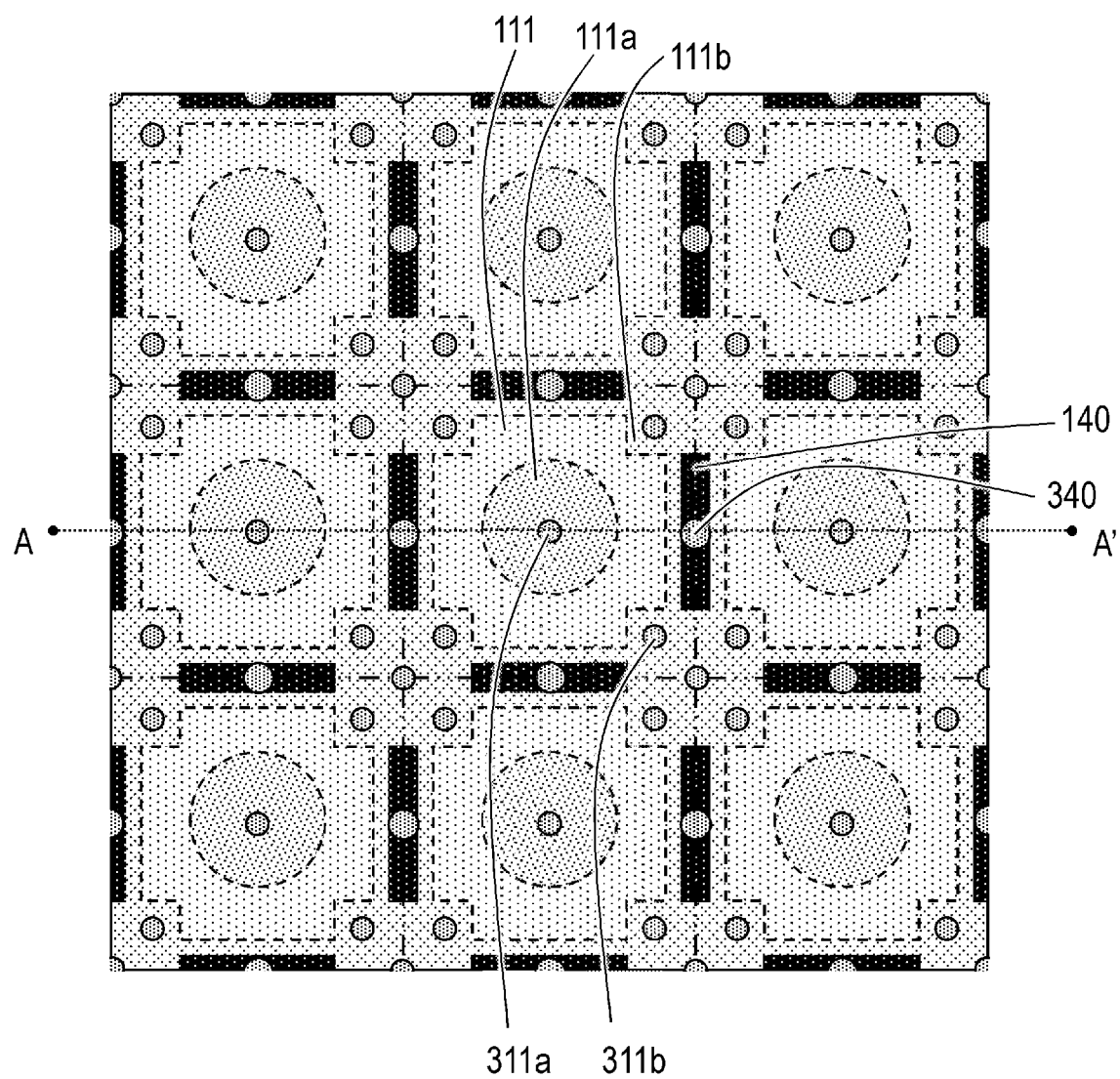
FIG. 30 is a plan view of a photoelectric conversion device according to a twelfth modification.

The plan view along the line segment A-A' of the photoelectric conversion device 010 according to the eleventh embodiment may be configured as shown in FIG. 30. Unlike in the eleventh embodiment, in the photoelectric conversion device 010 according to a twelfth modification, the trench 140 is not formed in a diagonal portion of a pixel. Since the P-type semiconductor region 111b remains in a location where the trench 140 is not formed, spaces where the anode contact plug 311b can be arranged have increased. Therefore, if a larger number of anode contact plugs 311b are arranged in diagonal portions, an effect of reducing avalanche crosstalk in the diagonal direction increases. In addition, by increasing the number of anode contact plugs 311b, an effect of stabilizing anode potentials also increases.

Twelfth Embodiment

Figure 31:
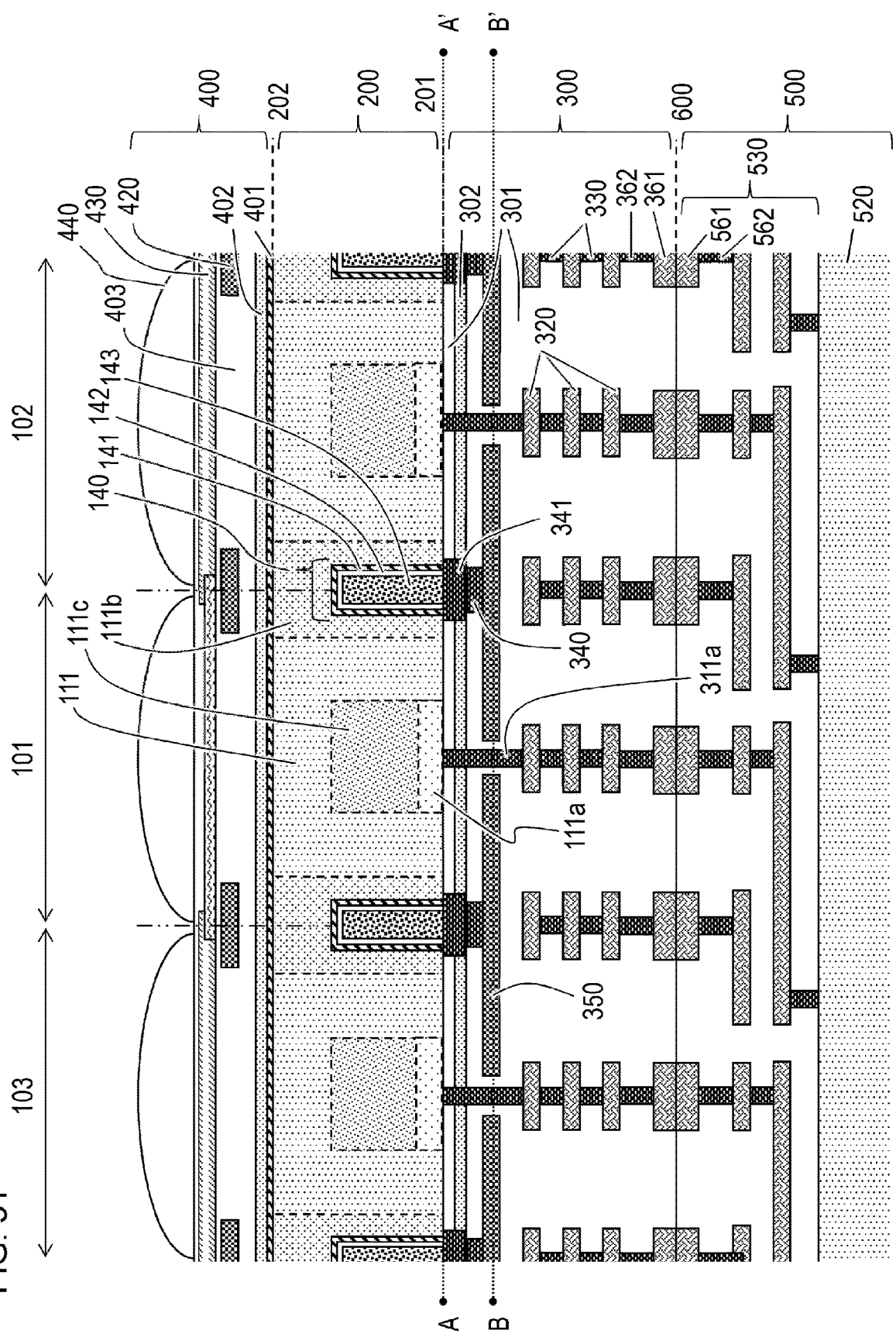
FIG. 31 is a sectional view of a photoelectric conversion device according to a twelfth embodiment.

The photoelectric conversion device 010 according to a twelfth embodiment will be explained. FIG. 31 is a sectional view of the photoelectric conversion device 010 according to the twelfth embodiment. Unlike the eleventh embodiment, the photoelectric conversion device 010 according to the twelfth embodiment has a plurality of light-shielding walls (the light-shielding wall 340 and a light-shielding wall 341) which overlap each other in the vertical direction. In this case, a distance between the light-shielding wall 340 and the semiconductor layer 200 is longer than a distance between the light-shielding wall 341 and the semiconductor layer 200.

The light-shielding wall 340 and the light-shielding wall 341 are members that contain a metal (tungsten, titanium, tantalum, aluminum, gold, silver, copper, platinum, or the like) or/and a metal compound. Alternatively, while it is assumed that polysilicon, silicon, or a cavity can also be selected as the light-shielding wall 340 and the light-shielding wall 341, other members can also be used. All of the light-shielding wall 340, the light-shielding wall 341, and the trench 140 can also be made of the same member.

In FIG. 31, the light-shielding wall 341 is made thicker (a width thereof is increased) in order to increase a light-shielding effect in a portion which is near the semiconductor layer 200 and which has high light intensity. Selectively using a plurality of light-shielding walls as in the present embodiment enables each light-shielding wall to be formed together with other constituent elements. Therefore, an optimal configuration which takes a light-shielding effect and ease of manufacture into consideration can be achieved.

Thirteenth Embodiment

Figure 32:
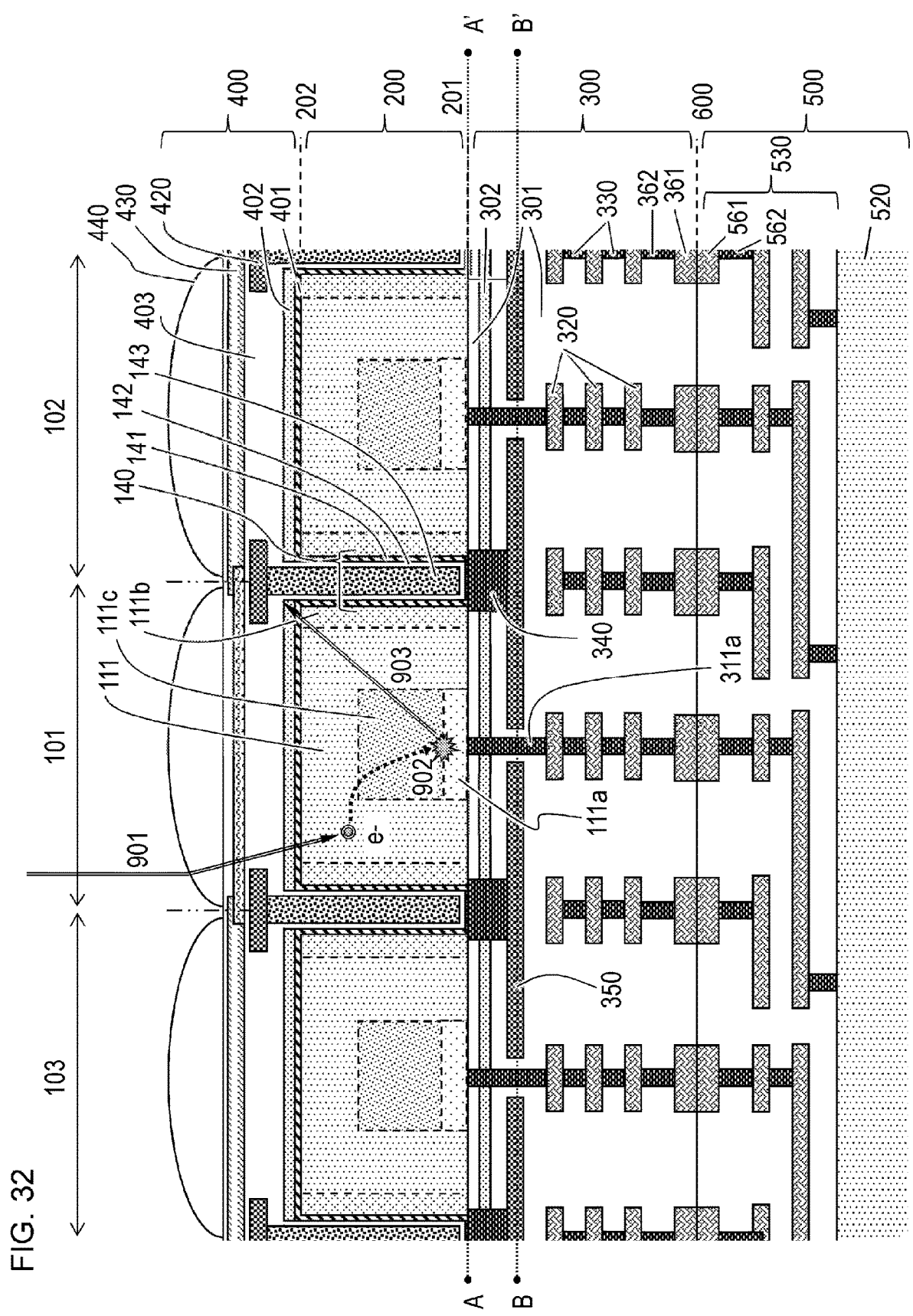
FIG. 32 is a sectional view of a photoelectric conversion device according to a thirteenth embodiment.

The photoelectric conversion device 010 according to a thirteenth embodiment will be explained. FIG. 32 is a sectional view of the photoelectric conversion device 010 according to the thirteenth embodiment. Unlike in the eleventh embodiment, in the photoelectric conversion device 010 according to the thirteenth embodiment, the trench 140 reaches the rear surface 202 of the semiconductor layer 200 in a sectional view (FIG. 32) and the trench 140 (the embedded material 143) extends inside the optical layer 400.

In the thirteenth embodiment, an effect of shielding avalanche light is produced at locations to which the trench 140 extends. In the thirteenth embodiment, the embedded material 143 and the reflective plate 420 are connected to (in contact with) each other. The embedded material 143 is a member that contains a metal (tungsten, titanium, tantalum, aluminum, gold, silver, copper, or platinum) or/and a metal compound. While it is further assumed that polysilicon, silicon, an organic compound, or a cavity can also be selected as the embedded material 143, other members can also be used. The embedded material 143 and the reflective plate 420 can also be formed of a same member. In addition, the embedded material 143 and the reflective plate 420 can also be formed simultaneously.

The stationary electrode film 141 and the stationary electrode film 401 are connected to each other. In a similar manner, the insulating film 142 and the insulating film 403 are connected to each other.

Fourteenth Embodiment

Figure 33:
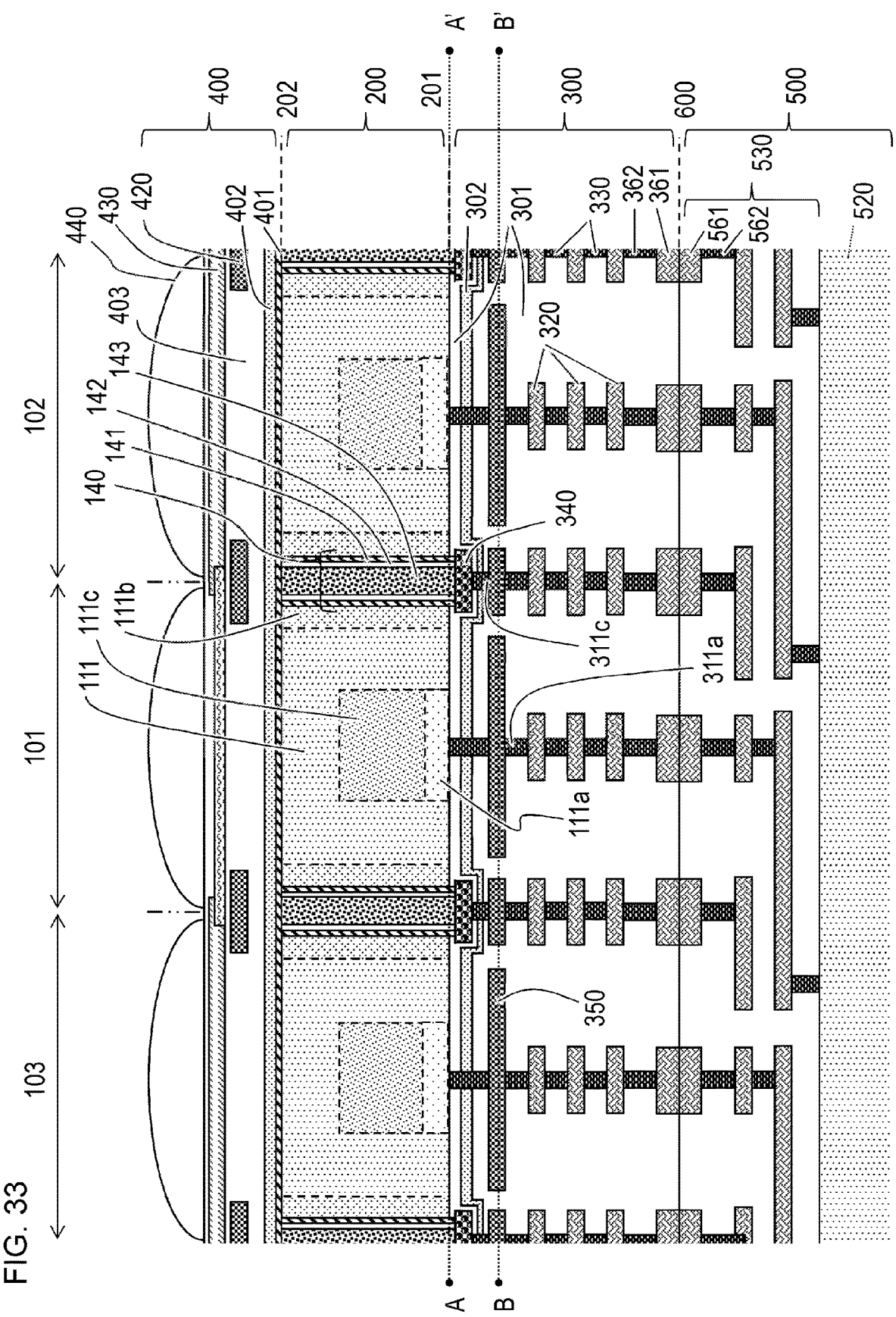
FIG. 33 is a sectional view of a photoelectric conversion device according to a fourteenth embodiment.

The photoelectric conversion device 010 according to a fourteenth embodiment will be explained. FIG. 33 is a sectional view of the photoelectric conversion device 010 according to the fourteenth embodiment.

In the fourteenth embodiment, the trench 140 extends to the inside of the wiring layer 300. In addition, the light-shielding wall 340 and a light-shielding wall 311c (a light-shielding wall that comes into contact with the light-shielding wall 340) are arranged between an end on a side of the wiring layer 300 of the trench 140 and the light-shielding plate 350.

The light-shielding wall 340 and the light-shielding wall 311c are members that contain a metal (tungsten, titanium, tantalum, aluminum, gold, silver, copper, platinum, or the like) or/and a metal compound. Alternatively, while it is assumed that polysilicon, silicon, or a cavity can also be selected as the light-shielding wall 340 and the light-shielding wall 311c, other members can also be used. The light-shielding wall 340 and the light-shielding wall 311c can also be made of the same member as the trench 140.

For example, by adopting polysilicon as the light-shielding wall 340 and a tungsten contact plug as the light-shielding wall 311c, a light-shielding wall with a complex shape which integrates the light-shielding wall 340 and the light-shielding wall 311c can also be made. In this case, the light-shielding wall 340 and the light-shielding wall 311c can also be caused to integrally function as a part of a circuit. Furthermore, in this case, conceivably, the embedded material 143 is desirably made of an insulating material.

Figure 34:
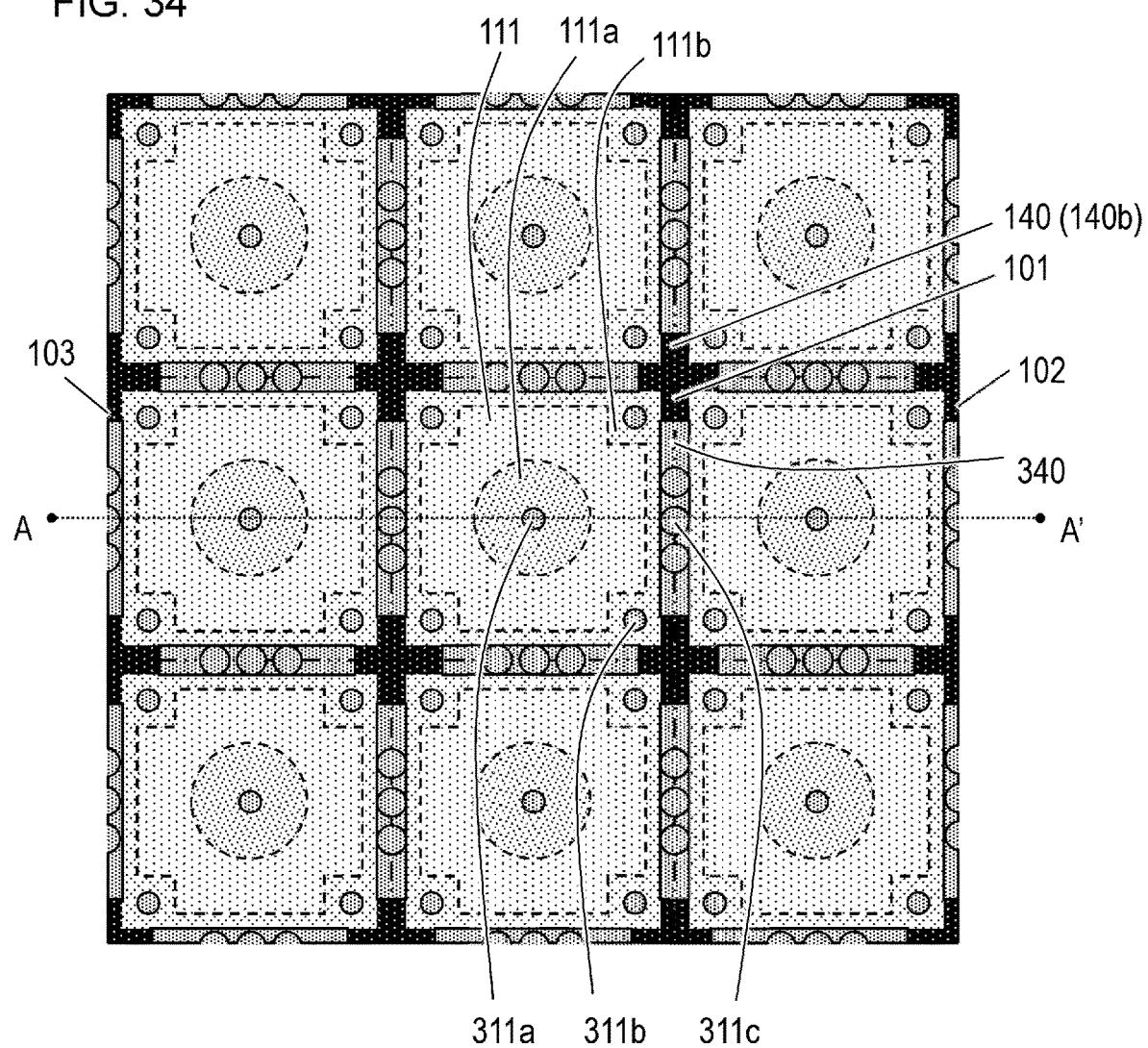
FIG. 34 is a plan view of the photoelectric conversion device according to the fourteenth embodiment.

FIG. 34 is a plan view along the line segment A-A' of the photoelectric conversion device 010 according to the fourteenth embodiment. For the purpose of illustration and brevity, the light-shielding wall 311c which is originally not positioned on the line segment A-A' is also represented in FIG. 34.

In FIG. 34, the trench 140 is arranged in a grid pattern in a boundary portion between pixels. In addition, in an opposite side portion of a pixel (a center portion between pixels) in the boundary portion between pixels, the light-shielding wall 340 with a rectangular shape is arranged. Furthermore, although not on the line segment A-A', in an opposite side portion of a pixel in the boundary portion between pixels, the light-shielding wall 311c with a circular shape is arranged.

In the fourteenth embodiment, an effect of reducing avalanche crosstalk having been explained in the first and eleventh embodiments is produced. It should be noted that the photoelectric conversion device 010 according to the fourteenth embodiment can be manufactured by a process flow in which a trench is machined from the front surface 201 of the semiconductor layer 200 as in the case of the eighth embodiment and the ninth embodiment.

Fifteenth Embodiment

Figure 35:
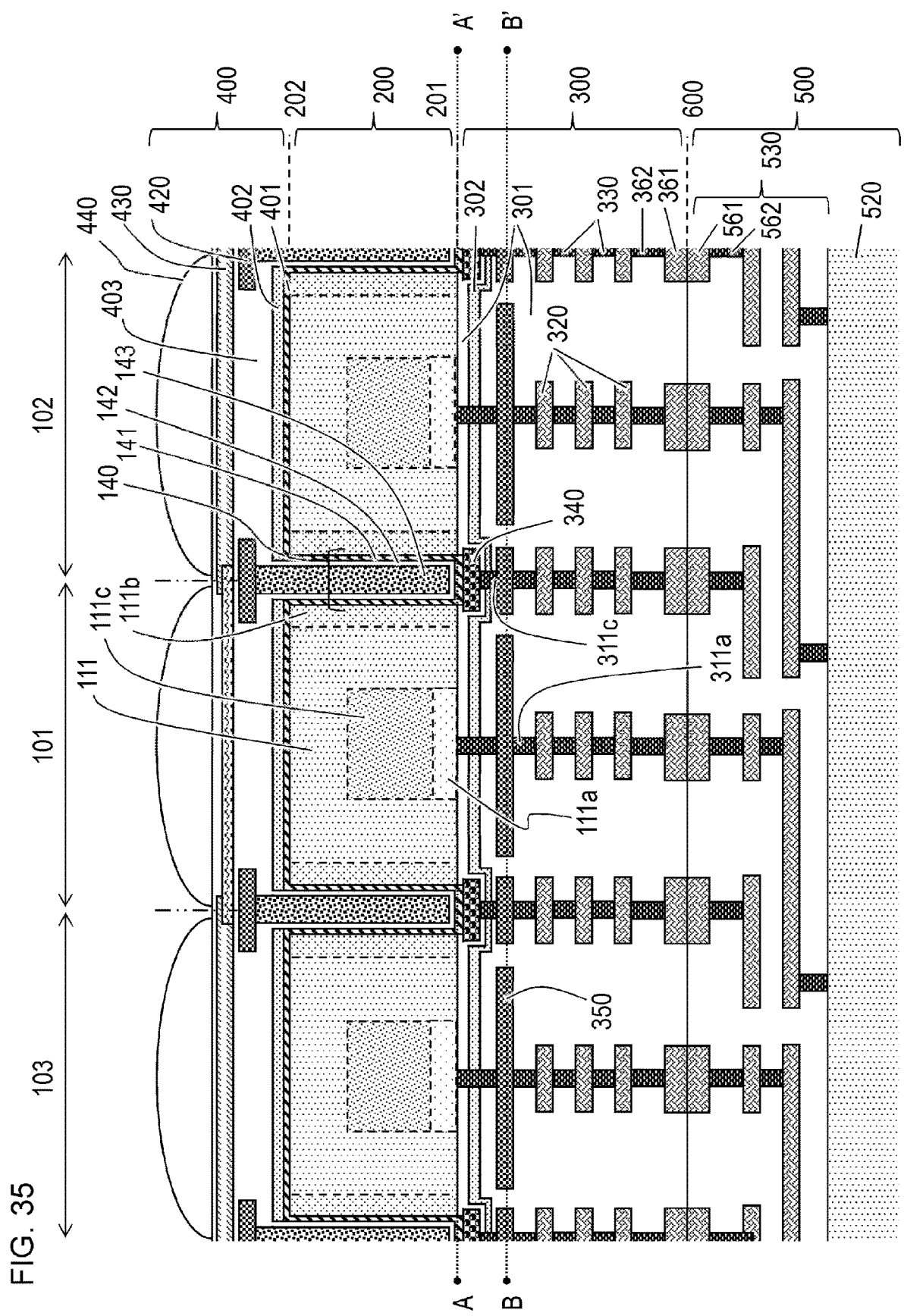
FIG. 35 is a sectional view of a photoelectric conversion device according to a fifteenth embodiment.

The photoelectric conversion device 010 according to a fifteenth embodiment will be explained. FIG. 35 is a sectional view of the photoelectric conversion device 010 according to the fifteenth embodiment. A plan view along the line segment A-A' of the photoelectric conversion device 010 according to the fifteenth embodiment is FIG. 34 which is the same as the fourteenth embodiment. Unlike in the fourteenth embodiment, in the fifteenth embodiment, the embedded material 143 of the trench 140 reaches the optical layer 400 in a sectional view (FIG. 35).

In addition, the embedded material 143 and the reflective plate 420 are connected to each other. In a similar manner, the stationary electrode film 141 and the stationary electrode film 401 are connected to each other. In a similar manner, the insulating film 142 and the insulating film 403 are connected to each other.

It should be noted that the photoelectric conversion device 010 according to the fifteenth embodiment can be manufactured by a process flow in which a trench is machined from the rear surface 202 of the semiconductor layer as in the case of the tenth embodiment.

Sixteenth Embodiment

Figure 36:
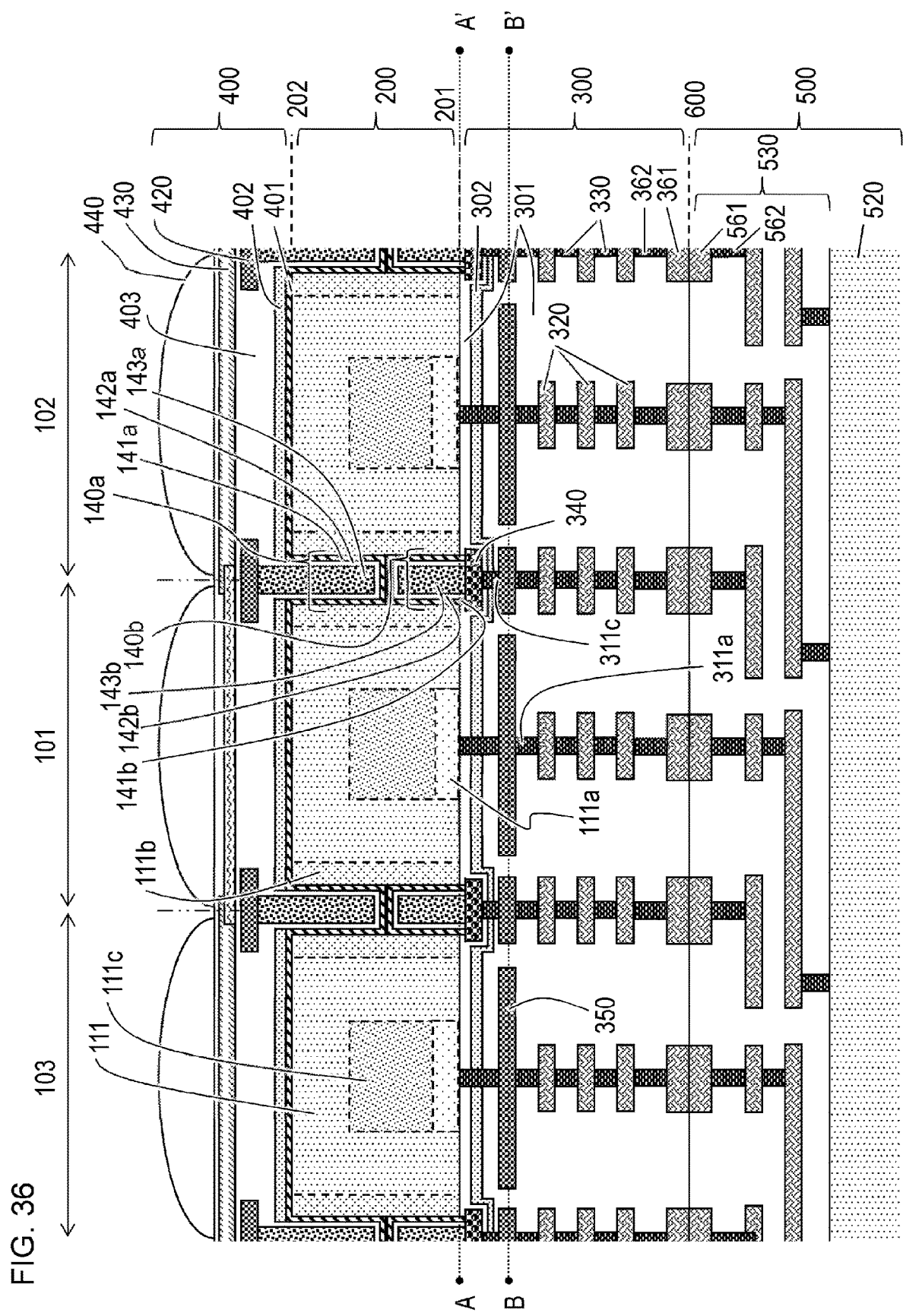
FIG. 36 is a sectional view of a photoelectric conversion device according to a sixteenth embodiment.

The photoelectric conversion device 010 according to a sixteenth embodiment will be explained. FIG. 36 is a sectional view of the photoelectric conversion device 010 according to the sixteenth embodiment. A plan view along the line segment A-A' of the photoelectric conversion device 010 according to the sixteenth embodiment is FIG. 34 which is the same as the fourteenth embodiment. It should be noted that a trench 140a is not denoted in FIG. 34.

Unlike in the fourteenth embodiment, in the sixteenth embodiment, the embedded material 143 of the trench 140 reaches the optical layer 400 in a sectional view (FIG. 36). In addition, inside the trench 140, the embedded material 143 is divided into an embedded material 143a and an embedded material 143b.

In FIG. 36, a trench 140b is formed on the front surface 201 of the semiconductor layer 200. The trench 140b includes a stationary electrode film 141b, an insulating film 142b, and an embedded material 143b. The trench 140b extends to the inside of the wiring layer 300 and is connected to the light-shielding wall 340. In addition, the light-shielding wall 340 is connected to the light-shielding wall 311c. Furthermore, the light-shielding wall 311c is connected to the light-shielding plate 350.

Moreover, the trench 140a is formed on the rear surface 202 of the semiconductor layer 200. The trench 140a includes a stationary electrode film 141a, an insulating film 142a, and an embedded material 143a. The trench 140a extends from the inside of the semiconductor layer 200 to the inside of the optical layer 400 and is connected to the reflective plate 420.

The trench 140a and the trench 140b need not necessarily be connected to each other. In other words, the two trenches may be cross-sectionally or planarly separated from each other. In addition, the trench 140a and the trench 140b may differ from each other in terms of lateral width, depth, and planar layout (not illustrated).

In addition, the embedded material 143a and the reflective plate 420 are connected to each other. In a similar manner, the stationary electrode film 141a and the stationary electrode film 401 are connected to each other. In a similar manner, the insulating film 142a and the insulating film 403 are connected to each other. Furthermore, the embedded material 143b and the light-shielding wall 340 are connected to each other.

The photoelectric conversion device 010 according to the sixteenth embodiment can be manufactured by combining a process flow in which a trench is machined from the front surface 201 of the semiconductor layer 200 as in the case of the eighth and ninth embodiments with a process flow in which a trench is machined from the rear surface 202 of the semiconductor layer 200 as in the case of the tenth embodiment.

When forming a deep trench by etching, there may be cases where a mask does not last or etching gas fails to reach deep locations. Therefore, when the semiconductor layer 200 is thick, it is difficult to form a trench that penetrates the semiconductor layer 200. In this case, trenches can be dug from both the front surface 201 and the rear surface 202 of the semiconductor layer 200 and then connected to each other.

Since the trench 140b is manufactured first and the trench 140a is manufactured later when the trench 140a and the trench 140b are to be connected to each other, the trench 140b is favorably manufactured thicker than the trench 140a from the perspective of avoiding a misstep. In this case, since a wide trench results in reducing an area of a pixel region, the trench 140b is favorably shorter than the trench 140a in the up-down direction (stacking direction).

With respect to avalanche crosstalk, since light intensity increases at a position of a depth at which the trench 140b rather than the trench 140a is arranged, the trench 140b is desirably formed in a grid pattern in a plan view as shown in FIG. 34. On the other hand, while the trench 140a desirably has a similar layout, the trench 140a need only be arranged in a diagonal portion (a diagonal position) of a pixel as described in previous embodiments. In this case, for example, the trench 140a may be arranged in a similar arrangement as the light-shielding wall 340 shown in FIG. 34.

Figure 37:
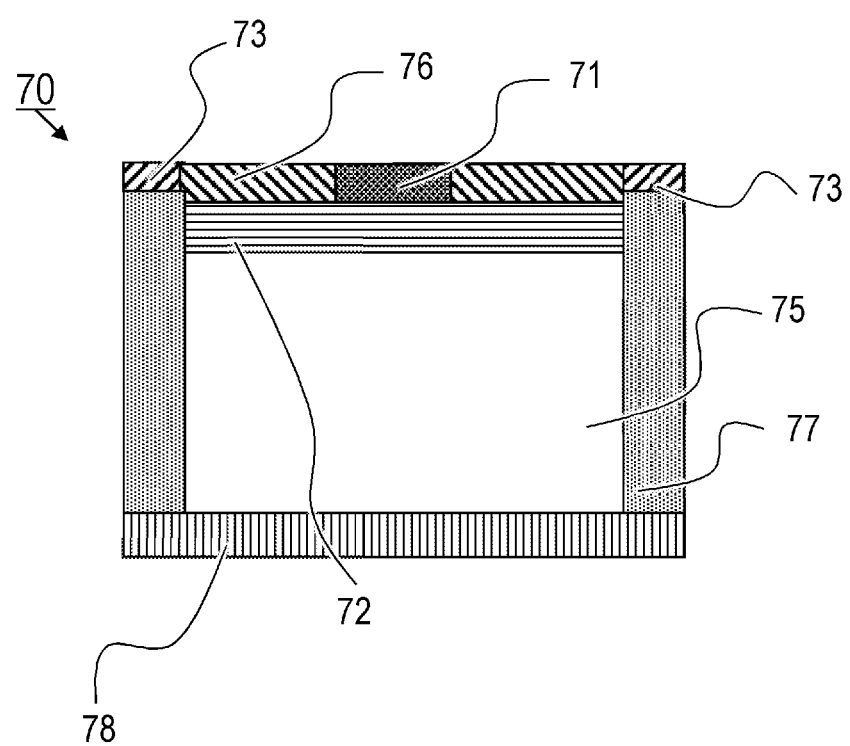
FIG. 37 is a diagram illustrating an example of another semiconductor.

In each embodiment and each modification described above, a pixel in the semiconductor layer 200 has been explained as a simply structured semiconductor constituted of the N-type semiconductor region 111a, the P-type semiconductor region 111b, the P-type semiconductor region 111c, and the P-type semiconductor region 111. However, for example, as shown in FIG. 37, a pixel in the semiconductor layer 200 may be a semiconductor configured so as to be made up of a plurality of N-type semiconductor regions and a plurality of P-type semiconductor regions. In FIG. 37, each pixel has N-type semiconductor regions 71, 75, and 76 and P-type semiconductor regions 72, 73, 77, and 78. The P-type semiconductor region 77 corresponds to the P-type semiconductor region 111b shown in FIG. 1B and forms a separating portion of the pixel. In addition, the P-type semiconductor region 73 (a P-type semiconductor region of which impurity concentration is higher than each of the P-type semiconductor region 77, the P-type semiconductor region 78, and the P-type semiconductor region 72) is arranged in a region to which an anode contact plug is connected. The N-type semiconductor region 71 is a region of which impurity concentration is higher than the N-type semiconductor region 76 and the N-type semiconductor region 75. Accordingly, an electric field of a depletion layer created in the N-type semiconductor region 71 can be strengthened. Furthermore, due to the impurity concentration of the N-type semiconductor region 71 being higher than the impurity concentration of the N-type semiconductor region 76, potential with respect to an electron is substantially lower in a central portion. Therefore, a movement of a charge generated in the N-type semiconductor region 75 to the N-type semiconductor region 71 is facilitated. It should be noted that an N-type semiconductor region may be arranged instead of the P-type semiconductor region 72 between the N-type semiconductor region 71 and the N-type semiconductor region 75. In this case, the N-type semiconductor region is arranged so as to be sandwiched by the P-type semiconductor region 72. Even in this case, a movement of a charge generated in the N-type semiconductor region 75 to the N-type semiconductor region 71 is facilitated.

Seventeenth Embodiment

Figure 38:
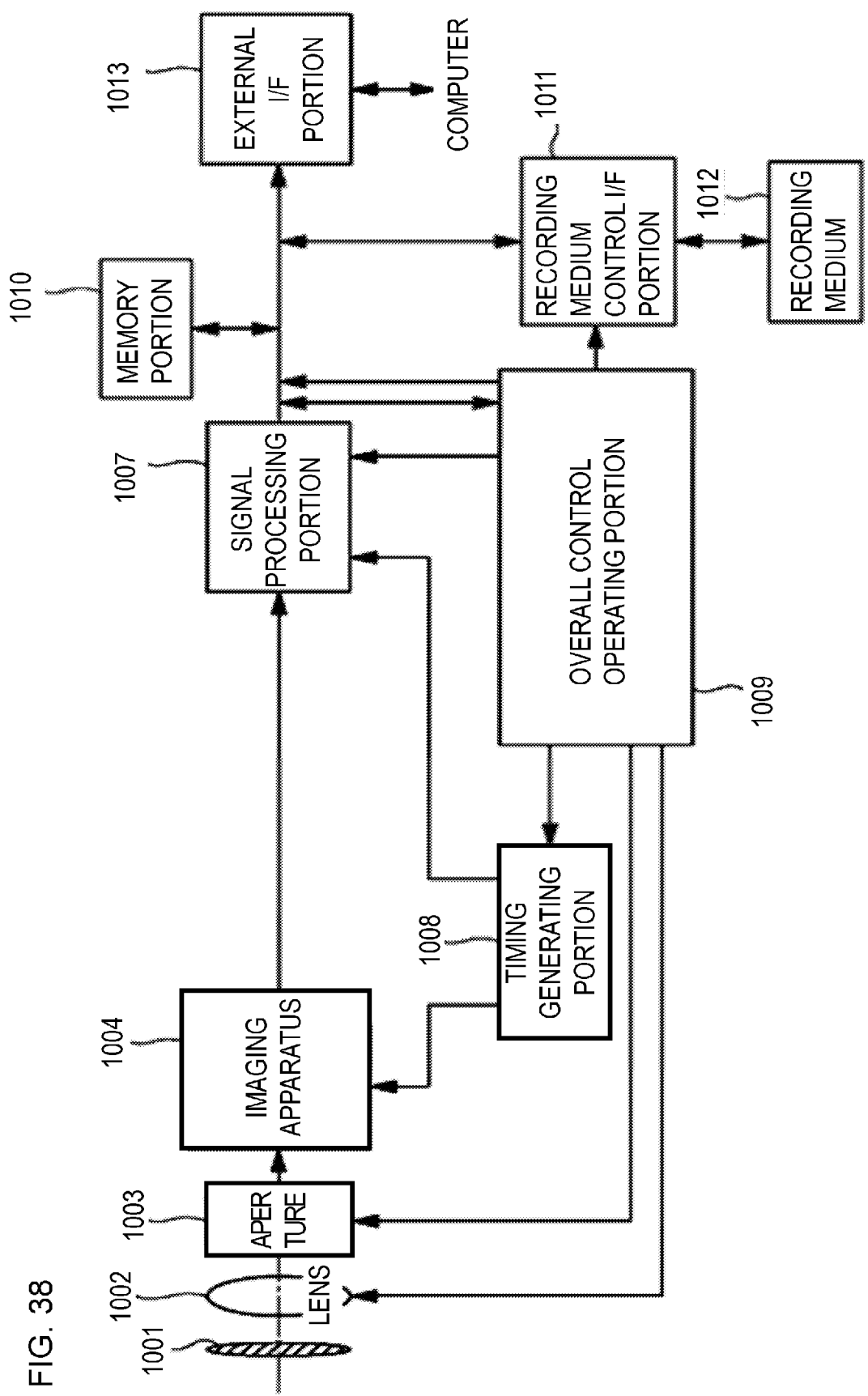
FIG. 38 is a diagram illustrating a photoelectric conversion system according to a seventeenth embodiment.

A photoelectric conversion system according to the present embodiment will be described with reference to FIG. 38. FIG. 38 is a block diagram showing a schematic configuration of the photoelectric conversion system according to the present embodiment.

The photoelectric conversion device 010 (imaging apparatus) described in each embodiment or each modification can be applied to various photoelectric conversion systems. Examples of applicable photoelectric conversion systems include a digital still camera, a digital camcorder, a monitoring camera, a copier, a facsimile, a mobile phone, a vehicle-mounted camera, and an observation satellite. In addition, camera modules provided with an optical system such as a lens and an imaging apparatus are also included in photoelectric conversion systems. FIG. 38 illustrates a block diagram of a digital still camera as an example of such photoelectric conversion systems.

The photoelectric conversion system illustrated in FIG. 38 has an imaging apparatus 1004 as an example of the photoelectric conversion device and a lens 1002 that causes an optical image of a subject to be formed on the imaging apparatus 1004. In addition, the photoelectric conversion system has an aperture 1003 for making a light amount that passes through the lens 1002 variable and a barrier 1001 for protecting the lens 1002. The lens 1002 and the aperture 1003 are optical systems for collecting light to the imaging apparatus 1004. The imaging apparatus 1004 is the photoelectric conversion device 010 (imaging apparatus) according to any of the embodiments or modifications described above and converts an optical image having been formed by the lens 1002 into an electric signal.

The photoelectric conversion system also has a signal processing portion 1007 (signal processing device) which is an image generating portion for generating an image by processing an output signal that is output from the imaging apparatus 1004. The signal processing portion 1007 performs operations in which the output signal is subjected to various corrections and compression when necessary and image data is output. The signal processing portion 1007 may be formed on a semiconductor substrate provided with the imaging apparatus 1004 or formed on a semiconductor substrate that is separate from the imaging apparatus 1004. In addition, the imaging apparatus 1004 and the signal processing portion 1007 may be formed on a same semiconductor substrate.

The photoelectric conversion system further has a memory portion 1010 for temporarily storing image data and an external interface portion (an external I/F portion) 1013 for communicating with an external computer or the like.

Furthermore, the photoelectric conversion system has a recording medium 1012 such as a semiconductor memory for recording or reading imaging data and a recording medium control interface portion (a recording medium control I/F portion) 1011 for performing recording and reading with respect to the recording medium 1012. The recording medium 1012 may be built into the photoelectric conversion system or may be attachable to and detachable from the photoelectric conversion system.

Furthermore, the photoelectric conversion system has an overall control operating portion 1009 that performs various arithmetic operations and controls the entire digital still camera and a timing generating portion 1008 that outputs various timing signals to the imaging apparatus 1004 and the signal processing portion 1007. In this case, the timing signals and the like may be input from outside and the photoelectric conversion system need at least have the imaging apparatus 1004 and the signal processing portion 1007 that processes an output signal that is output from the imaging apparatus 1004.

The imaging apparatus 1004 outputs an imaging signal to the signal processing portion 1007. The signal processing portion 1007 performs predetermined signal processing on the imaging signal output from the imaging apparatus 1004 and outputs image data. The signal processing portion 1007 generates an image using the imaging signal.

As described above, according to the present embodiment, a photoelectric conversion system to which the photoelectric conversion device (imaging apparatus) according to any of the embodiments described above is applied can be realized.

Eighteenth Embodiment

Figure 39A:
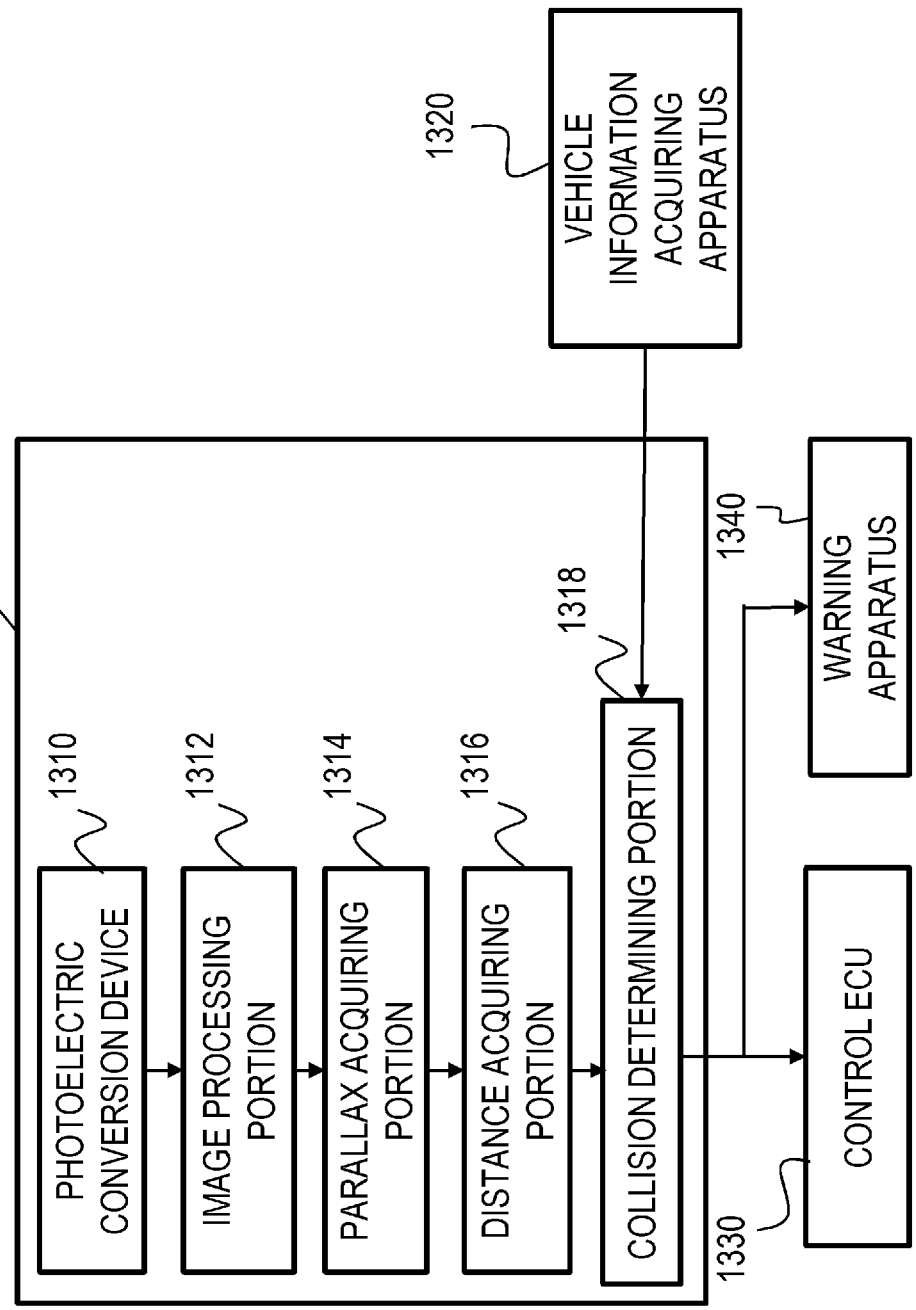
FIG. 39A is a diagram illustrating a photoelectric conversion system according to an eighteenth embodiment.
Figure 39B:
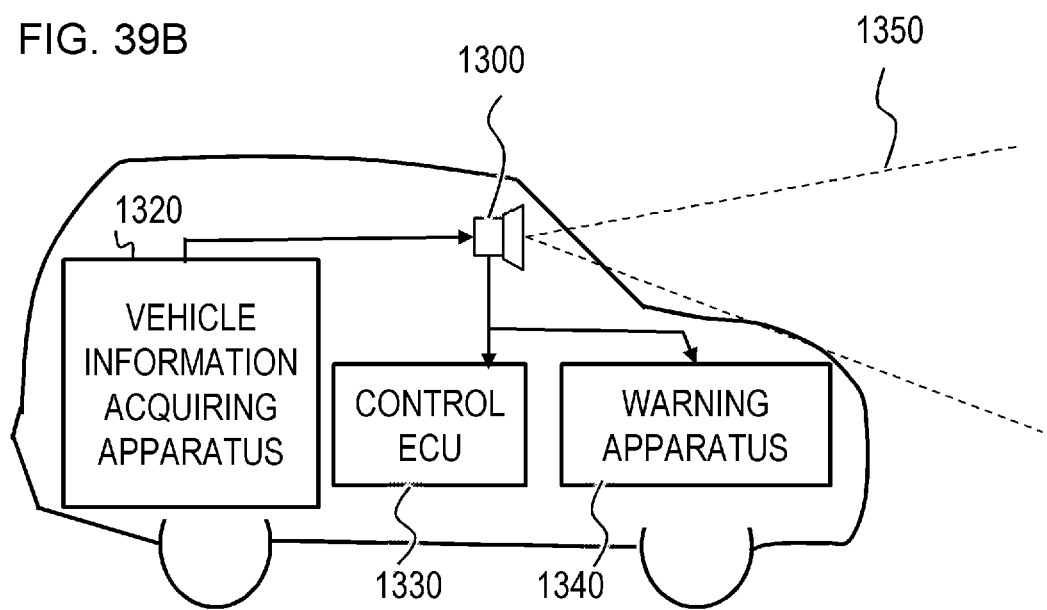
FIG. 39B is a diagram illustrating a moving body according to the eighteenth embodiment.

A photoelectric conversion system and a moving body according to the present embodiment will be described with reference to FIGS. 39A and 39B. FIGS. 39A and 39B are diagrams showing configurations of the photoelectric conversion system and a moving body according to the present embodiment.

FIG. 39A shows an example of a photoelectric conversion system related to a vehicle-mounted camera. A photoelectric conversion system 1300 has an imaging apparatus 1310. The imaging apparatus 1310 is the photoelectric conversion device 010 (imaging apparatus) according to any of the embodiments described above. The photoelectric conversion system 1300 has an image processing portion 1312 which performs image processing on a plurality of pieces of image data acquired by the imaging apparatus 1310. In addition, the photoelectric conversion system 1300 has a parallax acquiring portion 1314 which calculates a parallax (a phase difference of a parallax image) from the plurality of pieces of image data acquired by the photoelectric conversion system 1300. Furthermore, the photoelectric conversion system 1300 has a distance acquiring portion 1316 which calculates a distance to an object based on the calculated parallax and a collision determining portion 1318 which determines whether or not there is a possibility of a collision based on the calculated distance. In this case, the parallax acquiring portion 1314 and the distance acquiring portion 1316 are examples of distance information acquiring means which acquires information related to a distance to the object. In other words, distance information is information related to a parallax, a defocus amount, a distance to the object, or the like. The collision determining portion 1318 may determine a possibility of a collision using any of these pieces of distance information. The distance information acquiring means may be realized by exclusively-designed hardware or may be realized by a software module. Alternatively, the distance information acquiring means may be realized by an FPGA (Field Programmable Gate Array), an ASIC (Application Specific Integrated Circuit), or the like, or a combination thereof.

The photoelectric conversion system 1300 is connected to a vehicle information acquiring apparatus 1320 and is capable of acquiring vehicle information such as a vehicle speed, a yaw rate, and a steering angle. In addition, a control ECU 1330 which is a control apparatus (control portion) that outputs a control signal causing a vehicle to generate a braking force based on a determination result of the collision determining portion 1318 is connected to the photoelectric conversion system 1300. Furthermore, the photoelectric conversion system 1300 is also connected to a warning apparatus 1340 which issues a warning to a driver based on a determination result of the collision determining portion 1318. For example, when it is found that the possibility of a collision is high as a determination result of the collision determining portion 1318, the control ECU 1330 performs vehicle control involving applying the brakes, releasing the gas pedal, suppressing engine output, or the like to avoid a collision and/or reduce damage. The warning apparatus 1340 issues a warning to a user by sounding an alarm, displaying warning information on a screen of a car navigation system or the like, vibrating a seat belt or a steering wheel, or the like.

In the present embodiment, imaging of a periphery of the vehicle such as the front or the rear of the vehicle is performed by the photoelectric conversion system 1300. FIG. 39B shows the photoelectric conversion system when imaging of the front of the vehicle (an imaging range 1350) is performed. The vehicle information acquiring apparatus 1320 sends an instruction to the photoelectric conversion system 1300 or the imaging apparatus 1310. According to such a configuration, accuracy of ranging can be further improved.

While an example of controlling a vehicle so as to prevent a collision with another vehicle has been described above, the photoelectric conversion system can also be applied to controlling automated driving so that the vehicle follows another vehicle, controlling automated driving so that the vehicle stays within a lane, and the like. Furthermore, the photoelectric conversion system is not limited to a vehicle such as an automobile and can also be applied to a moving body (a moving apparatus) such as a ship, an airplane, or an industrial robot. Moreover, besides moving bodies, the photoelectric conversion system can be applied to a wide variety of devices that utilize object recognition such as an intelligent transportation system (ITS).

The present invention is not limited to the embodiments described above and various modifications can be made thereof. For example, an example in which a part of components of any of the embodiments is added to another embodiment and an example in which a part of components of any of the embodiments is replaced with a part of components of another embodiment are also included in embodiments of the present invention.

In addition, the photoelectric conversion system described in the seventeenth embodiment and the eighteenth embodiment represent an example of a photoelectric conversion system to which the photoelectric conversion device may be applied. The photoelectric conversion system to which the photoelectric conversion device according to the present invention can be applied is not limited to the configurations shown in FIG. 38 and in FIGS. 39A and 39B.

Nineteenth Embodiment: ToF System

Figure 40:
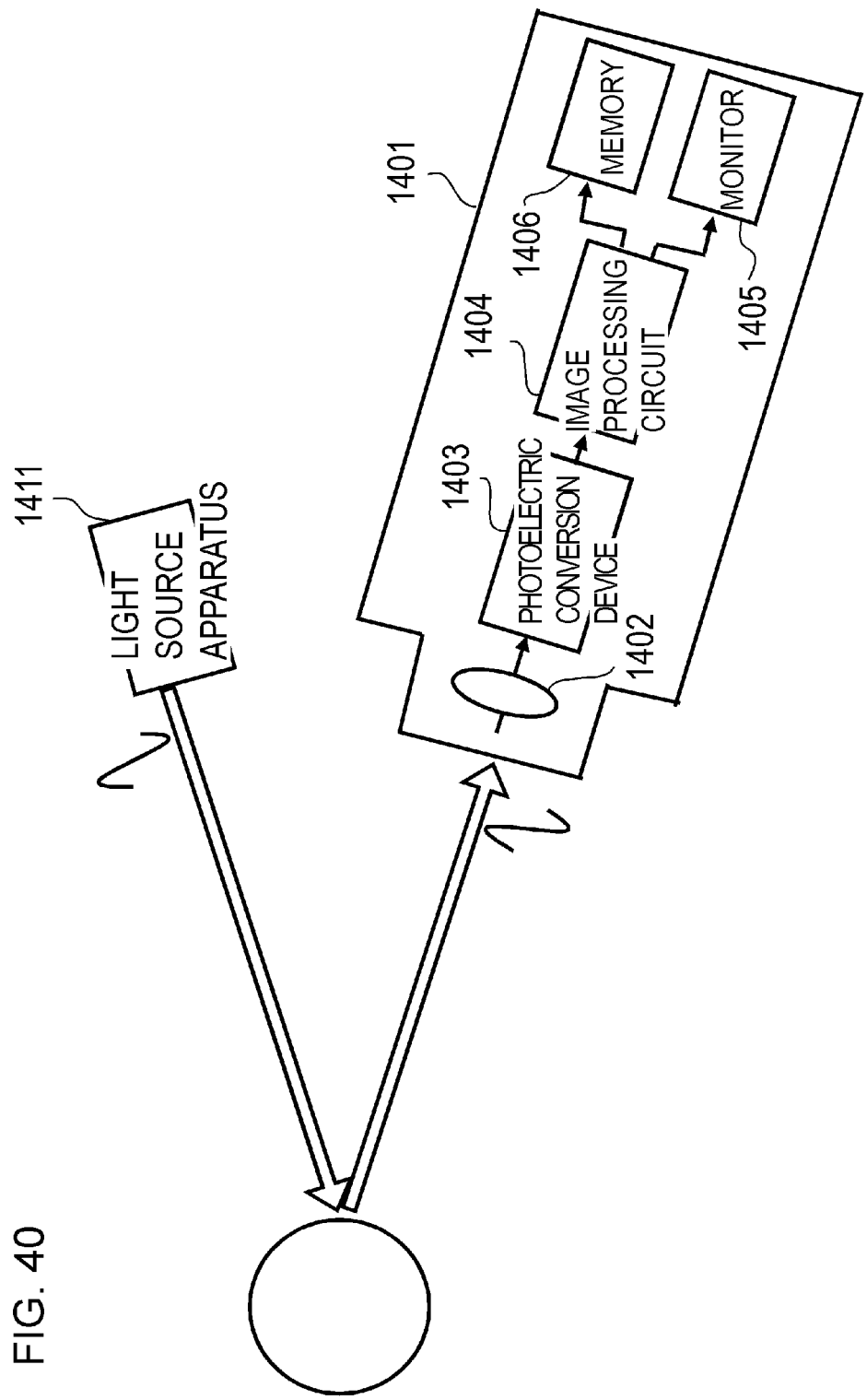
FIG. 40 is a diagram illustrating a distance image sensor according to a nineteenth embodiment.

A photoelectric conversion system according to the present embodiment will be described with reference to FIG. 40. FIG. 40 is a block diagram showing a configuration example of a distance image sensor which is the photoelectric conversion system according to the present embodiment.

As shown in FIG. 40, a distance image sensor 1401 is configured to include an optical system 1402, a photoelectric conversion device 1403, an image processing circuit 1404, a monitor 1405, and a memory 1406. In addition, the distance image sensor 1401 is capable of acquiring a distance image in accordance with a distance to a subject by receiving light (modulated light or pulsed light) emitted toward the subject from a light source apparatus 1411 and reflected by a surface of the subject.

The optical system 1402 is configured with one or a plurality of lenses and guides image light (incident light) from the subject to the photoelectric conversion device 1403 and forms an image on a light-receiving surface (a sensor portion) of the photoelectric conversion device 1403.

As the photoelectric conversion device 1403, the photoelectric conversion device 010 according to each embodiment or each modification described above is applied. A distance signal indicating a distance obtained from a light reception signal output from the photoelectric conversion device 1403 is supplied to the image processing circuit 1404.

The image processing circuit 1404 performs image processing for constructing a distance image based on the distance signal supplied from the photoelectric conversion device 1403. In addition, a distance image (image data) obtained by the image processing is supplied to and displayed by the monitor 1405 or supplied to and stored (recorded) in the memory 1406.

With the distance image sensor 1401 configured as described above, applying the photoelectric conversion device described above not only improves characteristics of pixels but also enables, for example, a more accurate distance image to be acquired.

Twentieth Embodiment: Endoscope

Figure 41:
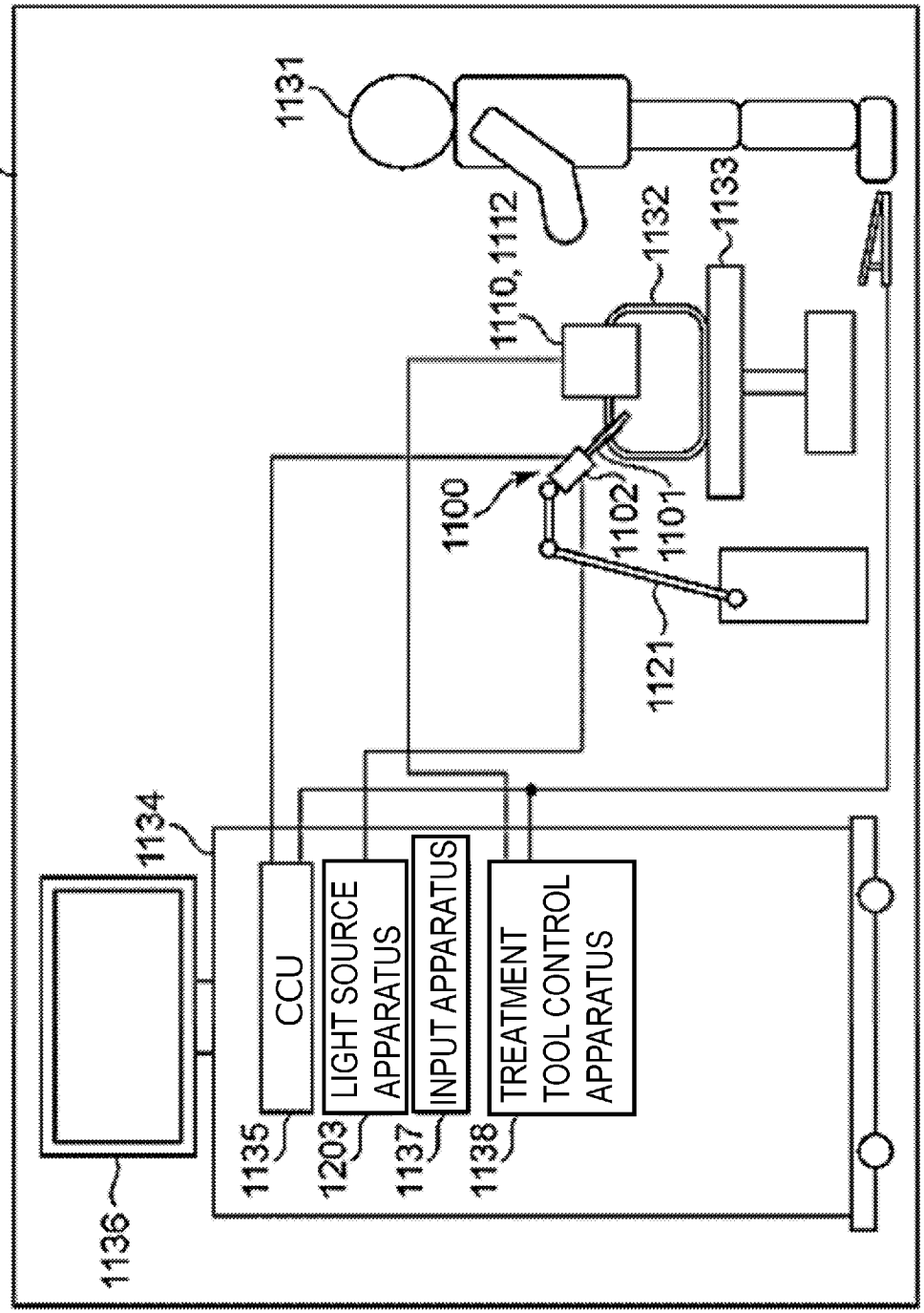
FIG. 41 is a diagram illustrating an endoscopic surgery system according to a twentieth embodiment.

A photoelectric conversion system according to the present embodiment will be described with reference to FIG. 41. FIG. 41 is a diagram showing an example of a schematic configuration of an endoscopic surgery system which is the photoelectric conversion system according to the present embodiment.

FIG. 41 illustrates a situation where a technician (a physician) 1131 is using an endoscopic surgery system 1130 to operate on a patient 1132 on a patient bed 1133. As illustrated, the endoscopic surgery system 1130 is constituted of an endoscope 1100, a surgical instrument 1110, and a cart 1134 mounted with various apparatuses for an endoscopic surgery.

The endoscope 1100 is constituted of a lens barrel 1101 of which a region with a predetermined length from a distal end is to be inserted into a body cavity of the patient 1132 and a camera head 1102 connected to a base end of the lens barrel 1101. While the illustrated example features the endoscope 1100 being configured as a so-called rigid scope having a rigid lens barrel 1101, alternatively, the endoscope 1100 may be configured as a so-called flexible scope having a flexible lens barrel.

An opening into which an objective lens is fitted is provided at the distal end of the lens barrel 1101. A light source apparatus 1203 is connected to the endoscope 1100, and light generated by the light source apparatus 1203 is guided to the distal end of the lens barrel 1101 by a light guide provided so as to extend inside the lens barrel and emitted toward an observation object inside a body cavity of the patient 1132 via the objective lens. It should be noted that the endoscope 1100 may be a forward-viewing endoscope, an oblique-viewing endoscope, or a side-viewing endoscope.

An optical system and a photoelectric conversion device are provided inside the camera head 1102 and reflected light (observation light) from the observation object is collected to the photoelectric conversion device by the optical system. The observation light is photoelectrically converted by the photoelectric conversion device and an electric signal corresponding to the observation light or, in other words, an image signal corresponding to an observed image is generated. As the photoelectric conversion device, the photoelectric conversion device 010 (imaging apparatus) according to each embodiment or each modification described above can be used. The image signal is transmitted to a camera control unit (CCU) 1135 as raw data.

The CCU 1135 is constituted of a CPU (Central Processing Unit), a GPU (Graphics Processing Unit), or the like and comprehensively controls operations of the endoscope 1100 and a display apparatus 1136. In addition, the CCU 1135 receives an image signal from the camera head 1102 and subjects the image signal to various kinds of image processing for displaying an image based on the image signal such as development processing (demosaicing).

Under control exerted by the CCU 1135, the display apparatus 1136 displays an image based on the image signal subjected to image processing by the CCU 1135.

The light source apparatus 1203 is constituted of a light source such as an LED (Light-Emitting Diode) and supplies the endoscope 1100 with irradiation light used when photographing a surgical site or the like.

An input apparatus 1137 is an input interface with respect to the endoscopic surgery system 1130. A user can input various kinds of information and input instructions to the endoscopic surgery system 1130 via the input apparatus 1137.

A treatment tool control apparatus 1138 controls drive of an energy treatment tool 1112 for cauterizing or incising tissue, sealing a blood vessel, or the like.

The light source apparatus 1203 which supplies the endoscope 1100 with irradiation light when photographing a surgical site can be constituted of a white light source constituted of an LED, a laser light source, or a combination thereof. When the white light source is constituted of a combination of RGB laser light sources, since output intensity and an output timing of each color (each wavelength) can be controlled with high precision, white balance of a captured image can be adjusted in the light source apparatus 1203. In addition, in this case, an image corresponding to each of RGB can be captured in a time-divided manner by having an observation object be irradiated with laser light from each of the RGB laser light sources in a time-divided manner and controlling drive of an imaging element of the camera head 1102 in synchronization with the irradiation timing. According to this method, a color image can be obtained without having to provide the imaging element with a color filter.

In addition, drive of the light source apparatus 1203 may be controlled such that intensity of output light changes at predetermined intervals. By controlling drive of imaging elements of the camera head 1102 in synchronization with a timing at which the intensity of light changes to acquire images in a time-divided manner and compositing the images, an image with a high dynamic range which is free of so-called blocked-up shadows and blown-out highlights can be generated.

Furthermore, the light source apparatus 1203 may be configured to be capable of supplying light in a predetermined wavelength band which accommodates special light observation. In special light observation, for example, wavelength dependence of absorption of light by body tissue is utilized. Specifically, predetermined tissue such as a blood vessel of a superficial portion of a mucous membrane is photographed by irradiating light with a narrower band than irradiation light during normal observation (in other words, white light). Alternatively, in special light observation, fluorescent observation may be performed in which an image is obtained using fluorescent light generated by irradiating excitation light. In fluorescent observation, body tissue may be irradiated with excitation light and fluorescent light from the body tissue can be observed, a reagent such as indocyanine green (ICG) can be locally injected into body tissue and the body tissue can be irradiated with excitation light corresponding to a fluorescent wavelength of the reagent to obtain a fluorescent image, and the like. The light source apparatus 1203 may be configured to be capable of supplying narrow-band light and/or excitation light which accommodates such special light observation.

Twenty-First Embodiment: Smart Glasses

Figure 42A:
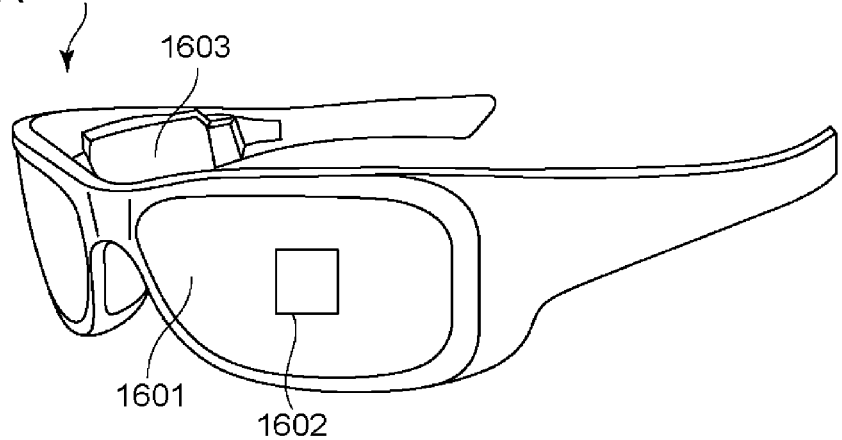
FIGS. 42A and 42B are diagrams illustrating smart glasses according to a twenty-first embodiment.

A photoelectric conversion system according to the present embodiment will be described with reference to FIGS. 42A and 42B. FIG. 42A illustrates eyeglasses 1600 (smart glasses) which is the photoelectric conversion system according to the present embodiment. The eyeglasses 1600 have a photoelectric conversion device 1602. The photoelectric conversion device 1602 is the photoelectric conversion device 010 (imaging apparatus) according to each embodiment or each modification described above. In addition, a display apparatus including a light-emitting apparatus such as an OLED or an LED may be provided on a rear surface side of a lens 1601. There may be one or a plurality of photoelectric conversion devices 1602. Alternatively, a plurality of types of photoelectric conversion devices may be used in combination. An arrangement position of the photoelectric conversion device 1602 is not limited to FIG. 42A.

The eyeglasses 1600 further include a control apparatus 1603. The control apparatus 1603 functions as a power source which supplies power to the photoelectric conversion device 1602 and the display apparatus described above. In addition, the control apparatus 1603 controls operations of the photoelectric conversion device 1602 and the display apparatus. An optical system for collecting light to the photoelectric conversion device 1602 is formed in the lens 1601.

Figure 42B:
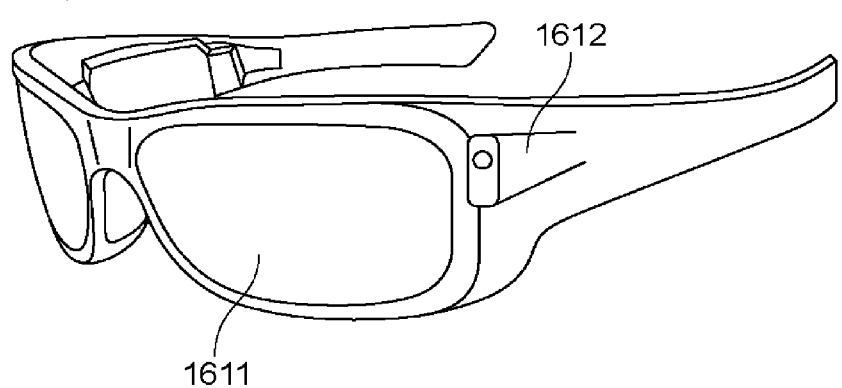

FIG. 42B illustrates eyeglasses 1610 (smart glasses) according to one application example. The eyeglasses 1610 have a control apparatus 1612. The control apparatus 1612 is mounted with a photoelectric conversion device that corresponds to the photoelectric conversion device 1602 and a display apparatus. An optical system for projecting light emission from the photoelectric conversion device inside the control apparatus 1612 and the display apparatus is formed in the lens 1611 and an image is projected onto the lens 1611. The control apparatus 1612 functions as a power source which supplies power to the photoelectric conversion device and the display apparatus and, at the same time, controls operations of the photoelectric conversion device and the display apparatus. The control apparatus may have an eye-gaze detecting portion which detects an eye-gaze of a wearer. Infrared light may be used to detect an eye-gaze. An infrared light-emitting portion emits infrared light to eyes of a user who is looking at a display image. A picked-up image of the eyes can be obtained by having an imaging portion including a light-receiving element detect reflected light from the eyes of emitted infrared light. Providing reducing means which reduces light from the infrared light-emitting portion to the display portion in a plan view enables a decline in image quality to be mitigated.

An eye-gaze of the user with respect to a display image can be detected from a picked-up image of eyes obtained by imaging with infrared light. Any known method can be applied to eye-gaze detection using a picked-up image of the eyes. For example, an eye-gaze detection method based on a Purkinje image due to reflection of irradiation light by the cornea can be used.

More specifically, eye-gaze detection processing based on a pupil-corneal reflection method is performed. Using the pupil-corneal reflection method, an eye-gaze of a user is detected by calculating an eye-gaze vector that expresses an orientation (a rotation angle) of the eyes based on an image of a pupil included in a picked-up image of the eyes and a Purkinje image.

The display apparatus according to the present embodiment may have a photoelectric conversion device having a light-receiving element and a display image of the display apparatus may be controlled based on eye-gaze information of the user from the photoelectric conversion device.

Specifically, the display apparatus determines, based on the eye-gaze information, a first field-of-view region which the user focuses on and a second field-of-view region other than the first field-of-view region. The first field-of-view region and the second field-of-view region may be determined by the control apparatus of the display apparatus or regions determined by an outside control device may be received as the first field-of-view region and the second field-of-view region. In a display region of the display apparatus, a display resolution of the first field-of-view region may be controlled to be higher than a display resolution of the second field-of-view region. In other words, the resolution of the second field-of-view region may be set lower than that of the first field-of-view region.

In addition, the display region may have a first display region and a second display region which differs from the first display region, and a region with high priority may be determined from the first display region and the second display region based on eye-gaze information. The first display region and the second display region may be determined by the control apparatus of the display apparatus or regions determined by an outside control device may be received as the first display region and the second display region. A resolution of a region with high priority may be controlled to be higher than a resolution of a region other than the region with high priority. In other words, a resolution of a region of which a priority is relatively low can be lowered.

It should be noted that an AI may be used to determine the first field-of-view region and a region with high priority. The AI may be a model configured to use an image of the eyes and a direction actually viewed by the eyes in the image as teacher data to estimate, from the image of the eyes, an angle of an eye-gaze and a distance to an object ahead of the eye-gaze. An AI program may be included in the display apparatus, the photoelectric conversion device, or an external apparatus. When the external apparatus includes an AI program, the information of the first field-of-view region and a region with high priority is sent to the display apparatus via communication.

Display control based on visual recognition and detection can be preferably applied to smart glasses further including a photoelectric conversion device that images the outside. The smart glasses are capable of displaying imaged external information in real-time.

According to the present technique, avalanche crosstalk can be reduced.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-103193, filed on Jun. 22, 2021, which is hereby incorporated by reference herein in its entirety.

What is claimed is:

1. A photoelectric conversion device having pixels lined up in a plurality of rows and a plurality of columns, the photoelectric conversion device comprising:
a semiconductor layer which has a front surface and a rear surface and which includes an avalanche photodiode;
a wiring layer arranged on a side of the front surface of the semiconductor layer; and
a trench arranged in a boundary portion between two pixels,
wherein the trench has at least any of a metal or a metal compound arranged therein and extends from inside of the semiconductor layer to inside of the wiring layer,
the trench is connected to a wiring in the wiring layer which, of wiring in the wiring layer, is nearest to the semiconductor layer,
the wiring layer has a first wiring and a second wiring,
a distance from the semiconductor layer to the second wiring is longer than a distance from the semiconductor layer to the first wiring,
the first wiring is arranged so as to overlap with a semiconductor region constituting a cathode of the avalanche photodiode in a plan view, and
the trench extends to the second wiring.

2. The photoelectric conversion device according to claim 1, wherein the trench is arranged so as to surround each pixel in a plan view.

3. The photoelectric conversion device according to claim 1, wherein the trench is not arranged in a diagonal portion of each pixel.

4. The photoelectric conversion device according to claim 1, wherein the trench at least extends to the rear surface of the semiconductor layer.

5. The photoelectric conversion device according to claim 1, wherein the photoelectric conversion device has an optical layer on a side of the rear surface of the semiconductor layer, and
the trench extends to inside of the optical layer.

6. The photoelectric conversion device according to claim 5, wherein the optical layer has a reflective plate, and
the trench extends to the reflective plate.

7. The photoelectric conversion device according to claim 5, wherein the optical layer has a reflective plate,
a second light-shielding wall is arranged between the reflective plate and the semiconductor layer, and
the trench extends to the second light-shielding wall.

8. A photoelectric conversion system, comprising:
the photoelectric conversion device according to claim 1; and
a signal processing device configured to generate an image using a signal output by the photoelectric conversion device.

9. A moving body, comprising:
the photoelectric conversion device according to claim 1,
wherein the moving body comprises a control device configured to control movement of the moving body using a signal output by the photoelectric conversion device.

10. A photoelectric conversion device having pixels lined up in a plurality of rows and a plurality of columns, the photoelectric conversion device comprising:
a semiconductor layer which has a front surface and a rear surface and which includes an avalanche photodiode;
a wiring layer arranged on a side of the front surface of the semiconductor layer; and
a trench arranged in a boundary portion between two pixels,
wherein the trench has at least any of a metal or a metal compound arranged therein and extends from inside of the semiconductor layer to inside of the wiring layer,
the trench is connected to a wiring in the wiring layer which, of wiring in the wiring layer, is nearest to the semiconductor layer,
the photoelectric conversion device has an optical layer on a side of the rear surface of the semiconductor layer, and
the trench extends to inside of the optical layer.

11. The photoelectric conversion device according to claim 10, wherein the optical layer has a reflective plate, and
the trench extends to the reflective plate.

12. The photoelectric conversion device according to claim 10, wherein the optical layer has a reflective plate,
a second light-shielding wall is arranged between the reflective plate and the semiconductor layer, and
the trench extends to the second light-shielding wall.

* * * * *